(12) United States Patent
Hasinoff et al.

(10) Patent No.: US 9,682,868 B2
(45) Date of Patent: *Jun. 20, 2017

(54) PARTIALLY CONTINUOUS COUNTERCURRENT PROCESS FOR CONVERTING GYPSUM TO AMMONIUM SULFATE AND CALCIUM CARBONATE

(71) Applicant: Sparstane Technologies LLC, Brimingham, AL (US)

(72) Inventors: Murray P. Hasinoff, Birmingham, AL (US); Taylor Pursell, Mountain Brook, AL (US); Joseph A. Saiia, Birmingham, AL (US); Arthur R. Shirley, Jr., Florence, AL (US); Keith D. Cochran, Killen, AL (US); Timothy G. Holt, Florence, AL (US); Joseph M. Miller, Killen, AL (US); Melissa C. Hayes, Florence, AL (US)

(73) Assignee: SPARSTANE TECHNOLOGIES LLC, Birmingham, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/005,851

(22) Filed: Jan. 25, 2016

(65) Prior Publication Data
US 2016/0221834 A1 Aug. 4, 2016

Related U.S. Application Data

(60) Provisional application No. 62/109,988, filed on Jan. 30, 2015.

(51) Int. Cl.
G01F 11/18 (2006.01)
C01F 11/18 (2006.01)
C30B 7/14 (2006.01)
C30B 29/10 (2006.01)
C01C 1/244 (2006.01)

(52) U.S. Cl.
CPC ............. *C01F 11/18* (2013.01); *C01C 1/244* (2013.01); *C30B 7/14* (2013.01); *C30B 29/10* (2013.01); *C01P 2002/60* (2013.01); *C01P 2004/61* (2013.01); *C01P 2006/80* (2013.01)

(58) Field of Classification Search
CPC ....................................................... C01F 11/18
See application file for complete search history.

(56) References Cited

U.S. PATENT DOCUMENTS

| 3,004,827 | A | * | 10/1961 | Schaus | .................... | C01B 25/22 |
| | | | | | | 423/316 |
| 3,552,919 | A | | 1/1971 | Roberts | | |
| 3,615,253 | A | | 10/1971 | Warzel | | |
| 3,687,620 | A | | 8/1972 | Witts et al. | | |
| 8,758,719 | B2 | * | 6/2014 | Hasinoff | ................. | C22B 26/20 |
| | | | | | | 423/420 |
| 2014/0044619 | A1 | | 2/2014 | Hasinoff et al. | | |

FOREIGN PATENT DOCUMENTS

| WO | WO2016115386 A | 7/2016 |
| WO | WO2016115393 A | 7/2016 |
| WO | WO2016115396 A | 7/2016 |
| WO | WO2016115398 A | 7/2016 |
| WO | WO2016137597 A | 9/2016 |

* cited by examiner

*Primary Examiner* — Stuart Hendrickson
(74) *Attorney, Agent, or Firm* — Paul E. White, Jr.; Manelli Selter PLLC

(57) ABSTRACT

The present invention includes a partially continuous countercurrent process for converting gypsum, by reaction with ammonium carbonate, to products of ammonium sulfate and calcium carbonate by introducing the reactants into reactors, mixing the reactants for a predetermined amount of time, employing a novel combination of countercurrent flows coupled with the reactors operated in a batch manner with process recycle of liquids, removing materials from the reactor and separating solids from solutions wherein no reactants are added during the removal process and thus the reactants have sufficient time to react and ensure the desired degree of reaction, yield and purity of product calcium carbonate and ammonium sulfate while minimizing the reaction time.

28 Claims, 25 Drawing Sheets

Plant Gorgas FGD Gypsum Crystals: SEM Image at 500x

Plant Miller FGD Gypsum Crystals: SEM Image at 500x

Plant Bowen FGD Gypsum Crystals: SEM Image at 100x

Plant Crist FGD Gypsum Crystals: SEM Image at 100x

Plant Wansley FGD Gypsum Crystals: SEM Image at 100x

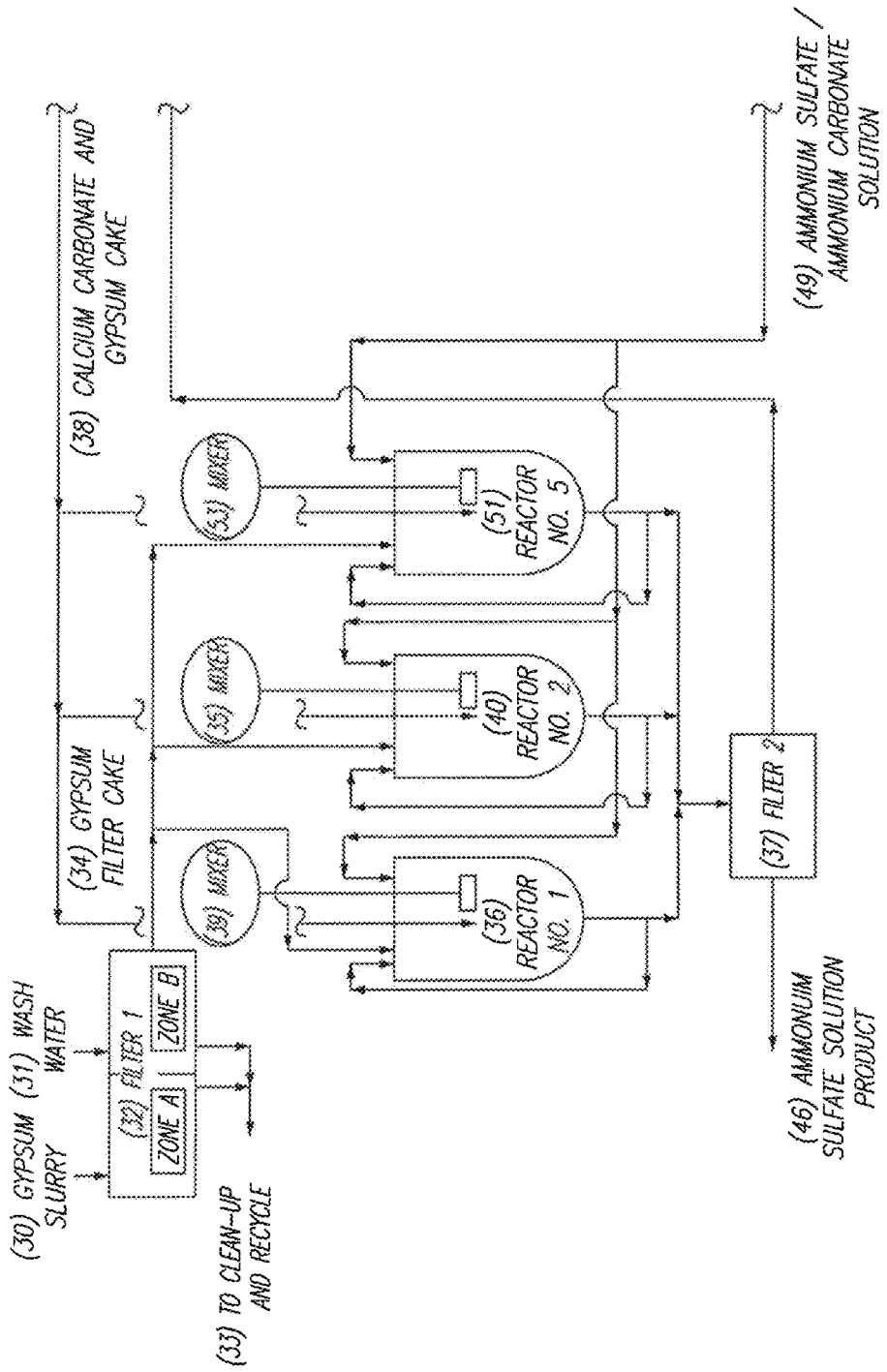
FIGURE 8A – TWO STAGE SIX REACTOR GYPSUM CONVERSION, PARTIALLY CONTINUOUS COUNTERCURRENT FLOW PROCESS

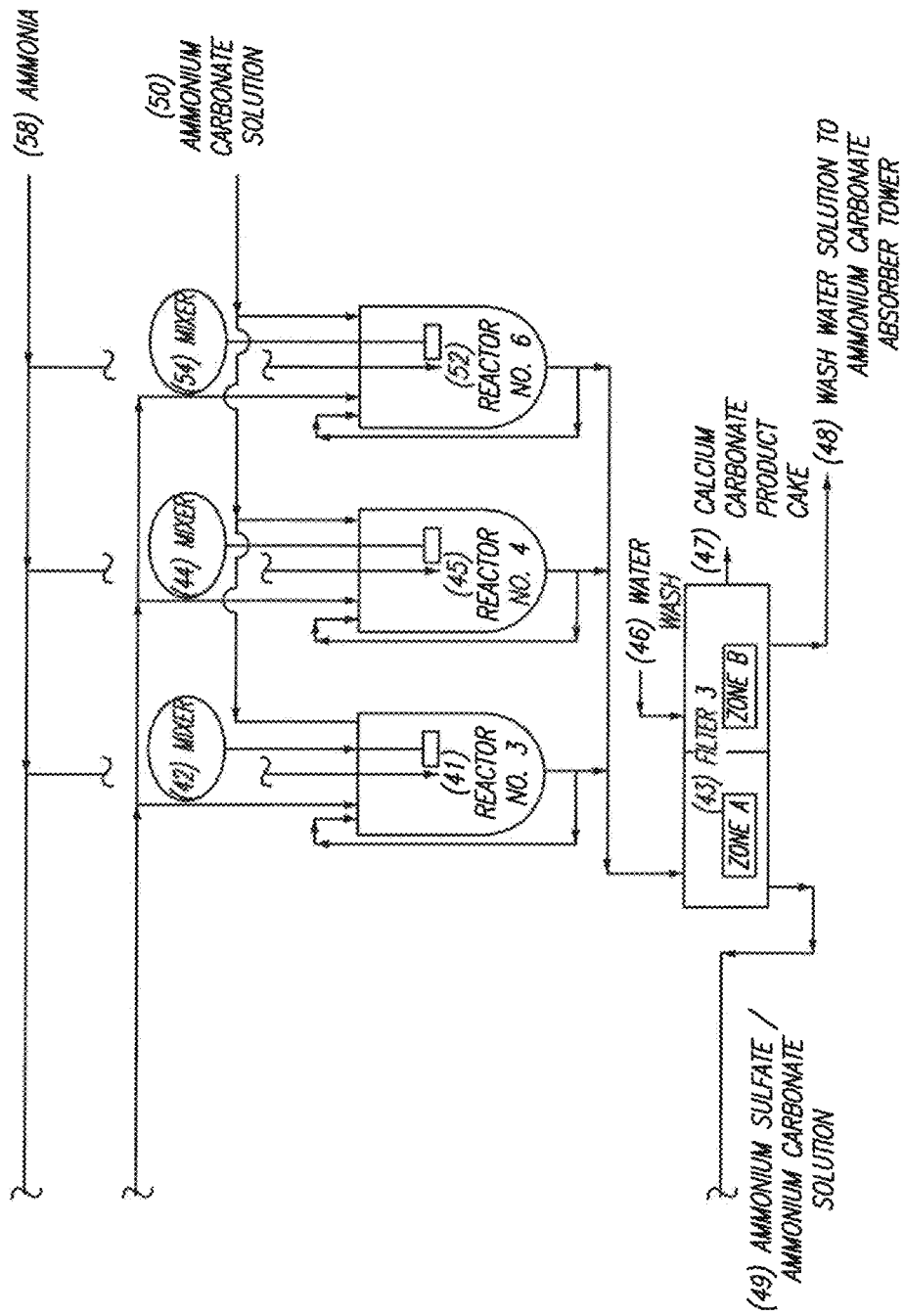
FIGURE 8B – TWO STAGE SIX REACTOR GYPSUM CONVERSION, PARTIALLY CONTINUOUS COUNTERCURRENT FLOW PROCESS

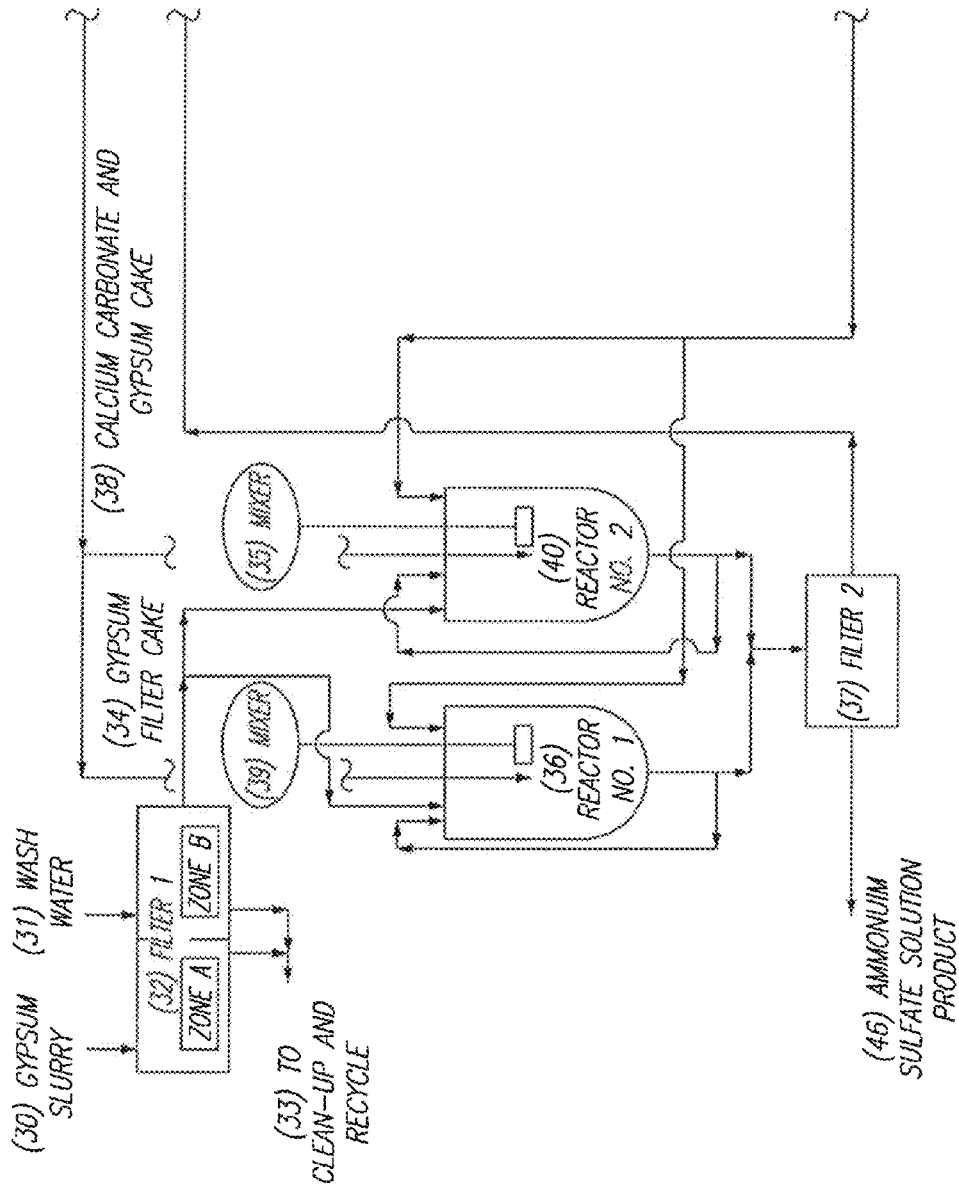

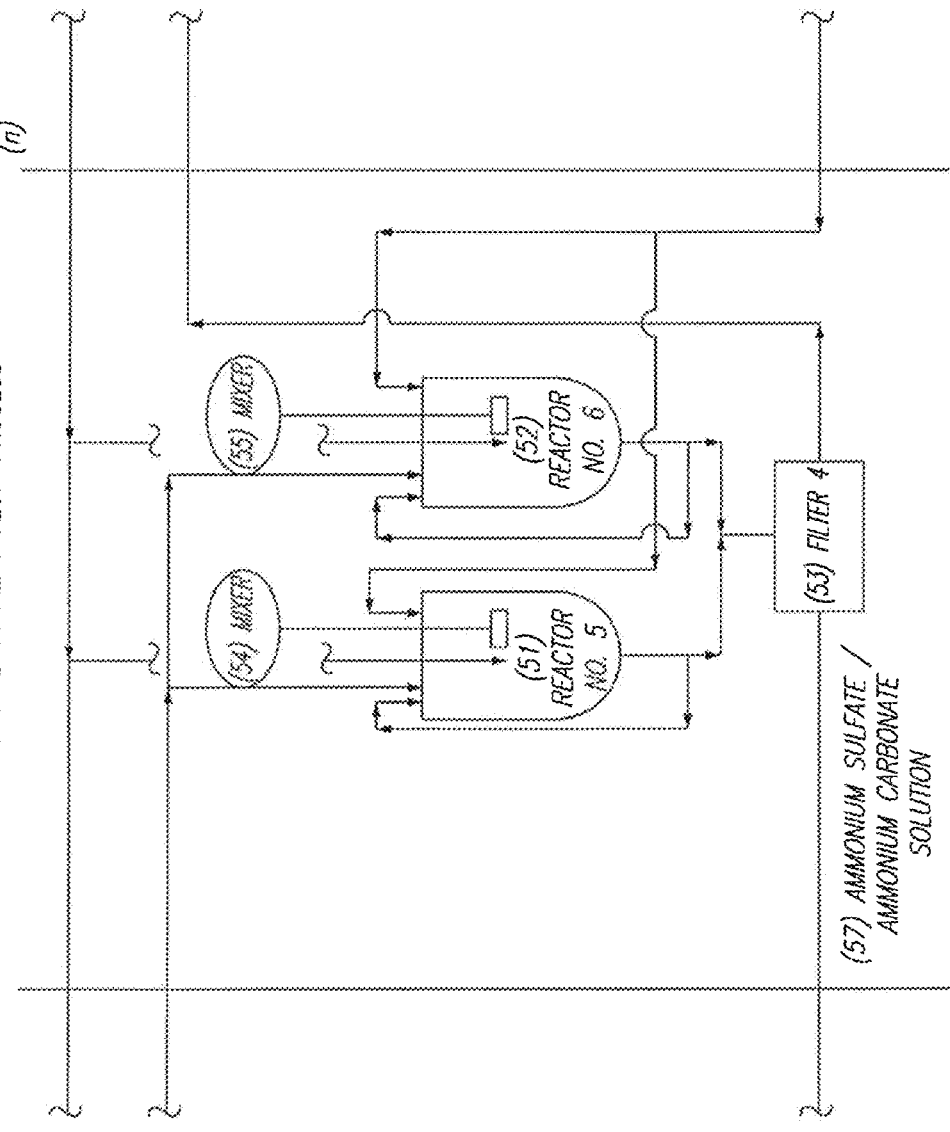
FIGURE 9B – THREE OR MORE STAGE SIX OR MORE REACTOR GYPSUM CONVERSION, PARTIALLY CONTINUOUS COUNTERCURRENT FLOW PROCESS

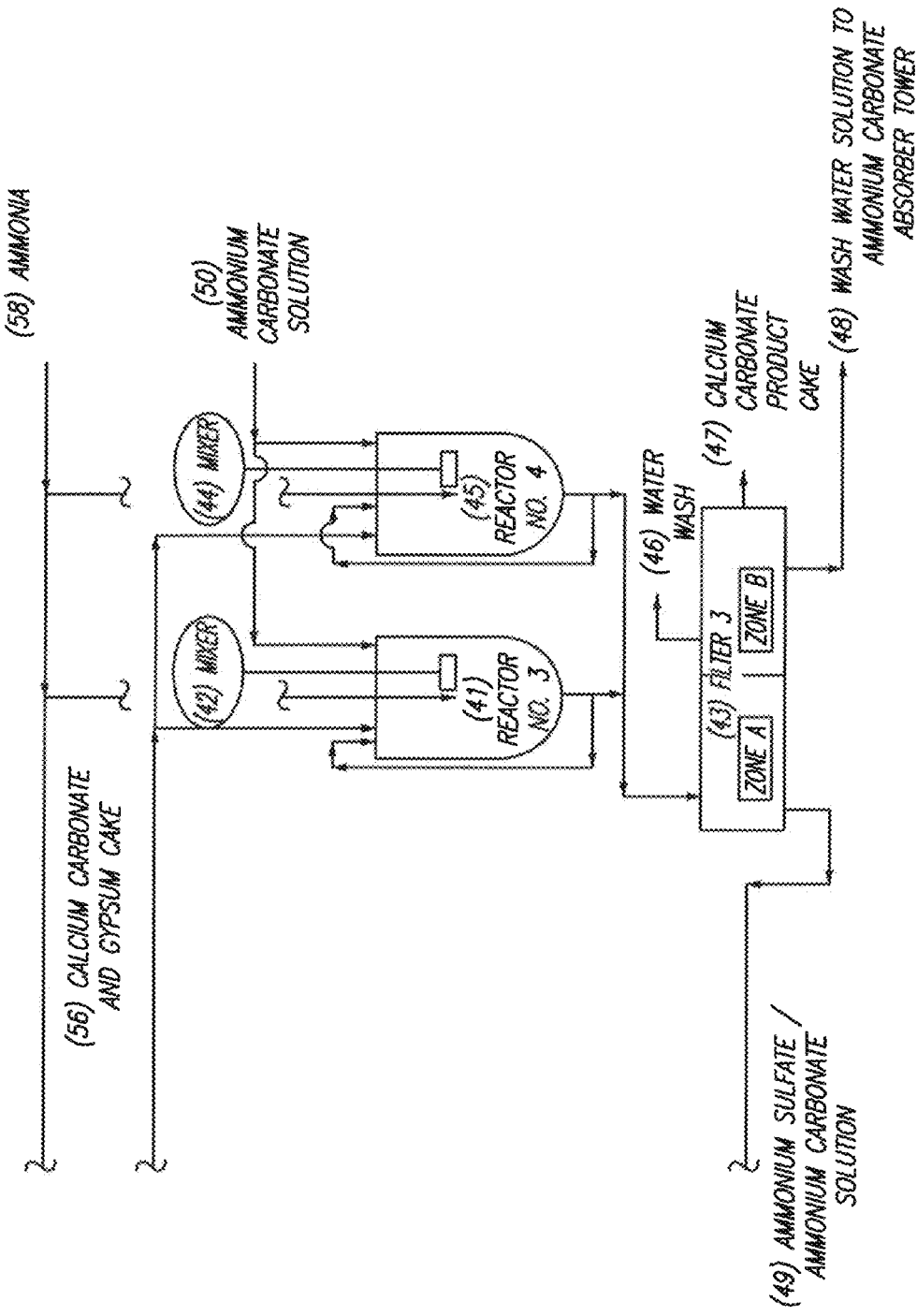

PROCESS REACTOR SEQUENCING
TWO STAGE REACTION, TWO REACTORS

PROCESS REACTOR SEQUENCING
TWO STAGE REACTION, TWO REACTORS

FIGURE 10C
PROCESS REACTOR SEQUENCING
TWO STAGE REACTION, TWO REACTORS

☐ means Gypsum Filter Belt off ☐ means Reactor 1 Filter off

▨ means Reactor 2 Filter off ▨ means Reactor 1 and Reactor 2 Filters off

| Total Elapsed Time | | 130 | | 140 | | 150 | |
|---|---|---|---|---|---|---|---|
| Unit Operation Time | | 10 | | 10 | | 10 | |
| Unit Operation | 1 charge | | 1 reaction | | 1 discharge | | |
| Unit Operation Time | | 10 | | 10 | | 10 | |
| Total Elapsed Time | | 130 | | 140 | | 150 | |

| Total Elapsed Time | | 130 | | 140 | | 150 | |
|---|---|---|---|---|---|---|---|
| Unit Operation Time | | 10 | | 10 | | 10 | |
| Unit Operation | 2 reaction | | 2 discharge | | 2 charge | | |
| Unit Operation Time | | 10 | | 10 | | 10 | |
| Total Elapsed Time | | 130 | | 140 | | 150 | |

PROCESS REACTOR SEQUENCING
TWO STAGE REACTION, FOUR REACTORS

Figure 11B
PROCESS REACTOR SEQUENCING
TWO STAGE REACTION, FOUR REACTORS ☐ means Gypsum Filter Belt off  
▒ means Reactor 1 Filter off  
▓ means Reactor 2 Filter off

| Total Elapsed Time | 70 | 80 | 90 | 100 | 110 | 120 |
|---|---|---|---|---|---|---|
| Unit Operation Time | 10 | 10 | 10 | 10 | 10 | 10 |
| Unit / Operation | 1a charge / 1b discharge | 1a reaction / 1b charge | 1a discharge / 1b reaction | 1a charge / 1b discharge | 1a reaction / 1b charge | 1a discharge / 1b reaction |
| Unit Operation Time | 10 | 10 | 10 | 10 | 10 | 10 |
| Total Elapsed Time | 70 | 80 | 90 | 100 | 110 | 120 |

| Total Elapsed Time | 70 | 80 | 90 | 100 | 110 | 120 |
|---|---|---|---|---|---|---|
| Unit Operation Time | 10 | 10 | 10 | 10 | 10 | 10 |
| Unit / Operation | 2a reaction / 2b charge | 2a discharge / 2b reaction | 2a charge / 2b discharge | 2a reaction / 2b charge | 2a discharge / 2b reaction | 2a charge / 2b discharge |
| Unit Operation Time | 10 | 10 | 10 | 10 | 10 | 10 |
| Total Elapsed Time | 70 | 80 | 90 | 100 | 110 | 120 |

Figure 11C
PROCESS REACTOR SEQUENCING
TWO STAGE REACTION, FOUR REACTORS ☐ means Gypsum Filter Belt off      means Reactor 1 Filter off

 means Reactor 2 Filter off

| Total Elapsed Time | 130 | 140 | 150 | 160 | 170 | 180 |
|---|---|---|---|---|---|---|
| Unit Operation Time | 10 | 10 | 10 | 10 | 10 | 10 |
| Unit Operation | 1a charge / 1b discharge | 1a reaction / 1b charge | 1a discharge / 1b reaction | 1a charge / 1b discharge | 1a reaction / 1b charge | 1a discharge / 1b reaction |
| Unit Operation Time | 10 | 10 | 10 | 10 | 10 | 10 |
| Total Elapsed Time | 130 | 140 | 150 | 160 | 170 | 180 |

| Total Elapsed Time | 130 | 140 | 150 | 160 | 170 | 180 |
|---|---|---|---|---|---|---|
| Unit Operation Time | 10 | 10 | 10 | 10 | 10 | 10 |
| Unit Operation | 2a reaction / 2b charge | 2a discharge / 2b reaction | 2a charge / 2b discharge | 2a reaction / 2b charge | 2a discharge / 2b reaction | 2a charge / 2b discharge |
| Unit Operation Time | 10 | 10 | 10 | 10 | 10 | 10 |
| Total Elapsed Time | 130 | 140 | 150 | 160 | 170 | 180 |

FIGURE 12A
PROCESS REACTOR SEQUENCING
TWO STAGE REACTION, SIX REACTORS

No belt filter stoppages, all belt filters constantly running

| Total Elapsed Time | | 10 | 20 | 30 | 40 | 50 | 60 |
|---|---|---|---|---|---|---|---|
| Unit Operation Time | | 10 | 10 | 10 | 10 | 10 | 10 |
| Unit | Operation | 1a charge | 1a reaction<br>1b charge | 1a discharge<br>1b reaction<br>1c charge | 1a charge<br>1b discharge<br>1c reaction | 1a reaction<br>1b charge<br>1c discharge | 1a discharge<br>1b reaction<br>1c charge |
| Unit Operation Time | | | 10 | 10 | 10 | 10 | 10 |
| Total Elapsed Time | | | 20 | 30 | 40 | 50 | 60 |

| Total Elapsed Time | | 30 | 40 | 50 | 60 |
|---|---|---|---|---|---|
| Unit Operation Time | | 10 | 10 | 10 | 10 |
| Unit | Operation | 2a charge | 2a reaction<br>2b charge | 2a discharge<br>2b reaction<br>2c charge | 2a charge<br>2b discharge<br>2c reaction |
| Unit Operation Time | | | 10 | 10 | 10 |
| Total Elapsed Time | | | 40 | 50 | 60 |

FIGURE 12B
PROCESS REACTOR SEQUENCING
TWO STAGE REACTION, SIX REACTORS

No belt filter stoppages, all belt filters constantly running

| Total Elapsed Time | 70 | 80 | 90 | 100 | 110 | 120 |
|---|---|---|---|---|---|---|
| Unit Operation Time | 10 | 10 | 10 | 10 | 10 | 10 |
| Unit Operation | 1a charge<br>1b discharge<br>1c reaction | 1a reaction<br>1b charge<br>1c discharge | 1a discharge<br>1b reaction<br>1c charge | 1a charge<br>1b discharge<br>1c reaction | 1a reaction<br>1b charge<br>1c discharge | 1a discharge<br>1b reaction<br>1c charge |
| Unit Operation Time | 10 | 10 | 10 | 10 | 10 | 10 |
| Total Elapsed Time | 70 | 80 | 90 | 100 | 110 | 120 |

| Total Elapsed Time | 70 | 80 | 90 | 100 | 110 | 120 |
|---|---|---|---|---|---|---|
| Unit Operation Time | 10 | 10 | 10 | 10 | 10 | 10 |
| Unit Operation | 2a reaction<br>2b charge<br>2c discharge | 2a discharge<br>2b reaction<br>2c charge | 2a charge<br>2b discharge<br>2c reaction | 2a reaction<br>2b charge<br>2c discharge | 2a discharge<br>2b reaction<br>2c charge | 2a charge<br>2b discharge<br>2c reaction |
| Unit Operation Time | 10 | 10 | 10 | 10 | 10 | 10 |
| Total Elapsed Time | 70 | 80 | 90 | 100 | 110 | 120 |

FIGURE 12C
PROCESS REACTOR SEQUENCING
TWO STAGE REACTION, SIX REACTORS

No belt filter stoppages, all belt filters constantly running

| Total Elapsed Time | 130 | 140 | 150 |
|---|---|---|---|
| Unit Operation Time | 10 | 10 | 10 |
| Unit    Operation | 1a charge | 1a reaction | 1a discharge |
|  | 1b discharge | 1b charge | 1b reaction |
|  | 1c reaction | 1c discharge | 1c charge |
| Unit Operation Time | 10 | 10 | 10 |
| Total Elapsed Time | 130 | 140 | 150 |

| Total Elapsed Time | 130 | 140 | 150 |
|---|---|---|---|
| Unit Operation Time | 10 | 10 | 10 |
| Unit    Operation | 2a reaction | 2a discharge | 2a charge |
|  | 2b charge | 2b reaction | 2b discharge |
|  | 2c discharge | 2c charge | 2c reaction |
| Unit Operation Time | 10 | 10 | 10 |
| Total Elapsed Time | 130 | 140 | 150 |

Product Calcium Carbonate Crystals: SEM Image at 12,000x

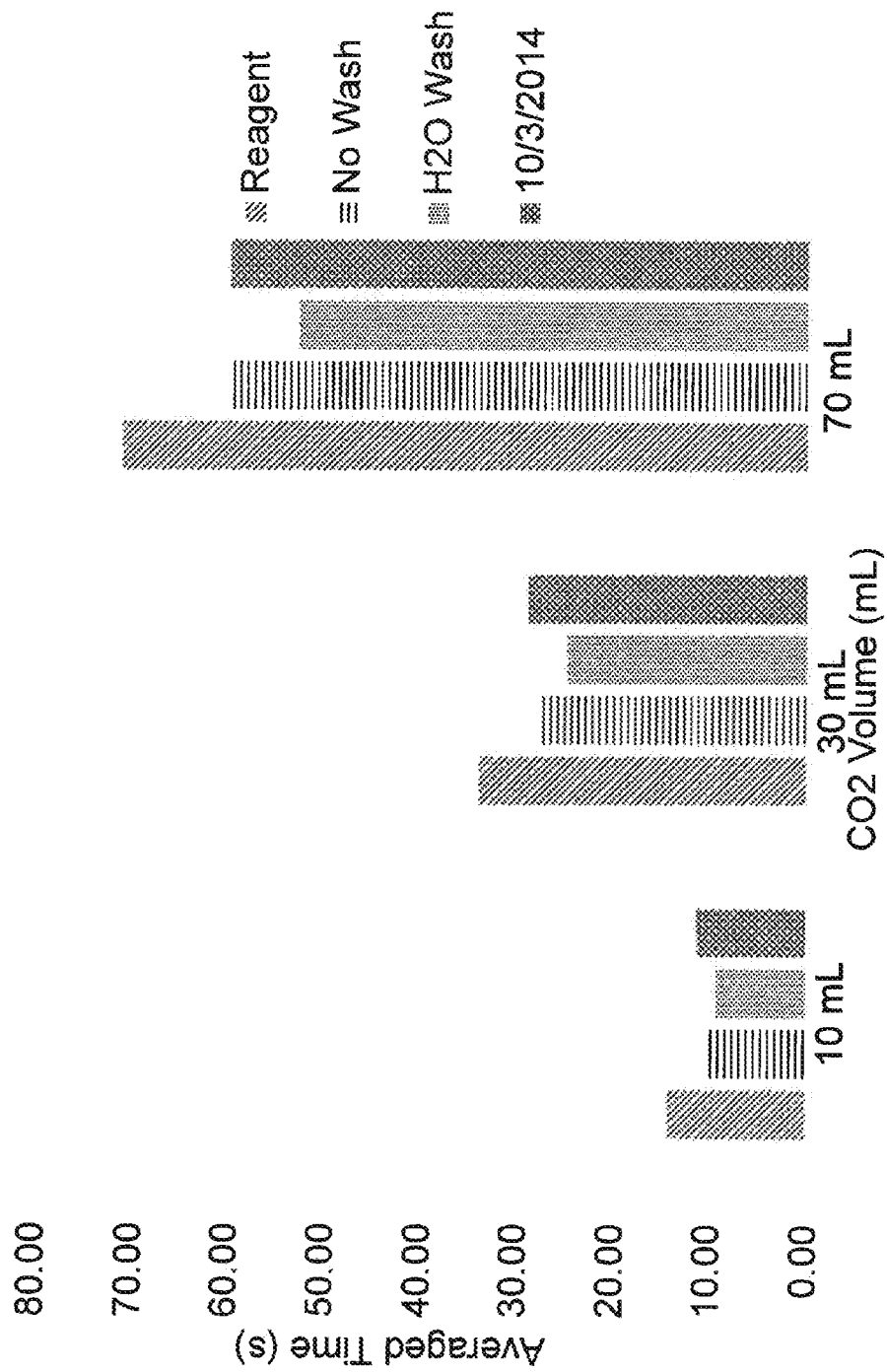

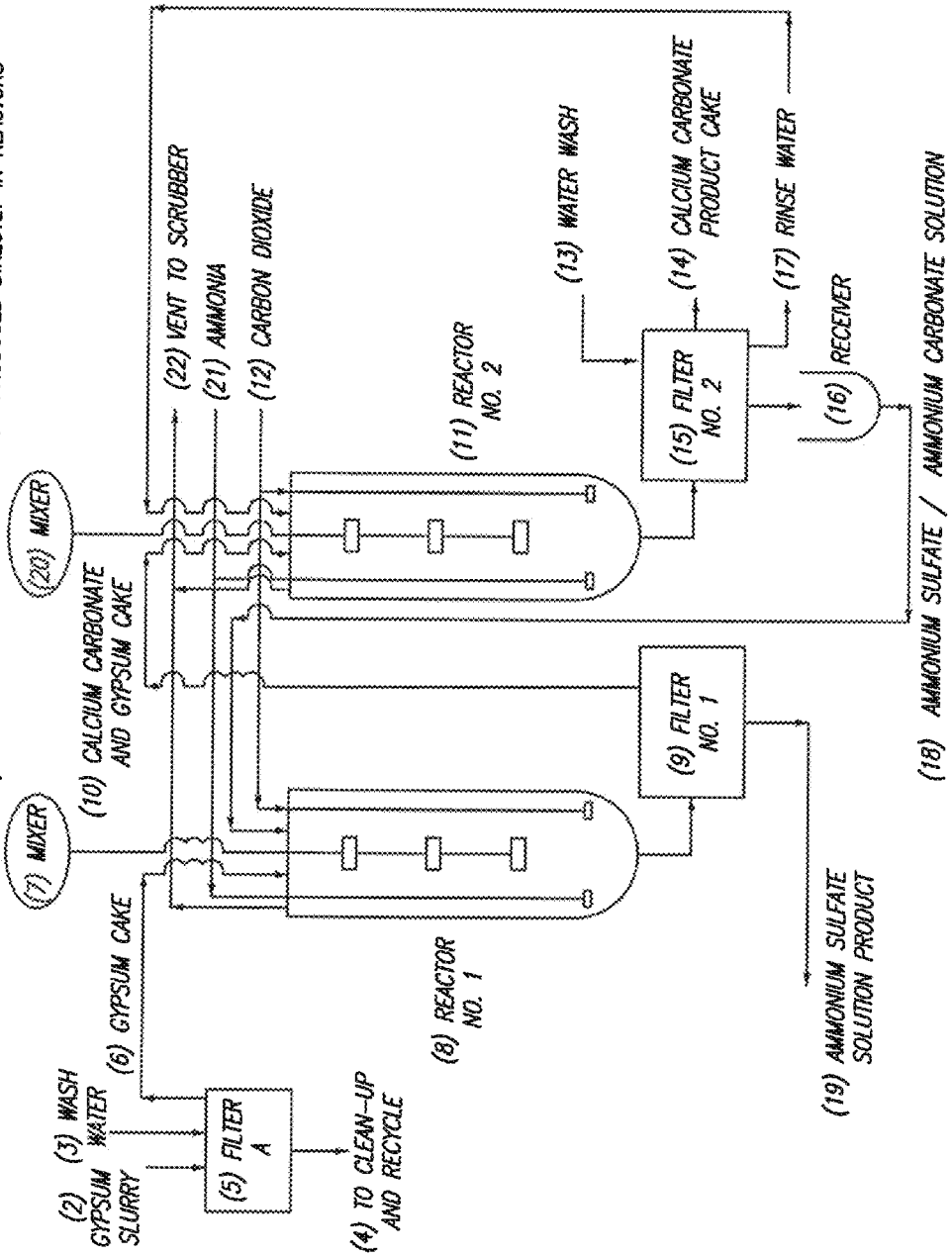

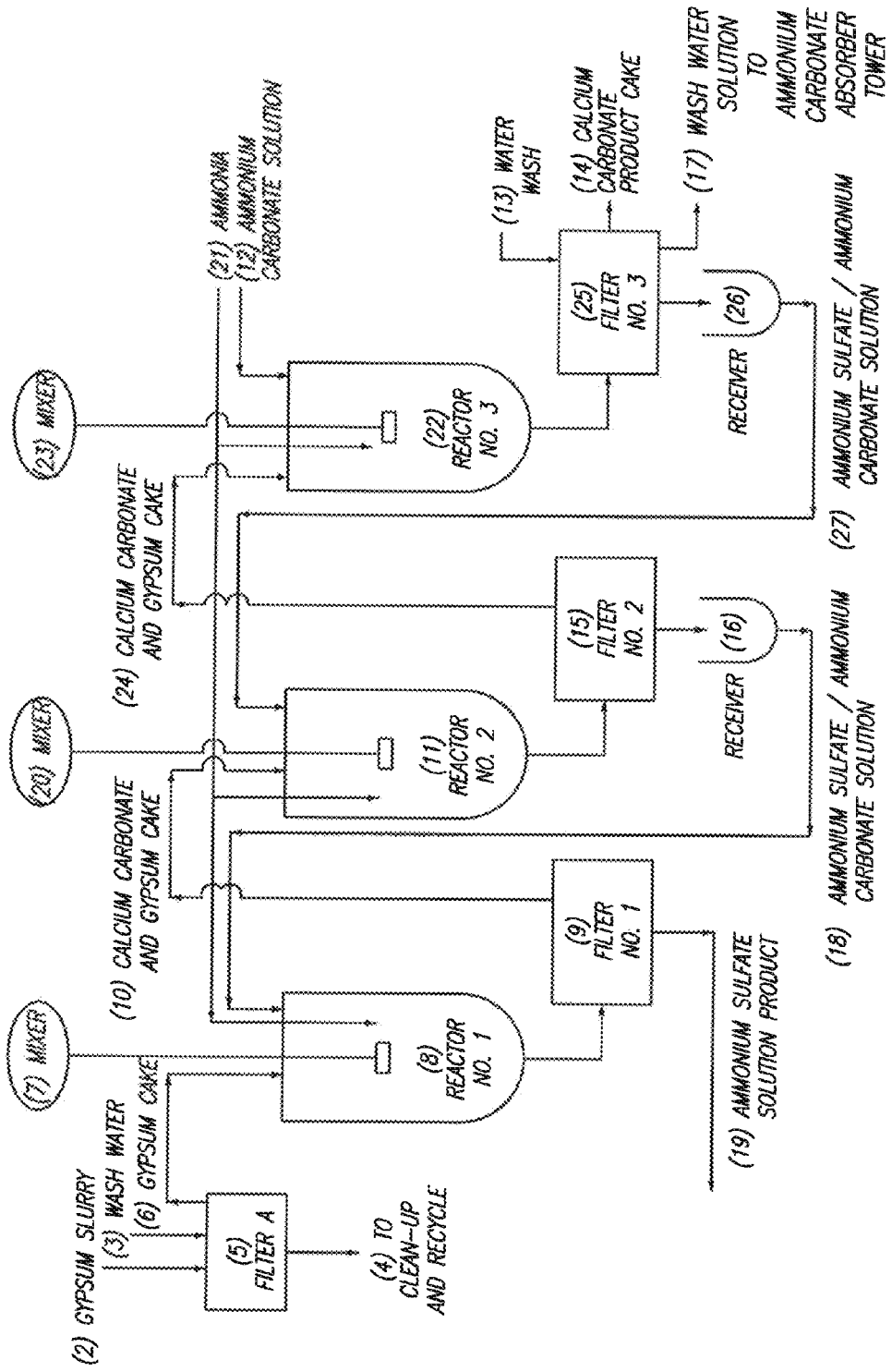
FIGURE 16 – THREE REACTOR GYPSUM CONVERSION, PARTIALLY CONTINUOUS COUNTERCURRENT FLOW PROCESS

PARTIALLY CONTINUOUS COUNTERCURRENT PROCESS FOR CONVERTING GYPSUM TO AMMONIUM SULFATE AND CALCIUM CARBONATE

BACKGROUND OF THE INVENTION

This invention relates to the efficient, low cost production of high purity ammonium sulfate and calcium carbonate from gypsum. The gypsum may be from any source, whether mined from natural deposits or produced synthetically by a variety of means including that obtained as a byproduct from flue gas desulfurization (FGD gypsum) systems located at electric power plants, the manufacture of phosphoric acid (phosphogypsum), the production of nitrogen-phosphorus-potassium (NPK) fertilizers (nitrogypsum), the production of titanium dioxide by the sulfate process (titanogypsum), the manufacture of purified citric acid (citrogypsum), and the production of hydrofluoric acid (fluoroanhydrite (an anhydrous form of gypsum)).

While synthetic gypsum provides a cheap source of gypsum as byproducts, the physical structure of the gypsum crystalline particles may have characteristics that make it difficult to react with other chemicals. The process of the present invention overcomes this problem and other difficulties to result in an economically viable method to produce ammonium sulfate and calcium carbonate of high purity and yield and further resulting in selectable polymorphs of calcium carbonate including the crystal structure of vaterite and calcium carbonate crystals down to nano proportions. Further, the process provides for multiple concurrent calcium carbonate crystal sizes and crystal shapes to be produced simultaneously.

FGD gypsum is a synthetic product resulting from sulfur dioxide ($SO_2$) gas emission control systems used at fossil fuel and particularly, coal combustion power plants to remove sulfur from the combustion gases using "scrubber" devices. The sulfur dioxide is derived from sulfur containing compounds in the fuels. A wet scrubber uses lime (calcium oxide or calcium hydroxide) or more typically, limestone (calcium carbonate) to react with sulfur dioxide gas to remove the sulfur in a solid form. The reaction in wet scrubbing uses a limestone ($CaCO_3$)—water slurry to produce calcium sulfite ($CaSO_3$) according to the following chemical reaction:

$$CaCO_3(solid) + SO_2(gas) \rightarrow CaSO_3(solid) + CO_2(gas)$$

To partially offset the cost of the FGD installation, the $CaSO_3$ (calcium sulfite) may be further oxidized (known as forced oxidation) to produce $CaSO_4 \cdot 2H_2O$ (FGD gypsum) according to the following chemical reaction:

$$CaSO_3(solid) + \tfrac{1}{2}H_2O(liquid) + \tfrac{1}{2}O_2(gas) \rightarrow CaSO_4 \cdot \tfrac{1}{2}H_2O(solid) \text{Hydration}$$
$$CaSO_4 \cdot \tfrac{1}{2}H_2O + 1\tfrac{1}{2}H_2O \rightarrow CaSO_4 \cdot 2H_2O$$

Large quantities of phosphoric acid are used in the production of fertilizers and detergents. Phosphoric acid is obtained by processes based on the decomposition of phosphate minerals, such as phosphate rock (e.g. apatite or phosphorite) with an acid, such as sulfuric acid or nitric acid. Phosphogypsum is a byproduct of producing phosphoric acid by treating phosphate rock with an acid. Often, the phosphate rock contains one or more radioactive elements such as uranium and thorium and these elements may be present in the phosphogypsum.

The phosphate rock is typically treated with sulfuric acid according to the following reaction:

$$Ca_3(PO_4)_2 + 3H_2SO_4 \rightarrow 2H_3PO_4 + 3CaSO_4 \text{Hydration}$$
$$CaSO_4 \cdot \tfrac{1}{2}H_2O + 1\tfrac{1}{2}H_2O \rightarrow CaSO_4 \cdot 2H_2O$$

Tri-calcium phosphate reacts with sulfuric acid to form phosphoric acid and calcium sulfate (gypsum).

Phosphate rock may also be treated with nitric acid to yield phosphoric acid and calcium nitrate. The calcium nitrate is then reacted with ammonium sulfate to yield ammonium nitrate and gypsum as shown in the following reactions:

$$Ca_{10}F_2(PO_4)_6 + 20HNO_3 \rightarrow 6H_3PO_4 + 10Ca(NO_3)_2 + 2HF$$
$$(NH_4)_2SO_4 + Ca(NO_3)_2 + 2H_2O \rightarrow 2NH_4NO_3 + CaSO_4 \cdot 2H_2O$$

Whether the phosphate rock is treated with sulfuric acid, nitric acid or another acid, the less soluble gypsum can be separated from the product phosphoric acid by filtration. The resulting phosphogypsum is usually a hemihydrate or a dihydrate, depending on process parameters and reactant concentrations.

Titanium dioxide is an important white pigment which is manufactured in large quantities wherein about half is produced by the sulfate process. The sulfate process results in byproduct calcium sulfate (titanogypsum).

Large quantities of citric acid are used in the food, pharmaceutical and detergent industries which is produced by mycological fermentation of crude sugar solutions such as molasses. In order to eliminate impurities from the citric acid, such as proteins and sugars, it is precipitated with lime (calcium oxide) to form calcium citrate. Pure citric acid is produced by acidification with sulfuric acid and byproduct calcium sulfate (citrogypsum) is removed.

In the production of hydrofluoric acid the mineral fluorspar or fluorite is heated with sulfuric acid. This results in the production of hydrofluoric acid and calcium sulfate in the anhydrous form of anhydrite (fluoroanhydrite).

Synthetically produced gypsum results from precipitation processes and consists of small, fine, crystalline particles that are chemically nearly identical to mined natural gypsum, but physically may be of smaller particle size and have different crystal structure.

For example, FGD gypsum produced at different power plants may differ slightly in chemical composition and in crystalline structure. Most chemical differences are due to impurities from the employed fuel. Structurally, however, some FGD gypsum may be composed of crystalline particles that have less surface area and are thus less reactive than other FGD gypsum crystalline particles. FGD crystals that are thicker and more spherical have less reactive surface area. Thus, a process that employs FGD gypsum as a starting material, must be able to accommodate the less reactive FGD gypsum particles as well as FGD gypsum crystalline particles resulting from other FGD installations that produce particles having flatter, more disc like structure with greater reactive surface area.

The above discussion of the relation of crystal size and shape to reactivity is also true for other types of gypsum, such as, for example, phosphogypsum, titanogypsum, citrogypsum and fluoroanhydrite.

A further consideration of the process that results in the production of synthetic gypsum is the purity of the reactants and process operations which affect purity of the gypsum byproduct.

The process of the present invention employs a chemical reaction of FGD gypsum with ammonium carbonate (($NH_4$)$_2CO_3$) to produce ammonium sulfate (($NH_4$)$_2SO_4$)

and calcium carbonate ($CaCO_3$). Both the ammonium sulfate and calcium carbonate products are commercially valuable materials and are produced by the present process in high purity and high yield.

Ammonium sulfate (21-0-0-24S) is used most commonly as a chemical fertilizer for alkaline soils. When applied to damp soil, an ammonium ion is released which creates a small amount of acid, that lowers the pH balance of the soil. In the soil, the ammonium ions are converted to nitrate by soil bacteria which contributes nitrogen to the soil and aids in plant growth. Ammonium sulfate dissolves relatively slowly (ammonium sulfate—74.4 g/100 mL at 20° C. (68° F.), urea—107.9 g/100 mL at 20° C., ammonium nitrate—150 g/100 mL at 20° C.), which makes for more efficient use and thus reduces cost compared to some other artificial fertilizers. For example, the relatively slow aqueous dissolution of ammonium sulfate affords a slow release fertilizer providing environmental benefits of less runoff of fertilizer unused by plants to streams and less leaching of fertilizer unused by plants to groundwater.

Common nitrogen fertilizers include anhydrous ammonia (82% N), urea (46% N), urea and ammonium nitrate solutions (28-32% N), ammonium sulfate (21% N) and ammonium nitrate (34% N). Ammonium sulfate (21%) is a nitrogen source with little or no surface volatilization loss when applied to most soils. It is easy to store and is not as hygroscopic as ammonium nitrate. Ammonium sulfate is a good source of sulfur when it is needed to correct or prevent a sulfur deficiency. In areas with high pH soils, the sulfur in ammonium sulfate helps lower soil pH levels.

In addition to use as fertilizer, ammonium sulfate is used as an agricultural spray adjuvant for water soluble insecticides, herbicides and fungicides. In this capacity, it functions to bind iron and calcium cations that are present in both well water and plant cells. It is particularly effective as an adjuvant for 2,4-D (amine), glyphosate, and glufosinate herbicides.

Ammonium sulfate is used in flame retardant materials because it lowers the combustion temperature and increases the production of residues or chars.

In biochemistry, ammonium sulfate precipitation is a common method for purifying proteins by precipitation. As such, ammonium sulfate is also listed as an ingredient in many vaccines used in the United States. The DTap vaccine, which protects children from diphtheria, tetanus, and whooping cough, uses ammonium sulfate for this purpose.

Fine calcium carbonate results as precipitated particles from the process of the present invention and is useful in many industries.

High purity calcium carbonate is used as dietary calcium supplement to help ensure healthy bones and teeth. Calcium carbonate supplement is effective to treat certain medical disorders related to calcium deficiency such as osteoporosis and to reduce acid in the stomach and relieve indigestion and heartburn. For irritable bowel syndrome, a calcium carbonate supplement may be taken to reduce or relieve diarrhea. Calcium carbonate is used in the production of toothpaste and as an inert substance in pharmaceutical or dietary supplement tablets.

Fine calcium carbonate is the most preferred mineral in the paper industry, used for filling and coating paper. It helps in production of the best quality printing papers. Precipitated calcium carbonate is used as a filler in paper because it is cheaper than wood fiber wherein printing and writing paper can contain 10-20% calcium carbonate. In North America, calcium carbonate has begun to replace kaolin in the production of glossy paper. Europe has been practicing this as alkaline or acid-free papermaking for several decades. Precipitated calcium carbonate is especially useful compared to ground calcium carbonate because of having a very fine and controlled particle size, on the order of 2 micrometers in diameter, which is of particular utility in producing coatings for paper.

The calcium carbonate produced by the process of the present invention has been characterized as having a high proportion of the vaterite polymorph. Calcite, aragonite, and vaterite are the three anhydrous polymorphs of calcium carbonate, in order of decreasing stability. Among the polymorph modifications of calcium carbonate, the metastable vaterite is the most practically important. Vaterite particles are applied in regenerative medicine, drug delivery and a broad range of personal care products. Vaterite-type calcium carbonate particles have unique properties such as high hydrophilicity, large surface areas, and hierarchical structures consisting of primary vaterite particles in comparison with calcite or aragonite-type polymorphs. Synthesized and natural calcium carbonates have been widely used as fillers, pigments and other functional materials for paper, foods, cosmetics, medical materials and commodities produced at industrial level. Of the three polymorphs of calcium carbonate, vaterite-type calcium carbonate particles are metastable, and have secondary spheres consisting of primary particles approximately 100 nm in diameter. Thus, vaterite particles have large specific surface areas with porous structures and are more hydrophilic than other two polymorphs. These properties of vaterite particles are significant as coatings for high-grade ink-jet papers, because rapid absorption of extremely small and water-based ink droplets into the coated layer without spreading to the in-plane direction is the most significant for photograde ink-jet printing.

In the oil industry, calcium carbonate is added to drilling fluids as a formation-bridging and filter cake sealing agent and can also be used as a weighting material to increase the density of drilling fluids to control the down-hole pressure.

The process of the present invention further employs a chemical reaction of gypsum resulting from acid treatment of phosphate rock with ammonium carbonate (($NH4$)$_2CO_3$) to produce ammonium sulfate (($NH4$)$_2SO_4$) and calcium carbonate ($CaCO_3$). Both the ammonium sulfate and calcium carbonate products are commercially valuable materials and are produced by the present process in high purity, depending upon the composition of the phosphate rock, and high yield.

SUMMARY OF THE INVENTION

While the present partially continuous countercurrent process can employ gypsum from any source without limitation, the examples used in the present application employed FGD gypsum ($CaSO_4 \cdot 2H_2O$) from coal fired electric power plants and gypsum ($CaSO_4 \cdot 2H_2O$) from acid treatment of phosphate rock such as phosphogypsum, and successfully converted the gypsum to calcium carbonate ($CaCO_3$) and ammonium sulfate (($NH_4$)$_2SO_4$) at conversion rates of 100% and at least of 98 to 100% using the process of the present invention. Such high conversion rates were achieved despite some of the employed gypsum crystalline particles having a physical structure that provided poor reactivity.

The process of the present invention is characterized by a unique combination of countercurrent flows coupled with reactors operated in a batch manner and thus partially continuous, with internal recycle of liquids to maximize the yield and purity of reaction products while minimizing the reaction time. If the present process was a fully continuous process, then material would be constantly fed into and out of the reactors. Where mixing occurs in the reactors then the material does not enter and exit on a first-in-first-out basis. For this reason, some material may be last-in-first-out and exit the reactor before the contents completely react. With respect to the reaction of gypsum and ammonium carbonate in a fully continuous process, then some ammonium carbonate would exit with the product ammonium sulfate and some gypsum would exit with the product calcium carbonate, and the desired conversion to calcium carbonate and ammonium sulfate would not be achieved.

However, unlike a fully continuous countercurrent process, the present process is a partially continuous countercurrent process for converting gypsum by reaction with ammonium carbonate to ammonium sulfate and calcium carbonate. The partially continuous countercurrent process of the present invention overcomes the above noted inefficiencies and problem of incomplete reactions by introducing the reactants into the reactor, mixing the reactants for a predetermined amount of time and then removing materials from the reactor and separating solids from solutions. No reactants are added during the removal process and thus the reactants have sufficient time to react and ensure the desired degree of reaction and product yield.

While reference has been made to converting gypsum, the dihydrate form of calcium sulfate ($CaSO_4.2H_2O$), the process of the present invention also converts the hemihydrate and anhydrous forms of calcium sulfate to the products, calcium carbonate and ammonium sulfate.

The process of the present invention employs FGD gypsum or gypsum from acid treated phosphate rock, to combine with ammonium carbonate (($NH_4)_2CO_3$) or alternatively, ammonium bicarbonate ($NH_4HCO_3$) to undergo a chemical reaction to produce ammonium sulfate solution (($NH_4)_2SO_4$) and calcium carbonate ($CaCO_3$) by the following reaction:

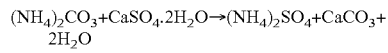
$(NH_4)_2CO_3 + CaSO_4.2H_2O \rightarrow (NH_4)_2SO_4 + CaCO_3 + 2H_2O$ The process achieves a conversion efficiency to ammonium sulfate and calcium carbonate of 100% and at least 97 to 100% by employing two or more reactors in a partially continuous countercurrent flow process. The process of the present invention obtains a high yield while maintaining low reaction retention time, low excess use of reactants, moderate temperature and less mixing action.

The process of the present invention makes maximum use of recycled materials such as the previously mentioned FGD gypsum and gypsum from acid treatment of phosphate rock. Additionally, with respect to the above described production of carbon dioxide by scrubbing the flue gas which ultimately produces FGD gypsum, the ammonium carbonate used in the process of the present invention is preferably produced by removing the carbon dioxide created by the reaction of sulfur dioxide and calcium carbonate in the flue gas scrubber or from the burning of coal, and reacting the carbon dioxide with ammonia in a separate reactor and process to produce the ammonium carbonate according to the following reaction:

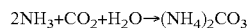
$2NH_3 + CO_2 + H_2O \rightarrow (NH_4)_2CO_3$

Thus, a complete recycle of the scrubber carbon dioxide can be achieved by employing it in the form of ammonium carbonate to feed back into the process of the present invention. This would help lead to compliance with air quality regulations and possibly lead to less atmospheric greenhouse effect.

Alternatively, the ammonium carbonate could be produced directly, according to the above reaction, in process reactors while the gypsum conversion reaction is occurring by using carbon dioxide removed from the flue gas or directly using flue gas (containing carbon dioxide) and adding ammonia with it in the reactor.

The process further enables control over the size, size distribution, polymorphs, and stability of polymorphs of calcium carbonate product crystals by providing flexibility in control of reactions times, reaction temperatures, reaction pH, and reactant ratios in each reactor. The mixtures of ammonium carbonate and ammonium bicarbonate also may be used efficiently for this process as shown in the examples below.

FGD gypsum is produced at different power plants in the form of crystalline particles that have different physical characteristics. The present process achieves a high product yield even employing fairly unreactive FGD gypsum crystals. Such gypsum crystals are thicker and have less surface area compared to the flatter, more disc like crystals produced at other power plants.

Accordingly, the present process can accommodate the less reactive FGD gypsum particles due to their large size and thickness and decreased surface area, as well as FGD gypsum crystalline particles resulting from other FGD installations that produce particles having flatter, more disc like structure with greater reactive surface area. Testing of FGD gypsum and the resulting product purities indicate that other forms of gypsum that are not FGD gypsum may easily be used in the process. This assertion is further validated by the tests described herein, employing gypsum originating from acid treatment of phosphate rock.

The present partially continuous countercurrent process achieved a conversion efficiency to ammonium sulfate and calcium carbonate of 97 to approximately 100% and higher conversion yields were also obtained of 98% to approximately 100%, 99% to approximately 100% and an achieved yield of approximately 100% conversion by employing two or more reactors in a multistage, partially continuous countercurrent flow process.

BRIEF DESCRIPTION OF THE DRAWINGS

FIGS. 8A and 8B together show a schematic of the two reaction stage gypsum conversion, partially continuous countercurrent flow process of the invention using three reactors acting in parallel within each stage (six total reactors).

FIGS. 9A, 9B and 9C together show a schematic of the three or more reaction stage, gypsum conversion, partially continuous countercurrent flow process of the invention using two reactors acting in parallel within each stage (six or more total reactors).

FIGS. 10A, 10B and 10C together show a process sequencing diagram for the two stage, two reactor process shown in FIG. 1.

FIGS. 11A, 11B and 11C together show a process sequencing diagram for the two stage, four reactor process shown in FIG. 2.

FIGS. 12A, 12B and 12C together show a process sequencing diagram for the two stage, six reactor process shown in FIG. 8.

FIG. 14 shows results of product calcium carbonate reactivity test.

FIG. 15 shows a schematic of the two stage, two reactor gypsum conversion, partially continuous countercurrent flow process of the invention wherein ammonium carbonate and ammonium bicarbonate solution is produced directly in the reactors.

FIG. 16 shows a schematic of the three stage, three reactor gypsum conversion, partially continuous countercurrent flow process of the invention.

DETAILED DESCRIPTION OF THE INVENTION

The processes of the present invention employ two or more reactors in a partially continuous countercurrent flow process to convert gypsum to ammonium sulfate and calcium carbonate at a yield of 100%, 99 to 100% and 97 to 100%. The gypsum is converted according to the following chemical reaction:

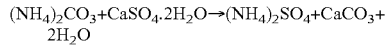
$(NH_4)_2CO_3 + CaSO_4 \cdot 2H_2O \rightarrow (NH_4)_2SO_4 + CaCO_3 + 2H_2O$ The present inventive process includes five embodiments that are described in detail below. The first embodiment is a two stage reaction process that employs two reactors (e.g. see FIG. 1), the second embodiment is a two stage reaction process that employs four or more reactors wherein there are two or more parallel reactors in each stage (e.g. see FIG. 2), the third embodiment is a three stage reaction process that employs six or more reactors wherein there are two or more parallel reactors in each stage (e.g. see FIG. 9), the fourth embodiment is a three stage reaction process that employs three reactors (see e.g. FIG. 16), and the fifth embodiment is the first, second, third or fourth embodiments wherein ammonium carbonate is produced directly in the reactors rather than added from an outside source (see e.g. FIG. 15).

However, the present invention is not limited to a two or three stage process, nor limited to employing two, three, four or six reactors, but may include a multiplicity of stages, of two or more and include any number of reactors of two or more, to facilitate process control and optimize product purity and yield depending upon the characteristics of the gypsum feed to be converted and desired characteristics of the product ammonium sulfate and calcium carbonate.

Features Shared by all Embodiments of the Invention

Figure 1:
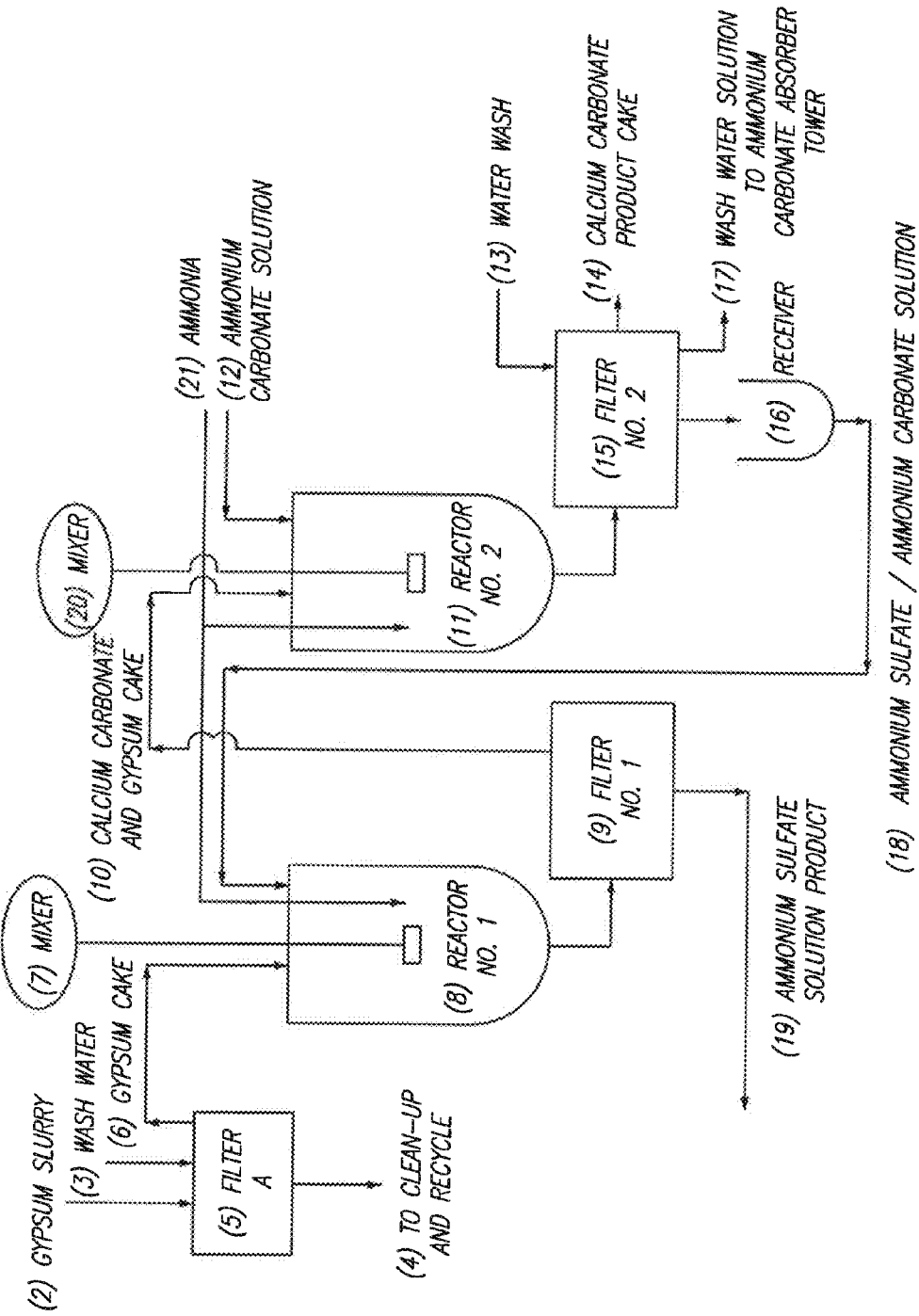
FIG. 1 shows a schematic of the two stage, two reactor gypsum conversion, partially continuous countercurrent flow process of the invention.

The process for conversion of gypsum to ammonium sulfate and calcium carbonate by the reaction with ammonium carbonate is by a unique combination of countercurrent flows coupled with reactors operated in a batch manner and thus partially continuous, with internal recycle of liquids to maximize the purity of reaction products while minimizing the reaction time. However, unlike a fully continuous countercurrent process, the present process is a partially continuous countercurrent process for converting gypsum to ammonium sulfate and calcium carbonate. As shown in FIG. 1, for example, reactants are fed to Reactor No. 1 or Reactor No. 2; the feed is then shut off, and the reaction is allowed to occur for a period of time after which the materials are discharged. At the time that materials are drawn from the reactor, there are no reactants added to the reactors. Further referring to FIG. 1, for example, product ammonium sulfate is not drawn off as a final product until the desired degree of the reaction is complete and none is recycled back into the process, e.g. into Reactor No. 1. Also, as shown in FIG. 1, the calcium carbonate slurry is not removed from the final reactor until the desired degree of the reaction is complete and ammonium sulfate/ammonium carbonate solution is then removed from the final reactor to the preceding reactor before it is again supplied with unreacted ammonium carbonate and the total solids of the preceding reactor consisting of a mixture of unreacted gypsum and calcium carbonate. Thus total control is maintained over the reaction completion of the final products until the desired completeness of the reaction is obtained. In most cases, the desired degree of reaction completeness will be 100% from ammonium carbonate to ammonium sulfate and 100% from gypsum to calcium carbonate. It follows that the reactors are not required to be totally emptied to ensure the desired completeness, as long as no reactants are being added while the reactor is emptied.

The filters remove solids and thus enable the solids to pass through the process without recycle while liquid flows are controlled as countercurrent flows but with internal recycle within the system of a reactor, the filter for its discharge, and the pump which handles the prime filtrate of the filter. Circulation of liquids in embodiments of the present process may be induced by gravity, or one or more pumps, or by a combination of gravity and pump(s), or even by other means for inducing circulation of liquids. By this configuration, the concentration of the liquid reactants can be controlled within a reactor and the solids concentration within a reactor can be controlled. By controlling the concentration of liquid reactants, the reactors can be run with major excesses of a particular reactant within a reactor thereby greatly influencing both the reaction time and reaction completeness with regard to the low concentration of another reactant. This means of operation also allows the solids concentration within a reactor to be controlled, which is also important in obtaining complete reaction of the solids in a minimum time.

In all of the embodiments, filtration may be by various means including gravity, pressure or vacuum filtration, employing filtration media such as glass fiber and porcelain sieve. Filters, especially zoned filters, may be used including belt filters, pan filters, drum filters and plate & frame filters. Alternative means of separating solids from liquids such as centrifugation may be employed. If desired, agglomerates of calcium carbonate product crystals that form during the process may be broken up by using a sonifier, homogenizer, or other traditional means used for particle size reduction.

In embodiments of the present process that employ an absorber tower to recycle the product calcium carbonate cake wash water, the types of towers include packed bed, and spray tower absorbers. When treating gypsum, the calcium carbonate cake wash water will pass through the absorber along with ammonia and carbon dioxide from the power plant stack gases to produce ammonium carbonate.

The ammonium carbonate will be recycled back into the process for use as a process reactant.

Embodiment Number 1

Two Stage, Two Reactor Gypsum Conversion Partially Continuous Countercurrent Process A two reactor, two stage, countercurrent process is one embodiment of the present invention. A schematic of the process is shown in FIG. 1. With reference to FIG. 1, an ammonium carbonate solution enters the process at Reactor No. 2 (11) and the unreacted gypsum enters the process at Reactor No. 1 (8). The ammonium carbonate solution may be obtained from an off-site source or if treating FGD gypsum, the ammonium carbonate may be prepared from electric power plant flue gas containing carbon dioxide from the reaction of the carbon dioxide with ammonia to produce the ammonium carbonate that is introduced to the process as described above.

This introduction of reactants ensures that previously, partially reacted gypsum is exposed to the greatest strength ammonium carbonate solution (as may be prepared by absorption tower from the $CO_2$ of the flue gas, if treating FGD gypsum) in the Reactor No. 2 (11) resulting in excess ammonium carbonate which enables 100% conversion to calcium carbonate. Further, in Reactor No. 1 (8), the partially reacted solution of ammonium carbonate is reacted with full strength gypsum resulting in 100% conversion of the ammonium carbonate to ammonium sulfate. Based upon laboratory and pilot plant test procedures as described, for instance, in the below disclosed Examples, FIG. 1 depicts a two stage partially continuous countercurrent process of the present invention, employing two reactors as simulated by bench scale laboratory tests and pilot plant tests having an approximate 100 pound per hour feed of ammonium carbonate.

Thus, a two reactor, two stage embodiment of the present partially continuous countercurrent process is shown in FIG. 1. The displayed process entails reacting gypsum (including FGD gypsum and gypsum from other sources) with ammonium carbonate to form ammonium sulfate and calcium carbonate. This is a unique, partially continuous countercurrent process with internal recycle of liquids to maximize the yield and purity of product calcium carbonate and ammonium sulfate and minimize water usage.

With further reference to FIG. 1, Gypsum Slurry (2) is a slurry of gypsum previously treated with sulfuric acid which is poured over Filter A (5) resulting in a residual cake. The Gypsum Cake (6) is then rinsed with Wash Water (3) to remove contaminants and the sulfuric acid. The Gypsum Cake (6) is fed to Reactor No. 1 (8) where it is mixed with Ammonium Sulfate/Ammonium Carbonate Solution (18) from Filter No. 2 (15) and its Receiver (16). A Mixer (7) is used to agitate the contents of the Reactor No. 1 (8). The temperature in Reactor No. 1 (8) is maintained between 41° F. to 176° F., preferably 60° F. to 120° F., more preferably 70° F. to 110° F. and most preferably 80° F. to 100° F. The Ammonium Carbonate reacts quickly in Reactor No. 1 (8) since there is a stoichiometric excess quantity of gypsum present. Ammonia (21) in the form of ammonium hydroxide solution or ammonia gas or liquid is added as needed to prevent foaming and to maintain a pH of approximately 6.8 to 9.4 and preferably 7.6 to 9.0 within Reactor No 1 (8). After a retention time of 4 to 60 minutes, and preferably about 10 minutes, effluent from Reactor No. 1 (8) is discharged to Filter No. 1 (9). The filtrate is Ammonium Sulfate Solution Product (19). The combination Calcium Carbonate and Gypsum Cake (10) which is formed in Filter No. 1 (9) is fed to Reactor No. 2 (11). Ammonium Carbonate Solution (12), ranging from 25 to 35% and preferably 33% at a temperature ranging from 120° F. to 60° F. and preferably from 110° F. to 70° F., but most preferably from 100° F. to 80° F., is metered to Reactor No. 2 (11) and is agitated by a Mixer (20). The temperature in Reactor No. 2 (11) is maintained between 41° F. to 176° F., preferably 60° F. to 120° F., more preferably 70° F. to 110° F. and most preferably 80° F. to 100° F. The gypsum reacts quickly in Reactor No. 2 (11) since there is a stoichiometric excess of ammonium carbonate present. Ammonia (21) in the form of ammonium hydroxide solution or ammonia gas or liquid is added to prevent foaming and to maintain a pH of 6.8 to 9.4 and preferably 7.6 to 9.0 within the Reactors. After a retention time of 4 to 60 minutes and preferably about 10 minutes, effluent from Reactor No. 2 (11) is sent to Filter No. 2 (15) to result in a Calcium Carbonate Product Cake (14). The Calcium Carbonate Product Cake (14) is then rinsed with Water Wash (13).

When process parameters are adjusted to produce the calcium carbonate product to be the polymorph of vaterite, then the Water Wash (13) may be bypassed in favor of no water wash or the use of a wash with ammonium sulfate to stabilize vaterite formed in the process for long term storage. The Wash Water Solution To Ammonium Carbonate Absorber Tower (17) now contains some ammonium carbonate and ammonium sulfate that is used when making Ammonium Carbonate Solution (12) for use in the process.

All or a portion of the Wash Water Solution (17) from Filter No. 2, containing some ammonium carbonate and ammonium sulfate, may be fed to Reactor No. 1.

Note that additional process control is provided by having a liquid receiver hold portions of the Ammonium Sulfate/Ammonium Carbonate Solution as is shown in FIG. 1 and notated as Receiver (16).

The following list of process steps summarizes the above described steps of the present two reactor, multistage partially continuous countercurrent flow process shown in FIG. 1 (where filtration is employed, other usual solids-liquids separation operations may be used such as centrifugation):

1. Gypsum (including FGD gypsum and gypsum from other sources, such as that produced from acid treatment of phosphate rock) was mixed with water and sulfuric acid to form an aqueous slurry of about 25 to 30% gypsum, shown as Gypsum Slurry (2), and which was then filtered in Filter A (5) to remove possible physical contaminants in the gypsum. Note that when handling FGD gypsum, a gypsum slurry may be taken directly from the sulfur oxides ($SO_x$) scrubber.
2. The filtered Gypsum Cake (6) from Filter A (5) was washed with water. Thus, wash water containing soluble contaminants in the gypsum was the filtrate from Filter A (5).
3. The filter cake from Filter A (5) was removed and charged to Reactor No. 1 (8).
4. The Ammonium Sulfate/Ammonium Carbonate Solution (18) stream from Receiver (16) was mixed with Gypsum Cake (6) from Filter A (5) within Reactor No. 1 (8) and Ammonia (21) was added as needed to maintain a pH of 6.8 to 9.4 and preferably 7.6 to 9.0 and to prevent foaming. However, it may be necessary to neutralize the ammonia added for control of foaming (whether aqua ammonia or anhydrous ammonia), and thus an acid such as sulfuric acid, may need to be added to the ammonium sulfate solution product. Retention times in reactors of 5, 10, 15, 20, 30, and 60 minutes provided 100% conversion. A retention time of 2 minutes provides 90 to 100% conversion. Using a reactor retention time of 20 minutes in each reactor at 25° C., the stoichiometric percent ratios of gypsum reacting in Reactor No. 1 (8) to Reactor No. 2 (11) of 20%:80%, 80%:20%, 30%:70%, and 70%:30% were tested and showed a 99-100% conversion of gypsum to calcium carbonate. Reducing the retention time to less than 20 minutes in each reactor may produce an incomplete reaction if a less reactive gypsum is used. The temperature in Reactors No. 2 (11) and No. 1 (8) is maintained between 41° F. to 176° F., preferably 60° F. to 120° F., more preferably 70° F. to 110° F. and most preferably 80° F. to 100° F.

5. A mixing unit operation was employed in Reactor No. 1 (8).
6. The Ammonium Sulfate Solution Product (19) was collected from Filter No. 1 (9).
7. Combination product Calcium Carbonate and Gypsum Cake (10) from Filter No. 1 (9) was introduced to Reactor No. 2 (11) and Ammonia (21) was added as needed to maintain a pH of 6.8 to 9.4 and preferably 7.6 to 9.0 and to prevent foaming.
8. In an optional embodiment of the two reactor process, a Mixer (20) may be employed in Reactor No. 2 (11).
9. Ammonium Carbonate Solution (12) ranging from 25% to 35% and preferably about 33% ammonium carbonate solution at a temperature of 60° F. to 120° F., preferably of 70° F. to 110° F. and most preferably of 80° F. to 100° F. was introduced to Reactor No. 2 (11) for a time of reaction and the slurry of reaction products introduced to Filter No. 2 (15).
10. Calcium carbonate filter cake formed in Filter No. 2 (15) was washed with water (Water Wash (13)) to result in Calcium Carbonate Product Cake (14), and the resulting filtrate (Wash Water Solution To Ammonium Carbonate Tower (17)) now containing some ammonium carbonate and ammonium sulfate was used when making Ammonium Carbonate Solution (12) for use in the process. However, the Water Wash (13) may be bypassed in favor of no water wash or the use of a wash with ammonium sulfate to stabilize vaterite formed in the process for long term storage.
11. Ammonium Sulfate Solution Product (19), which is the filtrate from Filter 1 (9), is stored and used as produced or it can be concentrated to a more concentrated solution or sent to a crystallizer. If stored, this solution is optimally heated to 110° F. to 115° F. to keep crystallization from occurring. If a solid ammonium sulfate product is desired then a crystallizer or alternatively, an evaporator, or granulator is employed in the process of the present invention to grow ammonium sulfate crystals for separation and removal as an easier to handle, more solid product.

The calcium carbonate product is shown to principally be very small vaterite spherulites between 1μ and 8μ in diameter, and by weight, 95% of the spherulite diameters were between 2μ and 5μ.

Reactor Sequencing for Exemplified Two Stage Process Embodiments

Figure 10A:
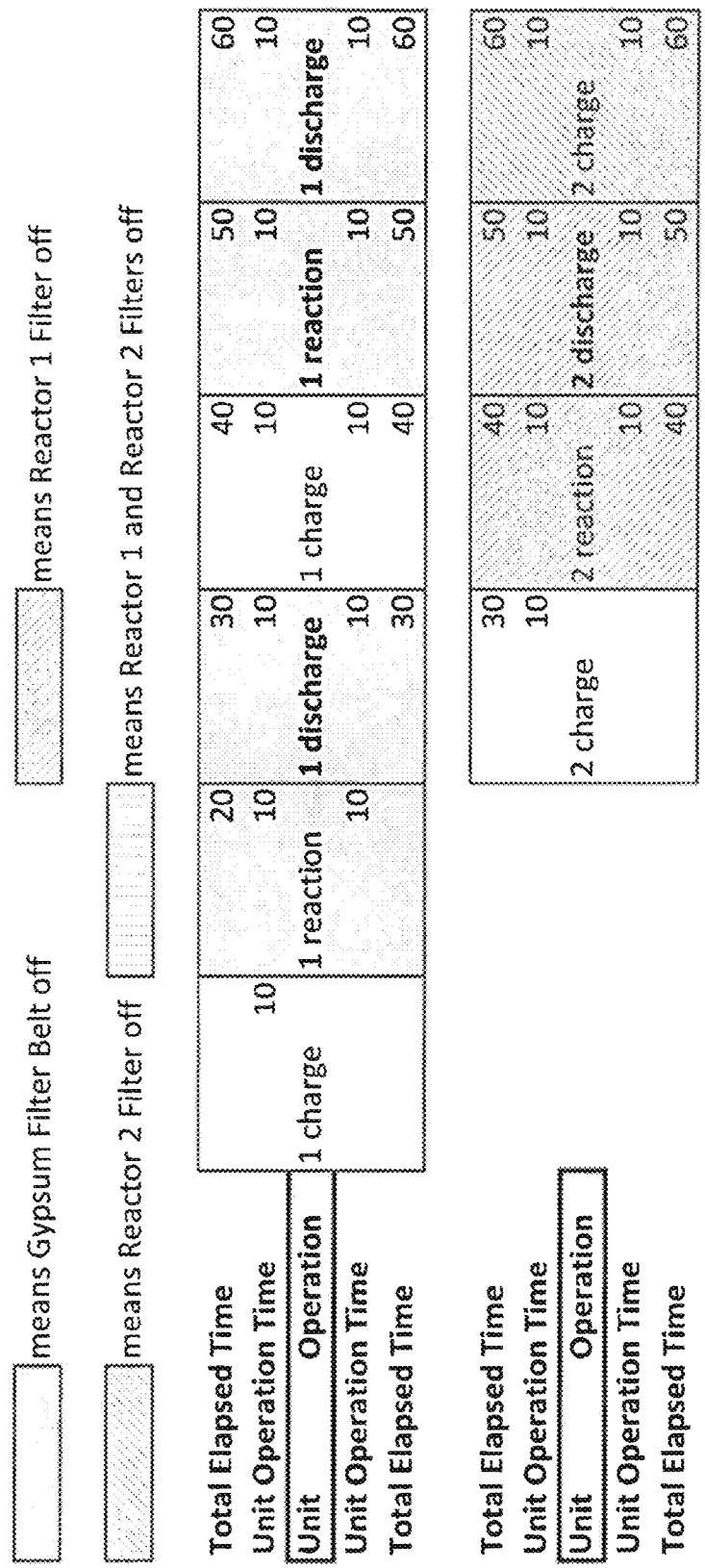
Figure 10B:

FIGS. 10A, 10B and 10C together show a process sequencing diagram for a two stage, two reactor process of the present invention as shown in FIG. 1. This sequencing diagram is for a two stage, two reactor process where the feed to each reactor is charged over a 10 minute period, after which the materials are mixed in the reactor for 10 minutes, and then the reactor is discharged over a 10 minute period. Each block of each row of the sequencing diagram as shown in FIGS. 10A, 10B and 10C represents a 10 minute period of time where the time of the operation is elapsing from left to right and each block vertically represent the same 10 minute period. Each row of the sequencing diagram represents the times of the operations related to the reactors in FIG. 1 where the first row represents the time of operations for Reactor No. 1 (8) and the second row represents the time of the operations for Reactor No. 2 (11). The shading of the sequencing diagram shows the periods of time in the process during which the filters shown in FIG. 1, which in this case are vacuum belt filters, are turned off as labeled by the legend at the top of the diagram. A block with no shading indicates that all of the filters are active.

The numbers 10, 20, 30, 40, 50, 60, 70, 80, 90, 100, 110, 120, 130, 140, and 150 within the blocks represent time in minutes and the labels within the blocks, 1 charge, 1 reaction, 1 discharge, 2 charge, 2 reaction, and 2 discharge designate the reactor and operation occurring during that time interval. For example, the first block in the first row of the sequencing diagram, FIGS. 10A, 10B, and 10C, is labeled "1 charge" indicating that Reactor No. 1 (8) of FIG. 1 is being charged with Gypsum Slurry (2) by Filter A (5) over a 10 minute period. Further, the second block of the first row is labeled "1 reaction" indicating that the materials are held within Reactor No. 1 (8) for a retention time of 10 minutes. The third block represents the 10 minute period of time during which the slurry in Reactor No. 1 (8) is discharged to Filter No. 1 (9) forming the Calcium Carbonate and Gypsum Cake (10). Row 2 of the sequencing diagram is similar to row 1 but shows the charge times, retention times, and discharge times for Reactor No. 2 (11) labeled as 2 charge, 2 reaction, and 2 discharge respectively.

Figure 2:
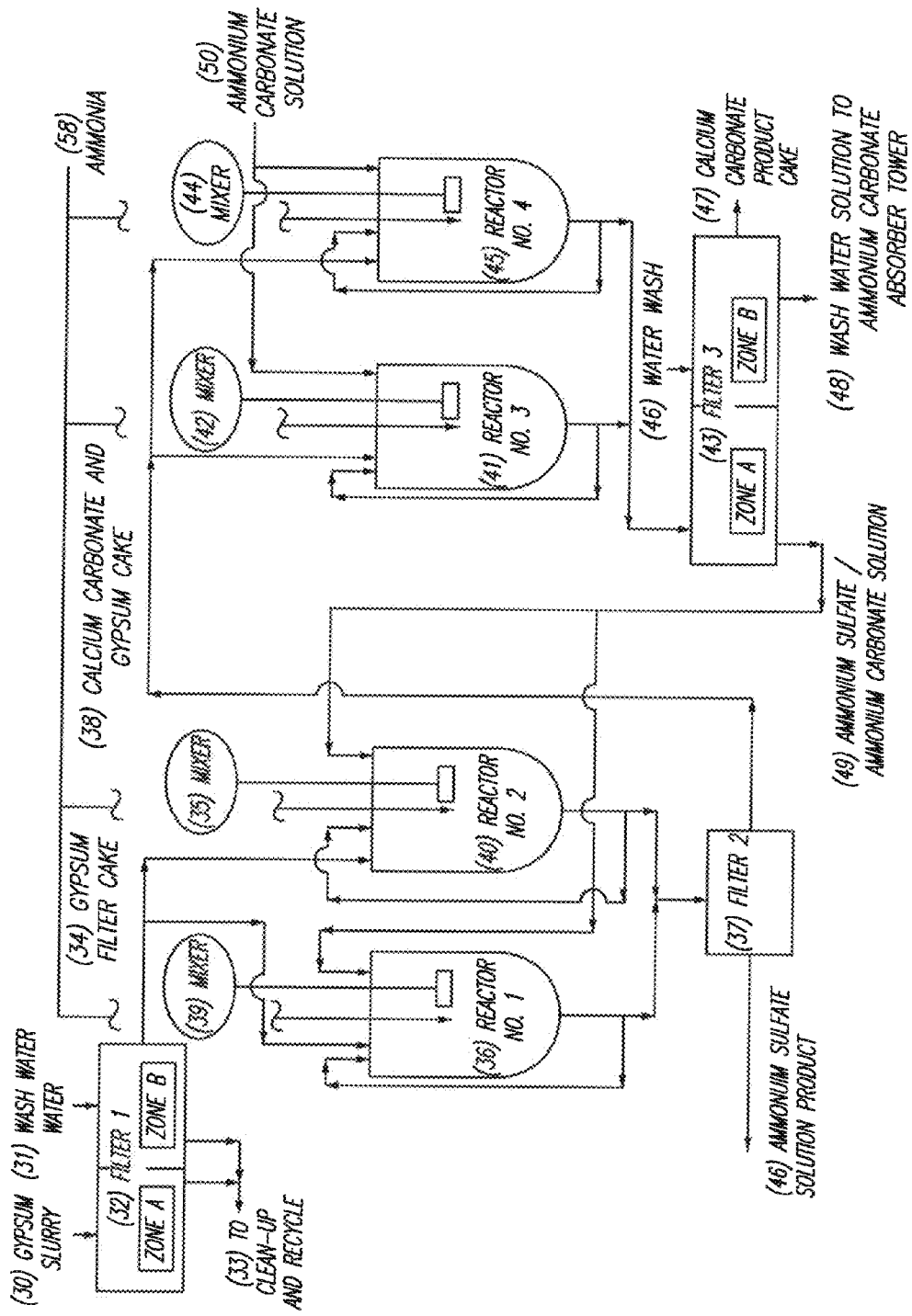
FIG. 2 shows a schematic of the two stage, four reactor gypsum conversion, partially continuous countercurrent flow process of the invention.
Figure 11A:
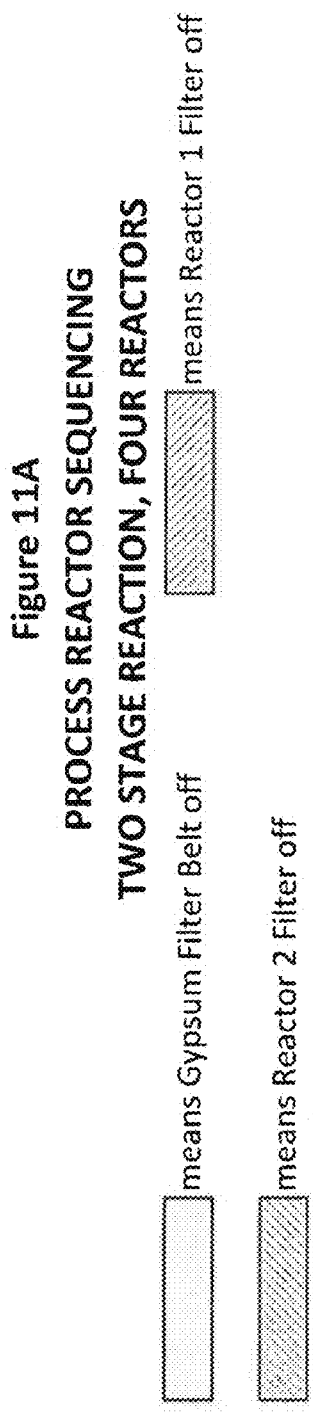

By comparing all of the time intervals during which each filter is off for the 150 minutes of operation shown in this sequencing diagram of this two stage, two reactor process, it is demonstrated that the gypsum slurry Filter A (5) was off line 66.7% of the time, Filter No. 1 (9) was off 61.5% of the time and Filter No. 2 (15) was off 53.8% of the time. FIGS. 11A, 11B and 11C show a process sequencing diagram for a two stage, four reactor process of the present invention as shown in FIG. 2, which is discussed below regarding a second embodiment of the present invention. The rows, labels, and legend of FIGS. 11A, 11B, and 11C are similar to FIG. 10 as described above. The difference is that the parallel reactors in the first stage of FIG. 2, Reactor No. 1 (36) and Reactor No. 2 (40), are denoted on the sequencing diagram by 1*a* and 1*b* respectively and the sequencing diagram labels 2*a* and 2*b* denote Reactor No. 3 (41) and Reactor No. 4 (42) respectively of FIG. 2. During 180 minutes of operation shown in FIGS. 11A, 11B, and 11C of this two stage, four reactor process, the gypsum slurry Filter No. 1 (32) of FIG. 2 was off line 33.3% of the time, Filter No. 2 (37) was off line 33.3% of the time, and Filter No. 3 (43) was off line 26.7% of the time. FIGS. 12A, 12B, and 12C show a process sequencing diagram for a two stage, six reactor process of the present invention as shown in FIGS. 8A and 8B which is discussed below regarding the second embodiment of the present invention. This sequencing diagram is again like the sequencing diagrams of FIG. 10 and FIG. 11 described above except 1*a*, 1*b*, and 1*c* shown in FIGS. 12A, 12B, and 12C denote Reactor No. 1 (36), Reactor No. 2 (40), and Reactor No. 5 (51) respectively of FIG. 8 and the 2*a*, 2*b*, and 2*c* of the FIG. 12 sequencing diagram denote Reactor No. 3 (41), Reactor No. 4 (45), and Reactor No. 6 (52) respectively of FIG. 8. At no time during the times shown in the sequencing diagram for this two stage, six reactor process are any of the vacuum filter belts off line.

The above discussed sequencing diagrams demonstrate the efficiency benefits of running parallel reactors in each stage of the present process.

Embodiment Number 2

Two Stage, Four Reactor Gypsum Conversion Partially Continuous Countercurrent Process A second embodiment of the present invention is a two stage, partially continuous countercurrent process, similar to the two stage, two reactor embodiment, but containing four reactors wherein two reactors are in parallel for each stage (see FIG. 2 for process schematic). An expansion of this embodiment, discussed further below, is a two stage process having more than two reactors operating in parallel within each stage, such as the six reactors shown in FIGS. 8A and 8B.

The additional two reactors are added to ensure extremely high purity and high yield products when using gypsums which contain large crystals having less surface area or with impurities, making them less reactive.

Further, the four reactor process provides benefits for commercial operation wherein good belt filter operation is maintained. The process has two sets of reactors, but only one set of filters so that the filters are always filled with filtration residual cake. When the filters are fed continually, good filtration vacuum is maintained leading to good filtration and good washing of the filtration cakes.

In comparing the four reactor process with the two reactor process shown in FIG. 1, the process in FIG. 1 shows two reactors in series and a Receiver (16) to hold Ammonium Sulfate/Ammonium Carbonate Solution (18). Embodiments of the present process shown in FIG. 2 include a four-reactor process operating like two reactors in series without the use of a Receiver. Additional reactors and/or receivers can be added (if desired) for smooth semi-continuous operation. For example, in FIG. 2, a receiver can be added to hold the Ammonium Sulfate/Ammonium Carbonate Solution (49).

With reference to FIG. 2, Filter 1 (32) is used to filter incoming Gypsum Slurry (30) made up of gypsum and water which contains 1 to 5% sulfuric acid which has been added to dissolve impurities in the FGD gypsum. The belt filters employed in the FIG. 2 process contain a Zone A and a Zone B. In Filter 1 (32) (Zone A) the gypsum is filtered leaving a residual cake which in Zone B has Wash Water (31) passed through it leaving a solution To Clean Up and Recycle (33). The Gypsum Filter Cake (34) is then fed into either Reactor No. 1 (36) or Reactor No. 2 (40) which has previously been charged or is being charged with Ammonium Sulfate/Ammonium Carbonate Solution (49) as discharged from Filter 3 (43) Zone A and coming from either Reactor No. 3 (41) or Reactor No. 4 (45). When Reactor No. 1 (36) or Reactor No. 2 (40) is receiving Ammonium Sulfate/Ammonium Carbonate Solution (49) and is under mixing action from either Mixer (35) or Mixer (39), the Gypsum Filter Cake (34) can be introduced. After being filled with Gypsum Filter Cake (34) and Ammonium Sulfate/Ammonium Carbonate Solution (49) to the appropriate stoichiometric proportions, mixing continues while the reaction is proceeding for the required time for desired completion of reaction and Ammonia (58) is added as needed to prevent foaming by controlling pH between 6.8 and 9.4 and preferably between pH 7.6 and 9.0. After the reaction is complete, the contents of the Reactor 1 (36) or Reactor 2 (40) is fed to Filter 2 (37) where the filtrate as Ammonium Sulfate Solution Product (46) is collected as product and the filter cake consisting of Calcium Carbonate and Gypsum Cake (38) is fed to either Reactor No. 3 (41) or Reactor No. 4 (45), which previously has been charged or is being charged with Ammonium Carbonate Solution (50) and is under mixing by the appropriate Mixer (42 or 44). When charging is complete the reaction continues for the time required to complete the reaction and Ammonia (58) is added to Reactor 1 (36) and Reactor 2 (40) as needed to prevent foaming by controlling pH between 6.8 and 9.4 and preferably between pH 7.6 and 9.0.

When the reaction is complete and either Reactor 3 (41) or Reactor 4 (45) is empty or emptied to a desired level, the slurry formed in Reactor No. 3 (41) or Reactor No. 4 (45) can be fed to Filter 3 (43), Zone A to form the Ammonium Sulfate/Ammonium Carbonate Solution (49) to be sent to the empty reactor. The filter cake has a Water Wash (46) to remove any solution of Ammonium Sulfate/Ammonium Carbonate Solution left in the filter cake so the solutions washed from the cake can be recycled to the process by using the solution to furnish Wash Water Solution To the Ammonium Carbonate Absorber Tower (48). However, the Water Wash (46) may be bypassed in favor of no water wash or the use of a wash with ammonium sulfate to stabilize vaterite formed in the process for long term storage.

For a smooth running process the filters are normally filled with cake. Gypsum Filter Cake (34) from Filter 1 (32) feeds either Reactor No. 1 (36) or Reactor No. 2 (40) as does the Ammonium Sulfate/Ammonium Carbonate Solution (49) which is fed to the same reactor. The filter cake from Filter 2 (37) feeds Reactor No. 3 (41) or Reactor No. 4 (45), with fresh Ammonium Carbonate Solution (50) feeding the same reactor. Filter No. 3 (43) discharges Calcium Carbonate Product Cake (47). Additional process control is provided by having a liquid receiver to hold portions of the Ammonium Sulfate/Ammonium Carbonate Solution as is shown in FIG. 1 and notated as Receiver (16).

Expanded Embodiment Number 2 Having Multiplicity of Reactors

As noted above, an expansion of the second embodiment of the present invention, is a two stage process having more than two reactors operating in parallel within each stage, such as the six reactors shown in FIGS. 8A and 8B. In this case, there may be any number of reactors of two or more, to facilitate process control and optimize product purity and yield depending upon the characteristics of the gypsum feed to be converted and desired characteristics of the product ammonium sulfate and calcium carbonate. Further, the use of additional reactor sets of two improves the efficiency of the process by reducing or eliminating idle time for vacuum belt filters. The additional reactor sets also allow for more flexibility of control of particle size by allowing adjustment of retention times, temperatures, pH, and reactant ratios.

The three reactors in each stage improve process efficiency by eliminating vacuum belt idle time as seen by comparing FIGS. 10-12. This is particularly shown by FIG. 12 wherein FIGS. 12A, 12B, and 12C show a process sequencing diagram for a two stage six reactor process for the process shown in FIGS. 8A and 8B. At no time during the process are any of the vacuum filter belts off line but rather are running at capacity all the time. The sequencing diagrams of FIGS. 10-12 show the efficiency benefits of running parallel reactors in each stage of the process. The additional reactors also allow for flexibility in residence time in the reactors, providing control over particle size and shape and to ensure complete conversion of large, less reactive gypsum.

In FIG. 8, Filter 1 (32) is used to filter incoming Gypsum Slurry (30) made up of gypsum and water which contains 1 to 5% sulfuric acid which has been added to dissolve impurities in the FGD gypsum. The Filter No. 1 and Filter No. 2 employed in the process are zoned, containing a Zone A and a Zone B. In Filter 1 (32) Zone A, the gypsum is filtered leaving a residual cake which in Zone B has Wash Water (31) passed through it leaving a solution To Clean Up and Recycle (33). The Gypsum Filter Cake (34) is then fed into either Reactor No. 1 (36), Reactor No. 2 (40), or Reactor No. 5 (51) which has previously been charged or is being charged with Ammonium Sulfate/Ammonium Carbonate Solution (49) as discharged from Filter 3 (43) Zone A and coming from either Reactor No. 3 (41), Reactor No. 4 (45), or Reactor No. 6 (52). When Reactor No. 1 (36), Reactor No. 2 (40), or Reactor No. 5 (51) is receiving Ammonium Sulfate/Ammonium Carbonate Solution (49) and is under mixing action from either Mixer (35), Mixer (39), or Mixer (53) the Gypsum Filter Cake (34) can be introduced. After being filled with Gypsum Filter Cake (34) and Ammonium Sulfate/Ammonium Carbonate Solution (49) to the appropriate stoichiometric proportions, mixing continues while the reaction is proceeding for the required time. Ammonia is added to Reactor No. 1 (36), Reactor No. 2 (40), and Reactor No. 5 (51) as needed to prevent foaming by controlling the pH to be between 6.8 and 9.4 and preferably between pH 7.6 and 9.0. After the reaction is complete, the contents of the Reactor No. 1 (36), Reactor No. 2 (40), or Reactor No. 5 (51) is fed to Filter 2 (37) to maintain a continuous filtration where the filtrate as Ammonium Sulfate Solution Product (46) is collected as product and the filter cake consisting of Calcium Carbonate and Gypsum Cake (38) is fed to either Reactor No. 3 (41), Reactor No. 4 (45), or Reactor No. 6 (52) which previously has been charged or is being charged with Ammonium Carbonate Solution (50), and is under mixing by the appropriate Mixer (42, 44, or 54). When charging is complete the reaction continues for the appropriate time to finish the reaction and Ammonia (58) is added to Reactor No. 3 (41), Reactor No. 4 (45), and Reactor No. 6 (52) as needed to prevent foaming by controlling the pH to be between 6.8 and 9.4 and preferably between pH 7.6 and 9.0.

When the reaction is complete and either Reactor No. 1 (36), Reactor No. 2 (40), or Reactor No. 5 (51) is empty, the slurry formed in Reactor No. 3 (41), Reactor No. 4 (45), or Reactor No. 6 (52) can be fed to Filter 3 (43) Zone A to maintain a continuous filtration to form the Ammonium Sulfate/Ammonium Carbonate Solution (49) to be sent to the empty reactor. The filter cake has a Water Wash (46) to remove any solution of Ammonium Sulfate/Ammonium Carbonate Solution (49) left in the filter cake so the solutions washed from the cake can be recycled to the process by using the solution to furnish Wash Water Solution To the Ammonium Carbonate Absorber Tower (48).

For a smooth running process the filters are always filled with cake. Gypsum Filter Cake (34) from Filter 1 (32) feeds either Reactor No. 1 (36), Reactor No. 2 (40), or Reactor No. 5 (51) as does the Ammonium Sulfate/Ammonium Carbonate Solution (49) which is fed to the same reactor. The filter cake from Filter 2 (37) feeds Reactor No. 3 (41), Reactor No. 4 (45), or Reactor No. 6 (52), with fresh Ammonium Carbonate Solution (50) feeding the same reactor. Filter No. 3 (43) discharges Calcium Carbonate Product Cake (47). Additional process control, if desired, is provided by having a liquid receiver to hold portions of the Ammonium Sulfate/Ammonium Carbonate Solution as is shown in FIG. 1 and labeled as Receiver (16).

Embodiment Number 3

Three or More Stages, Six or More Reactors—Gypsum Conversion Partially Continuous Countercurrent Process A third embodiment of the present invention is a partially continuous countercurrent process, that includes a multiplicity of stages, of two or more and includes any number of reactors of two or more, with the number of stages and reactors selected to facilitate process control and optimize product purity and yield depending upon the characteristics of the gypsum feed to be converted and desired characteristics of the product ammonium sulfate and calcium carbonate (see FIGS. 9A, 9B and 9C for process schematic).

The size and/or polymorphs of product calcium carbonate can be controlled by the performing the process of the present invention in more than two stages. The stability of the calcium carbonate polymorphs vaterite and aragonite is low, particularly the stability of vaterite. Thus, the schematic of FIGS. 9A, 9B and 9C may optionally include the direct use of ammonium sulfate or recirculation of ammonium sulfate to keep and or delay the product calcium carbonate polymorphs such as vaterite from changing to a more stable calcium carbonate polymorph such as calcite. The schematic of FIG. 9A-C shows a process embodiment containing three stages using three sets of two parallel reactors. While FIG. 9A-C shows a process comprising at least six reactors, more reactors can be used such as the three reactors for each stage shown in FIGS. 8A and 8B. More than three stages, including a multiplicity of stages, can be employed greater than three stages shown in FIGS. 9A, 9B and 9C as indicated by the exponent "n" bracketing two parallel reactors, Reactor No. 5 (51) and Reactor No. 6 (52) and their Filter 4 (53) and Mixers (54 and 55).

In FIG. 9, Filter 1 (32) is used to filter incoming Gypsum Slurry (30) made up of gypsum and water which contains 1 to 5% sulfuric acid which has been added to dissolve impurities in the FGD gypsum. The belt filters employed in the process contain a Zone A and a Zone B. In Filter 1 (32) Zone A, the gypsum is filtered leaving a residual cake which in Zone B has Wash Water (31) passed through it leaving a solution To Clean Up and Recycle (33). The Gypsum Filter Cake (34) is then fed into either Reactor No. 1 (36) or Reactor No. 2 (40) which has previously been charged or is being charged with Ammonium Sulfate/Ammonium Carbonate Solution (57) as discharged from Filter 4 (53) and coming from either Reactor No. 5 (51) or Reactor No. 6 (52). When Reactor No. 1 (36) or Reactor No. 2 (40) is receiving Ammonium Sulfate/Ammonium Carbonate Solution (57) and is under mixing action from either Mixer (35) or Mixer (39), the Gypsum Filter Cake (34) can be introduced. After being filled with Gypsum Filter Cake (34) and Ammonium Sulfate/Ammonium Carbonate Solution (57) to the appropriate stoichiometric proportions, mixing continues while the reaction is proceeding for the required time and Ammonia (58) is added to Reactor No. 1 (36) and Reactor No. 2 (40) as needed to prevent foaming by controlling the pH to be between 6.8 and 9.4 and preferably between 7.6 and 9.0. However, it may be necessary to neutralize the ammonia by adding an acid, such as sulfuric acid. After the reaction is over, the contents of the Reactor 1 (36) or Reactor 2 (40) is fed to Filter 2 (37) where the filtrate as Ammonium Sulfate Solution Product (46) is collected as product and the filter cake consisting of Calcium Carbonate and Gypsum Cake (38) is fed to either Reactor No. 5 (51) or Reactor No. 6 (52), which previously has been charged or is being charged with Ammonium Sulfate/Ammonium Carbonate Solution (49) and is under mixing by the appropriate Mixer (54 or 55). When charging is complete the reaction continues for the appropriate time to the desired partial completion and mixing continues while the reaction is proceeding for the required time. Ammonia (58) is added to Reactor No. 1 (36), Reactor No. 2 (40), Reactor No. 5 (51) and Reactor No. 6 (52) as needed to prevent foaming by controlling the pH to be between 6.8 and 9.4 and preferably between 7.6 and 9.0.

When the reaction reaches the desired completion for this stage and either Reactor No. 1 (36) or Reactor No. 2 (40) is empty, the slurry formed in Reactor No. 5 (51) or Reactor No. 6 (52) can be fed to Filter 4 (53) to form the Ammonium Sulfate/Ammonium Carbonate Solution (57) to be sent to the empty reactor. The Calcium Carbonate and Gypsum Cake (56) which is discharged from Filter 4 (53) is fed to either Reactor No. 3 (41) or Reactor No. 4 (45) which previously has been charged or is being charged with Ammonium Carbonate Solution (50) and is under mixing by the appropriate Mixer (42) or (44). When charging is complete the reaction continues for the appropriate time to complete the reactions and Ammonia (58) is added to the Reactors No. 1 (36), No. 2 (40), No. 5 (51), No. 6 (52), No. 3 (41), and/or No. 4 (45) as needed to prevent foaming by controlling pH to be between 6.8 and 9.4 and preferably between pH 7.6 and 9.0. It may be necessary to neutralize the ammonia by adding an acid, such as sulfuric acid.

When the reaction is complete and either Reactor No. 5 (51) or Reactor No. 6 (52) is empty, the slurry formed in Reactor No. 3 (41) or Reactor No. 4 (45) can be fed to Filter 3 (43) Zone A to form the Ammonium Sulfate/Ammonium Carbonate Solution (49) to be sent to the empty Reactor No. 5 (51) or Reactor No. 6 (52).

Should the process be such that the number of intermediate pairs of parallel reactors (such as Reactors No. 5 (51) and No. 6 (52)) be greater than when "n" equals one, then their operation will entail that the filter, such as Filter 4 (53), feeds the solid calcium carbonate and gypsum cake forward to the next pair of reactors, to further react the cake towards formation of calcium carbonate. The Ammonium Sulfate/Ammonium Carbonate Solution will feed in the opposite direction to the next pair of reactors toward formation of ammonium sulfate.

The filter cake has a Water Wash (46) to remove any solution of Ammonium Sulfate/Ammonium Carbonate Solution left in the filter cake so the solutions washed from the cake can be recycled to the process by using the solution to furnish Wash Water Solution To the Ammonium Carbonate Absorber Tower (48). However, the Water Wash (46) may be bypassed in favor of no water wash or the use of a wash with ammonium sulfate to stabilize vaterite formed in the process for long term storage.

For a smooth running process the filters are filled with cake, preferably to capacity. Gypsum Filter Cake (34) from Filter 1 (32) feeds either Reactor No. 1 (36) or Reactor No. 2 (40) as does the Ammonium Sulfate/Ammonium Carbonate Solution (57) which is fed to the same reactor. The filter cake from Filter 2 (37) feeds Reactor No. 5 (51) or Reactor No. 6 (52), with fresh Ammonium Sulfate/Ammonium Carbonate Solution (49) feeding the same reactor. The filter cake from Filter No. 4 (53) feeds Reactor No. 3 (41) or Reactor No. 4 (45) with fresh Ammonium Carbonate Solution (50) feeding the same reactor. Filter No. 3 (43) discharges Calcium Carbonate Product Cake (47). Additional process control is provided by having a liquid receiver to hold portions of the Ammonium Sulfate/Ammonium Carbonate Solution as is shown in FIG. 1 and labeled as Receiver (16).

Embodiment Number 4

Three Stage, Three Reactor Gypsum Conversion Partially Continuous Countercurrent Process A three reactor, three stage, countercurrent process is an embodiment of the present invention. A schematic of the process is shown in FIG. 16. With reference to FIG. 16, an ammonium carbonate solution (such as that, for example, prepared from ammonia and the carbon dioxide in electric power plant flue gas) enters the process at Reactor No. 3 (22) and the unreacted gypsum enters the process at Reactor No. 1 (8). This introduction of reactants ensures that previously, partially reacted gypsum is exposed to the greatest strength ammonium carbonate solution (as prepared, for example, by absorption tower from the $CO_2$ of the flue gas) in the Reactor No. 3 (22) resulting in excess ammonium carbonate which enables 100% conversion to calcium carbonate. Further, in Reactor No. 1, the partially reacted solution of ammonium carbonate is reacted with full strength gypsum resulting in 100% conversion of the ammonium carbonate to ammonium sulfate. Based upon laboratory procedures as described, for instance, in the below disclosed Examples, FIG. 16 depicts a three stage partially continuous countercurrent process of the present invention, employing three reactors as simulated by bench scale laboratory tests.

With reference to FIG. 16, Gypsum Slurry (2) is a slurry of gypsum previously treated with sulfuric acid which is poured over Filter A (5) resulting in a residual cake. The Gypsum Cake (6) is then rinsed with Wash Water (3) to remove contaminants and the sulfuric acid. The Gypsum Cake (6) is fed to Reactor No. 1 (8) where it is mixed with Ammonium Sulfate/Ammonium Carbonate Solution (18) from Filter No. 2 (15) and its Receiver (16). A Mixer (7) is used to agitate the contents of the Reactor No. 1 (8). The temperature in Reactor No. 1 (8) is maintained between 41° F. to 176° F., preferably 60° F. to 120° F., more preferably 70° F. to 110° F. and most preferably 80° F. to 100° F. The Ammonium Carbonate reacts quickly in Reactor No. 1 (8) since there is a stoichiometric excess quantity of gypsum present. Ammonia (21) in the form of ammonium hydroxide solution or ammonia gas or liquid is added as needed to prevent foaming within Reactor No 1 (8). After a retention time of 4 to 60 minutes and preferably about 10 minutes, effluent from Reactor No. 1 (8) is discharged to Filter No. 1 (9). The filtrate is Ammonium Sulfate Solution Product (19). However, to neutralize the ammonia, it may be necessary to add an acid, such as sulfuric acid. The combination Calcium Carbonate and Gypsum Cake (10) which is formed in Filter No. 1 (9) is fed to Reactor No. 2 (11) where it is mixed with Ammonium Sulfate/Ammonium Carbonate Solution (27) from Filter No. 3 (25) and its Receiver (26). Ammonia (21) is added to Reactor No. 1 (8), Reactor No. 2 (11), and Reactor No. 3 (51) as needed to prevent foaming by controlling the pH to be between 6.8 and 9.4 and preferably between 7.6 and 9.0. A Mixer (20) is used to agitate the contents of the Reactor No. 2 (11). The temperature in Reactor No. 2 (11) is maintained between 41° F. to 176° F., preferably 60° F. to 120° F., more preferably 70° F. to 110° F. and most preferably 80° F. to 100° F. Ammonia (21) in the form of ammonium hydroxide solution or ammonia gas or liquid is added as needed to prevent foaming within Reactor No 2 (11). After a retention time of 4 to 60 minutes and preferably about 10 minutes, effluent from Reactor No. 2 (11) is discharged to Filter No. 2 (15) and its Receiver (16). The combination Calcium Carbonate and Gypsum Cake (24) which is formed in Filter No. 2 (15) is fed to Reactor No. 3 (22). Ammonium Carbonate Solution (12), ranging from 25 to 35% and preferably 33% at a temperature ranging from 120° F. to 60° F. and preferably from 110° F. to 70° F., but most preferably from 100° F. to 80° F., is metered to Reactor No. 3 (22) and is agitated by a Mixer (23). The temperature in Reactor No. 3 (22) is maintained between 41° F. to 176° F., preferably 60° F. to 120° F., more preferably 70° F. to 110° F. and most preferably 80° F. to 100° F. The gypsum reacts quickly in Reactor No. 3 (22) since there is a stoichiometric excess of ammonium carbonate present. Ammonia (21) in the form of ammonium hydroxide solution or ammonia gas or liquid is added to prevent foaming within the Reactors. After a retention time of 4 to 60 minutes and preferably about 10 minutes, effluent from Reactor No. 3 (22) is sent to Filter No. 3 (25) to result in a Calcium Carbonate Cake. The Calcium Carbonate Cake is then rinsed with Water Wash (13) producing a Calcium Carbonate Product Cake (14). However, the Water Wash (13) may be bypassed in favor of no water wash or the use of a wash with ammonium sulfate to stabilize vaterite formed in the process for long term storage. The Wash Water Solution To Ammonium Carbonate Absorber Tower (17) now contains some ammonium carbonate and ammonium sulfate that is used when making Ammonium Carbonate Solution (12) for use in the process. Note that additional process control is provided by having a liquid receiver hold portions of the Ammonium Sulfate/Ammonium Carbonate Solutions as is shown in FIG. 16 and notated as Receivers (16 & 26).

Embodiment Number 5

Multi-Stage, Multi-Reactor Gypsum Conversion Partially Continuous Countercurrent Process with Ammonium Carbonate-Ammonium Bicarbonate Solution Produced in Reactors All embodiments of the present invention employ the partially continuous countercurrent flow process of the invention whereby gypsum is reacted with ammonium carbonate to produce calcium carbonate and ammonium sulfate. The previously described embodiments of the present invention use the reactant, ammonium carbonate, which has been produced outside of the reactors of the present process. One method of producing ammonium carbonate is to react carbon dioxide with ammonia. If FGD gypsum is being treated as the process starting material then the ammonium carbonate may be conveniently, environmentally and economically produced by reacting electric power plant flue gas (containing carbon dioxide) directly with ammonia or reacting the carbon dioxide removed from flue gas with ammonia.

The present embodiment of the present invention employs the process of the invention wherein ammonium carbonate is produced inside the reactors of the process. Thus, this embodiment encompasses the present multi stage, multi reactor, partially continuous countercurrent flow processes.

A schematic of the present embodiment is shown in FIG. 15, which is a modified version of the two stage, two reactor process of the first embodiment shown in FIG. 1. A two stage, two reactor embodiment was selected to illustrate the present fifth embodiment due to its simplicity. The reference numbers on FIG. 15 are the same as on FIG. 1 except for the modifications needed for the present embodiment of producing ammonium carbonate inside the process reactors. Please refer to the previous description of FIG. 1 for an explanation of each reference number that is common to both FIG. 1 and FIG. 15. Different in FIG. 15, is Ammonia (21) being fed to both Reactor No. 1 (8) and Reactor No. 2 (11). Carbon Dioxide (12) is also fed to both Reactor No. 1 (8) and Reactor No. 2 (11), where ammonia and carbon dioxide react to produce ammonium carbonate, an initial reactant in the present process. The Vent To Scrubber (22) provides for removing excess Ammonia and Carbon Dioxide. The Rinse Water (17) of the process is recycled to Reactor No. 2 (11) and may be supplemented with additional water if needed for adequate reaction.

The operation of this embodiment and testing are described in the below Examples as well as for the aforementioned embodiments of the present invention, which demonstrate that the production of ammonium carbonate was successful and there was 100% conversion of gypsum to calcium carbonate and ammonium sulfate. Direct addition of ammonia and carbon dioxide to the reactors avoids some of the water that dilutes the ammonium sulfate product.

Non-Limiting Summary of Embodiments

1. A partially continuous countercurrent flow process for converting gypsum to ammonium sulfate and calcium carbonate comprising the following steps:

separating an aqueous slurry of gypsum to result in a gypsum liquid residue and a gypsum cake;

feeding a flow of reactants being the gypsum cake and a solution of ammonium sulfate and ammonium carbonate into a first reactor for chemical reaction;

stopping the flow of reactants into the first reactor for a retention time selected to achieve a preselected degree of chemical reaction to form an ammonium sulfate solution containing a first precipitate calcium carbonate and a gypsum remnant;

discharging the ammonium sulfate solution containing a first precipitate calcium carbonate and a gypsum remnant;

resuming the flow of reactants into the first reactor;

separating the first precipitate calcium carbonate and gypsum remnant from the ammonium sulfate solution to result in a product ammonium sulfate solution and a remnant cake of first precipitate calcium carbonate and gypsum;

retaining the product ammonium sulfate solution;

feeding a flow of reactants being the remnant cake of first precipitate calcium carbonate and gypsum and ammonium carbonate solution into a second reactor for chemical reaction;

stopping the flow of reactants into the second reactor for a retention time selected to achieve a predetermined degree of chemical reaction to form a second precipitate calcium carbonate and a solution of ammonium sulfate and ammonium carbonate;

discharging the first and second precipitate calcium carbonate and a solution of ammonium sulfate and ammonium carbonate;

resuming the flow of reactants into the second reactor;

separating the first and second precipitate calcium carbonate from the solution of ammonium sulfate and ammonium carbonate to result in a product calcium carbonate cake and a residue solution of ammonium sulfate and ammonium carbonate;

retaining the product calcium carbonate cake; and adding the residue solution of ammonium sulfate and ammonium carbonate to the first reactor.

2. The process of 1), wherein the step of separating the aqueous slurry of gypsum to result in first and second gypsum liquid residues and a gypsum cake is accomplished by steps comprising:

filtering an aqueous slurry of gypsum on a filter having two zones, zone A and zone B, wherein zone A the gypsum slurry is filtered resulting in a first gypsum liquid residue and a residual gypsum cake; and transporting the residual gypsum cake on the filter to zone B in which the residual gypsum cake is washed with water to result in a second gypsum liquid residue.

3. The process of 1), wherein the step of separating the first and second precipitate calcium carbonate from the solution of ammonium sulfate and ammonium carbonate is accomplished by steps comprising:

filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;

adding the residue solution of ammonium sulfate and ammonium carbonate to one or both of the first and second reactors;

transporting the calcium carbonate cake on the filter to zone B in which the calcium carbonate cake is washed with water to result in a product calcium carbonate cake and a wash water solution of ammonium sulfate and ammonium carbonate;

retaining the product calcium carbonate cake; and feeding the wash water solution of ammonium sulfate and ammonium carbonate to an ammonium carbonate absorber to retain ammonium carbonate.

4. The process of 1) further comprising the following steps:

washing the product calcium carbonate cake with water to result in a wash residue solution of ammonium sulfate and ammonium carbonate; and adding the wash residue solution of ammonium sulfate and ammonium carbonate to the first reactor.

5. The process of 1) further comprising the following steps:

washing the product calcium carbonate cake with water to result in a wash residue solution of ammonium sulfate and ammonium carbonate; and feeding the wash residue solution of ammonium sulfate and ammonium carbonate to an ammonium carbonate absorption column.

6. The process of 1) further comprising the following step:

adding ammonia or ammonium hydroxide to the first reactor and second reactor to reduce foaming.

7. The process of 1), wherein the product ammonium sulfate solution contains ammonium sulfate and the product calcium carbonate cake contains calcium carbonate, with ammonium sulfate in a yield of 97 to 100% and calcium carbonate in a yield of 97 to 100%.

8. The process of 1), wherein the product ammonium sulfate solution contains ammonium sulfate and the product calcium carbonate cake contains calcium carbonate, with both ammonium sulfate in a yield of 100% and calcium carbonate in a yield of 100%.

9. The process of 1), wherein the process has a total retention time of 4 to 60 minutes for 100% yield of product calcium carbonate and product ammonium sulfate.

10. The process of 1), wherein the process is conducted at temperatures of 41 to 176° F.

11. The process of 1), further including mixing within the first reactor and the second reactor by a mixer selected from the group consisting of impeller mixer, paddle mixer, ultrasonic mixer and homogenizer.

12. The process of 1), wherein the separating steps are accomplished by a device selected from the group consisting of belt filter, pan filter, drum filter and centrifuge.

13. The process of 1), wherein contaminants are removed from the gypsum by an acid rinse process comprising the steps of separating the aqueous slurry of gypsum to result in a gypsum liquid residue and a gypsum cake;

rinsing the gypsum cake with an aqueous solution containing sulfuric acid from 0.01 to 10% concentration to result in a purified gypsum cake; and rinsing the purified gypsum cake with water to remove residual sulfuric acid solution to result in a final purified gypsum cake.

14. The process of 13), wherein the gypsum is a phosphogypsum and a contaminant is uranium wherein uranium is removed from the gypsum cake to result in a 40 to 75% reduction of uranium in the gypsum cake.

15. The process of 1), wherein the aqueous slurry of gypsum is directly from a $SO_x$ scrubber.

16. A partially continuous countercurrent flow process for converting gypsum to ammonium sulfate and calcium carbonate comprising the following steps:

separating an aqueous slurry of gypsum to result in a gypsum liquid residue and a gypsum cake;

feeding a flow of reactants being the gypsum cake and a solution of ammonium sulfate and ammonium carbonate, selectively into one or both of a first reactor and a second reactor, for chemical reaction;

stopping the flow of reactants into one or both of the first reactor and second reactor for a first reactor retention time and a second reactor retention time both selected to achieve a predetermined degree of chemical reaction in one or both first reactor and second reactor to form an ammonium sulfate solution containing a first precipitate calcium carbonate and a gypsum remnant in one or both first reactor and second reactor;

discharging the ammonium sulfate solution containing a first precipitate calcium carbonate and a gypsum remnant from one or both first reactor and second reactor;

resuming the flow of reactants into one or both first reactor and second reactor;

separating the first precipitate calcium carbonate and gypsum remnant from the ammonium sulfate solution to result in a product ammonium sulfate solution and a remnant cake of precipitated calcium carbonate and gypsum;

retaining the product ammonium sulfate solution;

feeding a flow of reactants being the remnant cake of first precipitate calcium carbonate and gypsum and ammonium carbonate solution, selectively into one or both of a third reactor and a fourth reactor, for chemical reaction;

stopping the flow of reactants into one or both of the third reactor and fourth reactor for a third reactor retention time and a fourth reactor retention time both selected to achieve a predetermined degree of chemical reaction in one or both third reactor and fourth reactor to form a second precipitate calcium carbonate and a solution of ammonium sulfate and ammonium carbonate;

discharging the first and second precipitate calcium carbonate and a solution of ammonium sulfate and ammonium carbonate from one or both third reactor and fourth reactor;

resuming the flow of reactants into one or both third reactor and fourth reactor;

separating the first and second precipitate calcium carbonate from the solution of ammonium sulfate and ammonium carbonate to result in a product calcium carbonate cake and a residue solution of ammonium sulfate and ammonium carbonate;

retaining the product calcium carbonate cake; and adding the residue solution of ammonium sulfate and ammonium carbonate to one or both first reactor and second reactor.

17. The process of 16), wherein the step of separating the aqueous slurry of gypsum to result in first and second gypsum liquid residues and a gypsum cake is accomplished by steps comprising:

filtering an aqueous slurry of gypsum on a filter having two zones, zone A and zone B, wherein zone A the gypsum slurry is filtered resulting in a first gypsum liquid residue and a residual gypsum cake; and transporting the residual gypsum cake on the filter to zone B in which the residual gypsum cake is washed with water to result in a second gypsum liquid residue.

18. The process of 16), wherein the step of separating the first and second precipitate calcium carbonate from the solution of ammonium sulfate and ammonium carbonate is accomplished by steps comprising:

filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;

adding the residue solution of ammonium sulfate and ammonium carbonate to one or both of the first and second reactors;

transporting the calcium carbonate cake on the filter to zone B in which the calcium carbonate cake is washed with water to result in a product calcium carbonate cake and a wash water solution of ammonium sulfate and ammonium carbonate;

retaining the product calcium carbonate cake; and feeding the wash water solution of ammonium sulfate and ammonium carbonate to an ammonium carbonate absorber to retain ammonium carbonate.

19. A partially continuous countercurrent flow process for converting gypsum to ammonium sulfate and calcium carbonate comprising the following steps:

separating an aqueous slurry of gypsum to result in a gypsum liquid residue and a residual gypsum cake;

feeding a flow of reactants being the residual gypsum cake and a second solution of ammonium sulfate and ammonium carbonate, selectively into one or both of a first reactor and a second reactor, for chemical reaction;

stopping the flow of reactants into one or both of the first reactor and second reactor for a first reactor retention time and a second reactor retention time both selected to achieve a predetermined degree of chemical reaction in one or both first reactor and second reactor to form an ammonium sulfate solution containing a first precipitate calcium carbonate and a gypsum remnant in one or both first reactor and second reactor;

discharging the ammonium sulfate solution containing a first precipitate calcium carbonate and a gypsum remnant from one or both first reactor and second reactor;

resuming the flow of reactants into one or both first reactor and second reactor;

separating the first precipitate calcium carbonate and gypsum remnant from the ammonium sulfate solution to result in a product ammonium sulfate solution and a first precipitate calcium carbonate and gypsum remnant cake;

retaining the product ammonium sulfate solution;

feeding a flow of reactants being the second precipitate calcium carbonate and gypsum remnant cake and an ammonium carbonate solution, selectively into one or both of a third reactor and a fourth reactor for chemical reaction;

stopping the flow of reactants into one or both of the third reactor and fourth reactor for a third reactor retention time and a fourth reactor retention time both selected to achieve a predetermined degree of chemical reaction in one or both third reactor and fourth reactor to form a third precipitate calcium carbonate and a first solution of ammonium sulfate and ammonium carbonate in one or both third reactor and fourth reactor;

discharging the third precipitate calcium carbonate and a first solution of ammonium sulfate and ammonium carbonate from one or both third reactor and fourth reactor;

resuming the flow of reactants into one or both third reactor and fourth reactor;

separating the first, second, and third precipitate calcium carbonate from the first solution of ammonium sulfate and ammonium carbonate to result in a product calcium carbonate cake and a first residue solution of ammonium sulfate and ammonium carbonate;

retaining the product calcium carbonate cake;

feeding a flow of reactants being the first residue solution of ammonium sulfate and ammonium carbonate and first precipitate calcium carbonate and gypsum remnant cake, selectively into one or both of a fifth reactor and a sixth reactor, for chemical reaction;

stopping the flow of reactants into one or both of the fifth reactor and sixth reactor for a fifth reactor retention time and a sixth reactor retention time both selected to achieve a predetermined degree of chemical reaction in one or both fifth reactor and sixth reactor to form a second solution of ammonium sulfate and ammonium carbonate and second precipitate calcium carbonate and gypsum remnant in one of both fifth reactor and sixth reactor;

discharging the first and second solution of ammonium sulfate and ammonium carbonate and second precipitate calcium carbonate and gypsum remnant from one or both fifth reactor and sixth reactor;

resuming the flow of reactants into one or both fifth reactor and sixth reactor;

separating the second precipitate calcium carbonate and gypsum remnant from the second solution of ammonium sulfate and ammonium carbonate to result in the second residue solution of ammonium sulfate and ammonium carbonate and the second precipitate calcium carbonate and gypsum remnant cake;

feeding the second residue solution of ammonium sulfate and ammonium carbonate to the first reactor and second reactor; and feeding the second precipitate calcium carbonate and gypsum remnant cake to the third reactor and fourth reactor.

20. The process of 19), wherein the step of separating the aqueous slurry of gypsum to result in first and second gypsum liquid residues and a gypsum cake is accomplished by steps comprising:
   filtering an aqueous slurry of gypsum on a filter having two zones, zone A and zone B, wherein zone A the gypsum slurry is filtered resulting in a first gypsum liquid residue and a residual gypsum cake; and
   transporting the residual gypsum cake on the filter to zone B in which the residual gypsum cake is washed with water to result in a second gypsum liquid residue.

21. The process of 19), wherein the step of separating the first, second, third, fourth, fifth and sixth precipitate calcium carbonate from the first solution of ammonium sulfate and ammonium carbonate is accomplished by steps comprising:
   filtering the first, second, third, fourth, fifth and sixth precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;
   adding the residue solution of ammonium sulfate and ammonium carbonate to any one or all of the first, second, third, fourth, fifth and sixth reactors;
   transporting the calcium carbonate cake on the filter to zone B in which the calcium carbonate cake is washed with water to result in a product calcium carbonate cake and a wash water solution of ammonium sulfate and ammonium carbonate;
   retaining the product calcium carbonate cake; and
   feeding the wash water solution of ammonium sulfate and ammonium carbonate to an ammonium carbonate absorber to retain ammonium carbonate.

22. A partially continuous countercurrent flow process for converting gypsum to ammonium sulfate and calcium carbonate comprising the following steps:
   separating an aqueous slurry of gypsum to result in a gypsum liquid residue and a residual gypsum cake;
   feeding a flow of reactants being the residual gypsum cake and a second solution of ammonium sulfate and ammonium carbonate, into a first reactor, for chemical reaction;
   stopping the flow of reactants into the first reactor for a first reactor retention time selected to achieve a predetermined degree of chemical reaction in the first reactor to form an ammonium sulfate solution containing a first precipitate calcium carbonate and a gypsum remnant in the first reactor;
   discharging the ammonium sulfate solution containing a first precipitate calcium carbonate and a gypsum remnant from the first reactor;
   resuming the flow of reactants into the first reactor;
   separating the first precipitate calcium carbonate and gypsum remnant from the ammonium sulfate solution to result in a product ammonium sulfate solution and a first precipitate calcium carbonate and gypsum remnant cake;
   retaining the product ammonium sulfate solution;
   feeding a flow of reactants being the second precipitate calcium carbonate and gypsum remnant cake and an ammonium carbonate solution, selectively into a third reactor for chemical reaction;
   stopping the flow of reactants into the third reactor for a third reactor retention time selected to achieve a predetermined degree of chemical reaction in the third reactor to form a third precipitate calcium carbonate and a first solution of ammonium sulfate and ammonium carbonate in the third reactor;
   discharging the third precipitate calcium carbonate and a first solution of ammonium sulfate and ammonium carbonate from the third reactor;
   resuming the flow of reactants into the third reactor;
   separating the first, second, and third precipitate calcium carbonate from the first solution of ammonium sulfate and ammonium carbonate to result in a product calcium carbonate cake and a first residue solution of ammonium sulfate and ammonium carbonate;
   retaining the product calcium carbonate cake;
   feeding a flow of reactants being the first residue solution of ammonium sulfate and ammonium carbonate and first precipitate calcium carbonate and gypsum remnant cake, into a second reactor, for chemical reaction;
   stopping the flow of reactants into the second reactor for a second reactor retention time selected to achieve a predetermined degree of chemical reaction in the second reactor to form a second solution of ammonium sulfate and ammonium carbonate and second precipitate calcium carbonate and gypsum remnant in the second reactor;
   discharging the first and second solution of ammonium sulfate and ammonium carbonate and second precipitate calcium carbonate and gypsum remnant from the second reactor;
   resuming the flow of reactants into the second reactor;
   separating the second precipitate calcium carbonate and gypsum remnant from the second solution of ammonium sulfate and ammonium carbonate to result in the second residue solution of ammonium sulfate and ammonium carbonate and the second precipitate calcium carbonate and gypsum remnant cake;
   feeding the second residue solution of ammonium sulfate and ammonium carbonate to the first reactor; and
   feeding the second precipitate calcium carbonate and gypsum remnant cake to the third reactor.

23. The process of 22), wherein the step of separating the aqueous slurry of gypsum to result in first and second gypsum liquid residues and a gypsum cake is accomplished by steps comprising:
   filtering an aqueous slurry of gypsum on a filter having two zones, zone A and zone B, wherein zone A the gypsum slurry is filtered resulting in a first gypsum liquid residue and a residual gypsum cake; and
   transporting the residual gypsum cake on the filter to zone B in which the residual gypsum cake is washed with water to result in a second gypsum liquid residue.

24. The process of 22), wherein the step of separating the second precipitate calcium carbonate and gypsum remnant from the second solution of ammonium sulfate and ammonium carbonate is accomplished by steps comprising:
   filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;

adding the residue solution of ammonium sulfate and ammonium carbonate to any one or all of the first, second, and third reactors;

transporting the calcium carbonate cake on the filter to zone B in which the calcium carbonate cake is washed with water to result in a product calcium carbonate cake and a wash water solution of ammonium sulfate and ammonium carbonate;

retaining the product calcium carbonate cake; and feeding the wash water solution of ammonium sulfate and ammonium carbonate to an ammonium carbonate absorber to retain ammonium carbonate.

25. A partially continuous countercurrent flow process for converting gypsum to ammonium sulfate and calcium carbonate comprising the following steps:

separating an aqueous slurry of gypsum to result in a gypsum liquid residue and a gypsum cake;

feeding a flow of reactants being ammonia, carbon dioxide, the gypsum cake, and a solution of ammonium sulfate and ammonium carbonate into a first reactor for chemical reaction;

stopping the flow of reactants into the first reactor for a retention time selected to achieve a predetermined degree of chemical reaction to form an ammonium sulfate solution containing a first precipitate calcium carbonate and a gypsum remnant;

discharging the ammonium sulfate solution containing a first precipitate calcium carbonate and a gypsum remnant;

resuming the flow of reactants into the first reactor;

separating the first precipitate calcium carbonate and gypsum remnant from the ammonium sulfate solution to result in a product ammonium sulfate solution and a remnant cake of first precipitate calcium carbonate and gypsum;

retaining the product ammonium sulfate solution;

feeding a flow of reactants being ammonia, carbon dioxide, the remnant cake of first precipitate calcium carbonate and gypsum and ammonium carbonate solution into a second reactor for chemical reaction;

stopping the flow of reactants into the second reactor for a retention time selected to achieve a predetermined degree of chemical reaction to form a second precipitate calcium carbonate and a solution of ammonium sulfate and ammonium carbonate;

discharging the first and second precipitate calcium carbonate and a solution of ammonium sulfate and ammonium carbonate;

resuming the flow of reactants into the second reactor;

venting excess carbon dioxide and ammonia from the first reactor and the second reactor;

separating the first and second precipitate calcium carbonate from the solution of ammonium sulfate and ammonium carbonate to result in a product calcium carbonate cake and a residue solution of ammonium sulfate and ammonium carbonate;

retaining the product calcium carbonate cake; and adding the residue solution of ammonium sulfate and ammonium carbonate to the first reactor.

26. The process of 25), wherein the step of separating the aqueous slurry of gypsum to result in first and second gypsum liquid residues and a gypsum cake is accomplished by steps comprising:

filtering an aqueous slurry of gypsum on a filter having two zones, zone A and zone B, wherein zone A the gypsum slurry is filtered resulting in a first gypsum liquid residue and a residual gypsum cake; and transporting the residual gypsum cake on the filter to zone B in which the residual gypsum cake is washed with water to result in a second gypsum liquid residue.

27. The process of 25), wherein the step of separating the first and second precipitate calcium carbonate from the solution of ammonium sulfate and ammonium carbonate is accomplished by steps comprising:

filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;

adding the residue solution of ammonium sulfate and ammonium carbonate to one or both of the first and second reactors;

transporting the calcium carbonate cake on the filter to zone B in which the calcium carbonate cake is washed with water to result in a product calcium carbonate cake and a wash water solution of ammonium sulfate and ammonium carbonate;

retaining the product calcium carbonate cake; and feeding the wash water solution of ammonium sulfate and ammonium carbonate to an ammonium carbonate absorber to retain ammonium carbonate.

28. A partially continuous countercurrent flow process for converting gypsum to ammonium sulfate and calcium carbonate comprising the following steps:

separating an aqueous slurry of gypsum to result in a gypsum liquid residue and a gypsum cake;

feeding a flow of reactants being the gypsum cake and a solution of ammonium sulfate and ammonium carbonate, selectively into one or all reactors of a plurality of reactors, for chemical reaction;

stopping the flow of reactants into one or all reactors of the plurality of reactors for a reactor retention time selected for any one or all reactors of the plurality of reactors, wherein the retention time for a particular one reactor is selected to achieve a predetermined degree of chemical reaction in the particular one reactor to form an ammonium sulfate solution containing a first precipitate calcium carbonate and a gypsum remnant in one or all reactors of the plurality of reactors;

discharging the ammonium sulfate solution containing a first precipitate calcium carbonate and a gypsum remnant from one or all reactors of the plurality of reactors;

resuming the flow of reactants into one or all reactors of the plurality of reactors;

separating the first precipitate calcium carbonate and gypsum remnant from the ammonium sulfate solution to result in a product ammonium sulfate solution and a remnant cake of precipitated calcium carbonate and gypsum;

retaining the product ammonium sulfate solution;

feeding a flow of reactants being the remnant cake of first precipitate calcium carbonate and gypsum and ammonium carbonate solution, selectively into one or all reactors of the plurality of reactors, for chemical reaction;

stopping the flow of reactants into one or all reactors of the plurality of reactors for a reactor retention time selected for any one or all reactors of the plurality of reactors, wherein the retention time for a particular one reactor is selected to achieve a predetermined degree of chemical reaction in the particular one reactor to form a second precipitate calcium carbonate and a solution of ammonium sulfate and ammonium carbonate;

discharging the first and second precipitate calcium carbonate and a solution of ammonium sulfate and ammonium carbonate from one or all reactors of the plurality of reactors;

resuming the flow of reactants into one or all reactors of the plurality of reactors;

separating the first and second precipitate calcium carbonate from the solution of ammonium sulfate and ammonium carbonate to result in a product calcium carbonate cake and a residue solution of ammonium sulfate and ammonium carbonate;

retaining the product calcium carbonate cake; and adding the residue solution of ammonium sulfate and ammonium carbonate to one or all reactors of the plurality of reactors.

The present invention is demonstrated with reference to the following examples, which are of an illustrative nature only and which are to be construed as non-limiting.

EXAMPLES

Example 1

The two reactor embodiment of the present multistage, partially continuous countercurrent process was tested by performing laboratory tests and tests in a pilot plant to simulate the process of the present invention as illustrated in FIG. 1. The laboratory procedures and equipment are described below.

Laboratory Gypsum Conversion Partially Continuous Countercurrent Process Equipment and Procedure Equipment:
2 liter beakers
2 liter Erlenmeyer flask
5¼" ID Buchner funnel
Busch laboratory vacuum pump
41 cfm, polyester filter cloth (same as reactor filters used in Pilot Plant tests described below)
Laboratory hot/stir plate Procedure:
1. A 1% or 5% (usually 1%) by volume sulfuric acid solution in water was prepared in a beaker.
2. The gypsum to be tested was weighed out to make a slurry containing about 30% solids.
3. The slurry was mixed on a stir plate with a magnetic stir bar for a minimum of 20 minutes.
4. The slurry was filtered by adding it to a Buchner funnel holding the filter cloth and a vacuum was pulled through by the vacuum pump. All filtrate was captured in the Erlenmeyer flask. The resulting cake was washed with 300 mL of Grade I water.
5. The washed gypsum was added to the beaker serving as Reactor 1. Either fresh 33% ammonium carbonate solution and 36% ammonium sulfate solution or filtrate recycled from the previous test's Reactor 2 filtration was added containing 50% stoichiometric requirements of ammonium carbonate and ammonium sulfate. The fresh solutions were made from adding reagent grade ammonium carbonate and feed grade ammonium sulfate to Grade I water.
6. The slurry was mixed on a stir plate for 10 or 20 minutes (usually 10 minutes). Any foaming was dissipated by spraying aqua ammonia into the reactor.
7. The slurry was filtered. The filtrate was the ammonium sulfate product solution.
8. The residual cake from the Reactor 1 filtration was added to the beaker serving as Reactor 2. Fresh 33% ammonium carbonate solution containing 100% stoichiometric requirement of ammonium carbonate was added to the cake.
9. The resulting slurry was mixed on a stir plate for 10 or 20 minutes (usually 10 minutes). Any foaming was dissipated by spraying aqua ammonia into the reactor.
10. The slurry was filtered and the resulting cake was washed with 300 mL of Grade I water. The Reactor 2 filtrate was kept for possible recycling to Reactor 1 in the next test.
11. The resulting cake was dried overnight in an oven at 60° C. to drive off any free moisture and was then analyzed by LECO® quantitative instruments (nitrogen analyzer was a LECO Model FP-528; carbon/sulfur analyzer was a LECO Model SC-144DR) for percent carbon, percent sulfur, and percent nitrogen content. A quick carbon, sulfur, and nitrogen analytical result can be obtained by drying a sample in the moisture balance before analysis is performed using the LECO® instruments.

Example 2

Lab Tests Showing Effect of Process Washing on Control of Product Crystal Size and Morphology Lab Scale Test Using Anhydrous Ammonia and Delayed Water Wash of Product This test was performed in the two stage, two reactor embodiment of the invention, such as shown in FIG. 1, to achieve approximately 50% conversion of gypsum (in this case, FGD gypsum) to calcium carbonate in each reactor while producing a substantially pure, calcium carbonate product. The test employed ammonium carbonate solution that had been stored, and over time had developed a high concentration of ammonium bicarbonate. To change the ammonium bicarbonate back to ammonium carbonate, anhydrous ammonia was sparged into each reactor. This adjustment was needed to prevent carbon dioxide gas formation.

The FGD gypsum (175 g) was washed with 1% by volume (including the water in the gypsum) sulfuric acid for twenty minutes and then filtered and washed with water. This gypsum was fed to Reactor No. 1 where it was mixed with a solution containing 186.7 g of 36% ammonium sulfate solution and 267.86 g of ammonium carbonate/bicarbonate solution. The ammonium carbonate/bicarbonate solution was made weeks earlier and analyzed at the time of this test as 2.7% C and 6.2% N. It is assumed that during the storage time, large amounts of bicarbonate formed as ammonia volatilized. To obtain 50% conversion in the Reactor No. 1, anhydrous ammonia was added at a rate of 1.9 cfm for 11 seconds to convert ammonium bicarbonate to ammonium carbonate in Reactor No. 1 while the solution and gypsum were mixing. The reactants were mixed for twenty minutes and the resulting slurry was filtered. The product as a filter cake was added to Reactor No. 2 with 535.71 g of ammonium carbonate/bicarbonate solution, the amount needed to ensure full conversion to product calcium carbonate. Anhydrous ammonia was added to the mixture after the start of mixing at a rate of 1.9 cfm for 22 seconds, and the mixing was performed for twenty minutes. After the final product was filtered and dried overnight at 100 degrees C., it was found to be 11.324% Carbon. Four days later, the product was washed and dried overnight again and analyzed, giving 11.636% C.

Reacting the product with hydrochloric acid showed that the calcium carbonate product contained 1.05% unreactive material which by x-ray diffraction showed chlorite, kaolinite, k-feldspar, mica, plagioclase, pyrite, quartz, and amorphous material of mostly barium sulfate. X-ray diffraction also showed that the calcium carbonate crystalline forms present in the product were calcite and vaterite, the latter being a metastable form of calcium carbonate. Analysis by polarized light microscopy after storage of the sample for 31 weeks showed the bulk of the sample to be vaterite with a crystal size of up to 1×1×4 microns and a minor portion of the sample to be calcite with a crystal size of up to 3×3×7 microns.

Lab Scale Test Using Anhydrous Ammonia Without Water Wash of Final Product

To test the effects of no water wash step in the present two stage, two reactor process on the particle size and formation of the calcium carbonate product, 175 g of FGD gypsum was washed with 1% sulfuric acid solution by mixing for twenty minutes. The mixture was filtered, washed with water, and filtered again. The FGD gypsum cake was then mixed in Reactor No. 1 with 186.7 g of 36% ammonium sulfate solution and 267.86 g of 33% ammonium carbonate solution. After the initial mixing started, anhydrous ammonia was sparged in at a rate of 1.9 cfm for 11 seconds, and the mixing continued for a total of twenty minutes. The product calcium carbonate was filtered without additional water wash and the filter cake was added to Reactor No. 2 with 535.71 g of ammonium carbonate solution while stirring. Ammonia was added with a sparger at a rate of 1.9 cfm for thirty seconds. The reactants were mixed for twenty minutes, and then filtered and dried overnight at 130 degrees Fahrenheit without any water wash prior to drying.

Polarized light microscopy of the final calcium carbonate product showed approximately 75 to 95% vaterite and 5 to 25% calcite present with no unreacted gypsum. The crystals sizes of the product were up to 3 microns with the vaterite forming porous agglomerates up to 50 microns across. The calcite comprised single prismatic crystals, 2-3 microns in size, the size being controlled by the reaction times and the reaction percentages in each reactor.

Lab Scale Test Using Anhydrous Ammonia With Immediate Water Wash of Final Product To show the effects of employing a water washing step in the present two stage, two reactor process, the final calcium carbonate product, 175 g of FGD gypsum was washed with 1% sulfuric acid solution by mixing for twenty minutes. The mixture was filtered, washed with water, and filtered again. The FGD gypsum cake was then mixed in Reactor No. 1 with 186.7 g of 36% ammonium sulfate solution and 267.86 g of 33% ammonium carbonate solution. After the initial mixing started, anhydrous ammonia was sparged in at a rate of 1.9 cfm for 11 seconds, and the mixing continued for a total of twenty minutes. The product was filtered and washed with 500 mL of water and filtered again. The filter cake was added to Reactor No. 2 with 535.71 g of ammonium carbonate solution while stirring. Ammonia was added with a sparger at a rate of 1.9 cfm for thirty seconds. The reactants mixed for twenty minutes. The product calcium carbonate was filtered, washed with 500 mL of water, filtered again and dried overnight at 130 degrees Fahrenheit.

Polarized light microscopy of the final calcium carbonate product showed approximately 75 to 95% vaterite and 5 to 25% calcite present with no unreacted gypsum. The crystals sizes of the product were up to 3 microns with the vaterite forming porous agglomerates up to 50 microns across. The calcite was single prismatic crystals 2 microns in size, the size being controlled by the reaction times and the proportion of reactants in each reactor.

The above three tests demonstrate that:
1. The use of ammonium bicarbonate with ammonia addition during the reaction can substitute for the use of ammonium carbonate.
2. Adjustment of process parameters controls product particle (crystal) size distribution and specific particle size.
3. Adjustment of process parameters controls production of specific types of calcium carbonate polymorphs including calcite, vaterite and aragonite.
4. The ammonium sulfate (and in particular the sulfate anion) is capable of keeping the vaterite polymorph of product calcium carbonate to be stable during the process. Thus, the process of the present invention optionally includes the direct use of ammonium sulfate or recycle of ammonium sulfate to keep the product vaterite from changing to another calcium carbonate polymorph such as aragonite or calcite. This polymorph stabilization subprocess may be integrated into the processes of the present invention as shown in FIGS. 1, 2, 8A-B, and 9A-C.

Example 3

Pilot Plant Gypsum Conversion Partially Continuous Countercurrent Process Equipment and Procedure This pilot plant was a two stage, two reactor system, such as in embodiment number 1 and shown in FIG. 1.

Equipment:
Ammonium Carbonate Column—30" diameter stainless steel column with pall ring packing and mist eliminator pad, 80 gallon bottom tank
Ammonium Carbonate Column Pump—Durco 5 HP centrifugal pump
Ammonium Carbonate Solution Tank—3.5' diameter× 4.67' tall with dished bottom, approximately 350 gallons, stainless steel with steam coil
Ammonium Carbonate Solution Tank Agitator—1 HP, stainless steel
Ammonium Carbonate Solution Pump—½" air diaphragm pump
Gypsum Acid Wash Tank—275 gallon polypropylene tote, 48"×40"×46"
Gypsum Acid Wash Tank Agitator—½ HP, stainless steel
Sulfuric Acid Tank—55 gallon polypropylene drum
Sulfuric Acid Pump—120 volt drum pump
Gypsum Acid Wash Pump—1½"×½", 0.5 HP, Seepex progressive cavity pump
Gypsum Acid Wash Belt Filter—National Filter Media unit with a 19"×36" filter section (4.75 ft$^2$), a 19"×48" wash section (6.33 ft$^2$), 80 cfm polypropylene filter cloth, variable speed drive, two vacuum pumps and receivers, two centrifugal filtrate transfer pumps
Acid Solution Tank—275 gallon polypropylene tote, 48"× 40"×46"
Reactor 1—2' diameter×2.5' tall with cone bottom, approximately 35 gallons, stainless steel with steam coil
Reactor 1 Agitator—1 HP, stainless steel Reactor 1 Pump—1½"×1¾", 0.75 HP, Seepex progressive cavity pump Reactor 1 Belt Filter—9½"×42" (2.77 ft$^2$) filter area, 41 cfm polyester filter cloth, one vacuum pump and receiver, ½" air diaphragm filtrate transfer pump Ammonium Sulfate Solution Tank—275 gallon polypropylene tote, 48"×40"×46"

Ammonium Sulfate Solution Tank Agitator—½" HP, stainless steel

Reactor 2—2' diameter×2.5' tall with cone bottom, approximately 35 gallons, stainless steel with steam coil Reactor 2 Agitator—1 HP, stainless steel Reactor 2 Pump—1½"×1¼", 0.75 HP, Seepex progressive cavity pump Reactor 2 Belt Filter—Eimco unit with a 6"×24" filter section (1 ft$^2$), a 6"×18" wash section (0.75 ft$^2$), 41 cm polyester filter cloth, one vacuum pump with two receivers, two ½" air diaphragm filtrate transfer pumps Water Wash Tank—275 gallon polypropylene tote, 48"×40"×46"

Ammonium Carbonate Wash Pump—1"×½", 120 volt Seepex progressive cavity pump

Aqua Ammonia Tank—55 gallon polypropylene drum

Aqua Ammonia Pump—½" air diaphragm pump

Ammonia Scrubber—Stainless steel with tower pre-scrubber and candle wicking sections, includes centrifugal recirculation pump and centrifugal exhaust blower Procedure:

1. With reference to the above Equipment list, the Ammonium Carbonate Column was charged with 29% aqua ammonia and the appropriate amount of wash water from the Reactor 2 Belt Filter was added in order to make approximately 33% ammonium carbonate solution by weight. Carbon dioxide from Dewar cylinders (containers) was sparged in until the proper pH and specific gravity was reached and analysis by LECO® instrumentation showed approximately 33% ammonium carbonate solution was achieved.

2. The solution was pumped by the Ammonium Carbonate Column Pump to the Ammonium Carbonate Solution Tank for storage. The solution was mixed by the Ammonium Carbonate Solution Tank Agitator and recirculated by The Ammonium Carbonate Solution Pump until the solution was pumped to and used in the conversion process.

3. The Gypsum Acid Wash Tank was charged with tap water and 93% sulfuric acid was pumped from the Sulfuric Acid Tank by the Sulfuric Acid Pump to make a 1% or 5% sulfuric acid solution by volume.

4. FGD gypsum was hand fed into the Gypsum Acid Wash Tank until the slurry contained about 30% gypsum. The gypsum was allowed to mix with the acid solution for a minimum of 20 minutes. Foaming can occur during mixing but is dissipated through the use of an organic defoamer. After mixing, the slurry was metered by the Gypsum Acid Wash Pump and load cells on the tank to the Gypsum Acid Wash Belt Filter. The slurry was filtered and then washed with tap water by using an overflow weir to remove metal impurities and the sulfuric acid. The filtrate was pumped to the Acid Solution Tank for storage.

5. Reactor 1 was charged with stoichiometric amounts of ammonium carbonate and ammonium sulfate to achieve the desired amount of conversion in Reactor 1 (usually 50%). In some tests, fresh ammonium carbonate solution was used from the Ammonium Carbonate Solution Tank and 36% ammonium sulfate solution was used which was made by dissolving feed grade ammonium sulfate in water. In other tests, the filtrate from the Reactor 2 Belt Filter's filtration zone, containing ammonium carbonate and ammonium sulfate, was recycled to Reactor 1. This solution mixture is present in Reactor 1 before gypsum is added.

6. The filtered, washed gypsum was charged to Reactor 1 and mixed with the solution by the Reactor 1 Agitator for 10 or 20 minutes (usually 10 minutes). The slurry was also recirculated by the Reactor 1 Pump during the mixing. Any foaming was dissipated by spraying aqua ammonia from the Aqua Ammonia Tank into the reactor using the Aqua Ammonia Pump and a wide angle spray nozzle mounted over the reactor. An excess of gypsum was present in Reactor 1 leading to complete conversion of the solution to Ammonium Sulfate.

7. The slurry was pumped by the Reactor 1 Pump to the Reactor 1 Belt Filter. The partially converted cake was vacuum filtered to remove pure ammonium sulfate solution as the filtrate. This solution was pumped by the filtrate pump to the Ammonium Sulfate Tank for storage.

8. Reactor 2 was charged with 100% stoichiometric requirements of ammonium carbonate from the Ammonium Carbonate Solution Tank using the Ammonium Carbonate Solution Pump. This solution was present in Reactor 2 before the partially converted cake was introduced.

9. The filtered, partially converted cake of gypsum and calcium carbonate was charged to Reactor 2 and mixed by the Reactor 2 Agitator for 10 or 20 minutes (usually 10 minutes). The slurry was also recirculated by the Reactor 2 Pump during the mixing. Any foaming was dissipated by spraying aqua ammonia from the Aqua Ammonia Tank into the reactor using the Aqua Ammonia Pump and a wide angle spray nozzle mounted over the reactor. The excess ammonium carbonate present in Reactor 2 led to complete conversion of the cake to calcium carbonate.

10. The slurry was pumped by the Reactor 2 Pump to the Reactor 2 Belt Filter. The slurry was filtered and then washed using tap water by employing an overflow weir to remove any remaining ammonium carbonate and ammonium sulfate. Filtrate from the filtration zone was captured in a receiver for recycle back to Reactor 1. The wash water from the wash zone was captured in a separate receiver and pumped to the Water Wash Tank so that it could later be recycled and used to make ammonium carbonate solution in the Ammonium Carbonate Column. Filtered, cleaned calcium carbonate cake was discharged off of the belt filter into a super sack for storage.

11. The ammonia scrubber was used to pull vents on the Ammonium Carbonate Column and various process points to remove ammonia vapor and wash it out of the air through contact with water in the pre-scrubber and candle wicking sections. The cleaned air was exhausted outside of the pilot plant area.

12. Process samples were taken of the ammonium sulfate solution, Reactor 1 Belt Filter cake, and Reactor 2 Belt Filter cake to test and analyze by LECO® instruments for purity of the products and conversion levels in each reactor.

Example 4

Pilot Plant Tests For Two Stage, Two Reactor Partially Continuous Countercurrent Process This pilot plant was a two stage, two reactor system, such as in embodiment number 1 and shown in FIG. 1.

Pilot Plant Test on Apr. 24, 2014—50% Conversion in Reactor 1

Test objective: to produce 100% pure calcium carbonate (and thus stoichiometrically, 100% pure ammonium sulfate) with 50% conversion in each reactor.

1) Mixed 1,000 pounds of water, 23 pounds of 93.2% sulfuric acid, and 535 pounds of FGD gypsum from the Miller Electric Generating Plant, Alabama (Plant Miller), in a tote with an agitator. This resulted in a 1% acid solution by volume. The slurry had been mixing for several days at time of test at ambient temperature; accounting for water in the gypsum, % solids=approximately 29.7%.
2) In the absence of an effective method of measuring ammonium carbonate content in solution at this time, an ammonium carbonate column was used until the solution had a pH of 9.2 and a specific gravity of about 1.11; these conditions were approximately the same as ammonium carbonate solution use in the lab when 100% conversion was achieved.
3) Pumped 219 pounds of gypsum slurry to gypsum acid wash belt filter at a rate of 18 pounds/minute; this equates to about 65 pounds of gypsum or 0.378 moles.
4) About a ¾" cake was formed on the belt. The cake was very soupy and wet.
5) The cake was washed with tap water on the belt by hand with a sprayer.
6) The cake was introduced off end of belt to Reactor 1.
7) Filtrate had been recycled from Reactor 2 belt filter to Reactor 1; by material balance this equaled 25 pounds of ammonium sulfate, 21.6 pounds of ammonium carbonate, and 136.4 pounds of water; this met the 50% stoichiometric requirements for both ammonium sulfate and ammonium carbonate.
8) The acid washed gypsum cake was mixed in Reactor 1 by agitator for 10 minutes at ambient conditions; no external heat was applied; the temperature remained around 65 to 70 degrees F.; the pH decreased from approximately 9 to 8.1 over the course of 10 minutes; there was minimal foaming.
9) The slurry was then pumped to the Reactor 1 filter belt at a rate of 13 pounds/minute; the cake was about 1" thick on the belt; the cake was soupy and wet.
10) The cake was introduced to Reactor 2 off the end of the belt; ammonium carbonate solution had been added to Reactor 2 to complete the reaction; 100% of the stoichiometrically required ammonium carbonate was added to Reactor 2, or 134 pounds of ammonium carbonate solution.
11) Cake was mixed with solution in the Reactor 2 by agitator for 10 minutes at ambient conditions; the temperature in Reactor 2 remained at 73 degrees F.; pH remained relatively unchanged at 9.1.
12) After 10 minutes, slurry was pumped to the Reactor 2 belt filter at a rate of 15 pounds/minute; the cake was about 1" thick and was wet coming off belt.
13) Cake was washed with about 0.4 gpm of tap water on belt.
14) Final product cake was analyzed for conversion to calcium carbonate. Analysis of the calcium carbonate using LECO® analytical instrumentation showed 100% conversion; microscope examination showed that product cake consisted of homogenous single crystals of calcium carbonate with size of 1 to 4 microns in diameter; by X-ray diffraction, the calcium carbonate content was determined to be 98.8% and acid insolubles were determined to be 1.24%.

Pilot Plant Test on Oct. 3, 2014

50% Conversion in Both Reactors 1 and 2 Using Plant Miller Stack Gas with Acid Wash (Metals Analysis)

Test objective: To achieve 50% conversion in Reactor 1 and Reactor 2 using ammonium carbonate solution made from Plant Miller's stack (flue) gas.

1) Wash large sample of raw FGD gypsum from Plant Miller with 1% acid, filter the washed gypsum and retain gypsum cake.
2) Mixed 500 pounds of water, 11.5 pounds of 93.2% sulfuric acid, and 267.5 pounds of Plant Miller gypsum cake which had been washed with 1% acid, in a tote with an agitator in addition to heel (residual slurry remaining from previous filtration operation) already mixed at same percentages; this calculates to a 1% acid solution by volume; heel had been mixing for several days at time of run at ambient condition; accounting for water in the gypsum, % solids=approximately 29.7%.
3) Ammonium carbonate solution used in test had been made at Plant Miller from Jun. 16-Jun. 27, 2014 by bubbling stack (flue) gas through a drum of ammonium hydroxide; because of the time lapse between production of the solution and the present test, the solution measured low in % nitrogen (6.903%) and % carbon (2.627%); experience with the process shows that conversion is difficult to achieve with such a weak solution; the solution was added back to the ammonium carbonate column and sparged with anhydrous ammonia and $CO_2$ to raise the analysis back to % N=9.637 and % C=4.242 (N/C=2.27); pure ammonium carbonate has N/C ratio of 2.33; solution is slightly nitrogen limited with excess carbon; % ammonium carbonate solution=33.0.
4) Pumped 219 pounds of gypsum slurry to gypsum acid wash belt filter at a rate of 21.3 pounds/minute; this equates to about 65 pounds of gypsum or 0.378 moles.
5) There was about 4" of Hg vacuum (inches of mercury) on the first belt wherein the cake was soupy and wet; about a 1¾"—2" cake was formed on the belt.
6) The cake was washed with tap water on the belt by overflow weir at about 0.4 gpm rate.
7) Cake was introduced off end of belt to Reactor 1.
8) Since 50% conversion was desired in Reactor 1, 0.378 moles×0.5=0.189 moles of ammonium carbonate had been added to Reactor 1; this equals 18.1 pounds of ammonium carbonate or 55 pounds of the 33% solution.
9) 50% of stoichiometric required ammonium sulfate had also been added to Reactor 1; a 36% ammonium sulfate solution had been made from bagged feed grade ammonium sulfate crystals dissolved in tap water; 0.189 moles of ammonium sulfate or 25 pounds of ammonium sulfate was added, and this amounted to 89.4 pounds of the ammonium sulfate solution.

10) The acid washed gypsum cake was mixed in Reactor 1 by agitator for 15 minutes at ambient conditions; no external heat was applied; the temperature remained around 71 to 74° F.; pH decreased from 8.66 to 7.64 over the course of 15 minutes; there was minimal foaming.
11) The slurry was then pumped to the Reactor 1 filter belt at a rate of about 15 pounds/minute; the cake was about ¾" thick on the belt; very dry cake; 18 to 22" Hg vacuum on the belt filter.
12) The cake was introduced to Reactor 2 off the end of the belt; ammonium carbonate solution had been added to Reactor 2 to finish off the reaction; 100% stoichiometric amount required for the initial gypsum was added=0.378 moles=110 pounds of 33.0% ammonium carbonate solution.
13) The pH of Reactor 2 before cake was added was 9.50 @ 70.1° F.; after all the cake was added and as retention time started, pH was 9.43 @ 72.1° F.; at end of 15 minutes, pH was 9.25 @ 74.1° F.; there was minimal foaming.
14) Slurry was pumped to the final belt filter at a rate of about 17 lbs/min.
15) Cake was washed with about 0.5 gpm of tap water on belt by overflow from nozzle spray.
16) Final product cake was analyzed for conversion to calcium carbonate. Samples heated in moisture balance showed 44.1 moisture and 82.8% conversion. Because of the apparent low conversion relative to the slurry samples, samples of final product were washed in the lab with Grade I water, dried, and reanalyzed. The reanalyzed samples showed 100% conversion to calcium carbonate, not including impurities indicating that ammonium sulfate solution was retained by the amorphous agglomerates and required further washing.
17) Cake analysis by LECO® instrumentation showed 19% conversion in Reactor 1 and 81% conversion in Reactor 2.
18) LECO® analysis for Sulfur, Nitrogen, and Carbon confirmed that ammonium sulfate was made and was coming out of Reactor 1 with S/N ratio=1.14 which is correct for ammonium sulfate; % solution=20.3%. Nitrogen analysis was performed by using a LECO Model FP-528. Carbon and Sulfur analysis was performed by using a LECO Model SC-144DR.

Samples of the raw Miller gypsum, the acid wash filtrate, Reactor 1 filtration cake, Reactor 1 filtrate, final product filtration cake, Reactor 2 filtrate, and final water wash underwent metals quantitative analysis; metals analyzed were arsenic, selenium, aluminum, and magnesium; mercury analysis was also performed. The analytical results are shown below in Table 1.

TABLE 1

Metals Analysis With Process using Acid Wash of raw FGD Gypsum

| Test Step | Arsenic | Selenium | Aluminum | Magnesium | Mercury |
|---|---|---|---|---|---|
| Raw gypsum | 0.656 | 10.5 | 369 | 1220 | 1.19 |
| Acid wash filtrate | 0.128 | 4.14 | 144 | 665 | 0.00533 |
| Reactor 1 cake | 0.488 | 3.65 | 137 | 108 | 0.800 |
| Reactor 1 filtrate | 0.0185 | 1.08 | 0.0270 | 15.1 | ND |
| Product cake | 0.679 | 2.11 | 262 | 173 | 0.668 |
| Reactor 2 filtrate | 0.0190 | 2.46 | 0.962 | ND | 0.00905 |
| Final water wash | 0.00825 | 1.12 | 0.338 | ND | 0.00256 |

Solution results are reported in mg/L and solid results are reported in mg/kg.
ND = Not detected at the reporting limit.

Pilot Plant Test on Oct. 6, 2014

50% Conversion in Both Reactors 1 and 2 Using Plant Miller Stack Gas with No Acid Wash (Metals Analysis)

Test objective: In order to show the effectiveness of treating raw Plant Miller gypsum with an acid wash, the same test that was performed on Oct. 3, 2014 with an acid wash, described above, was performed on Oct. 6, 2014 without an acid wash. A further objective was to achieve 50% conversion in Reactor 1 and Reactor 2 using ammonium carbonate solution made from Plant Miller's stack (flue) gas.

1) The ammonium carbonate solution employed in this test had been made at Plant Miller from Jun. 16-Jun. 27, 2014 by bubbling stack gas through a drum of ammonium hydroxide; because of the time lapse between production of the solution and the time of conducting the present test, the solution measured low in percent nitrogen (6.903%) and percent carbon (2.627%); experience with the process shows that conversion is difficult to achieve with such a weak solution; the solution was added back to the ammonium carbonate column and sparged with anhydrous ammonia and $CO_2$ to raise the analysis back to % N=9.178 and % C=4.285 (N/C=2.14); pure ammonium carbonate has N/C ratio of 2.33; the solution was slightly nitrogen limited with excess carbon; % ammonium carbonate solution=31.5.
2) Since 50% conversion was desired in Reactor 1, 0.378 moles×0.5=0.189 moles of ammonium carbonate was added to Reactor 1; this equals 18.1 pounds of ammonium carbonate or 57.7 pounds of the 31.5% solution.
3) 50% of stoichiometric required ammonium sulfate had also been added to Reactor 1; a 36% ammonium sulfate solution had been made from bagged feed grade ammonium sulfate crystals dissolved in tap water; 0.189 moles of ammonium sulfate or 25 pounds of ammonium sulfate was added, this amounted to 89.4 pounds of the ammonium sulfate solution.
4) The ammonium carbonate and ammonium sulfate solutions were allowed to mix by agitation for several minutes in Reactor 1 before addition of the gypsum. The pH in Reactor 1 before gypsum addition was 9.05 @ 65.8° F.
5) 75.2 pounds of Plant Miller gypsum was weighed out and placed on the gypsum wash belt filter. Since the gypsum contains about 13.5% moisture, this equals about 65 pounds of dry gypsum or 0.378 moles. The belt was used to slowly add the gypsum to Reactor 1 over the span of 15 minutes to prevent settling of the gypsum and ensure good agitation.
6) The pH of the slurry in Reactor 1 after all of the gypsum had been added was 8.69@ 67.9° F.
7) A steep drop in pH occurred after about 12½ minutes of agitation. The pH continued to drop steadily at 15 minutes elapsed time, so the agitation was allowed to continue. At 20 minutes, the pH was 7.96 @ 68.5° F. The slurry was allowed to mix until the pH stabilized which it did after approximately 28 minutes. The pH at this time was 7.68 @ 68.6° F. No foaming occurred in Reactor 1.
8) During the mixing within Reactor 1, 115.3 pounds of the 31.5% ammonium carbonate solution had been added to Reactor 2. This equaled 36.3 pounds of ammonium carbonate or 0.378 moles. The pH in Reactor 2 before addition of cake was 9.37 @ 65.3° F.

9) The slurry was then pumped to the Reactor 1 filter belt at a rate of about 15 pounds/minute; the cake was about ½-¾" thick on the belt; very dry cake; 16 to 26" Hg vacuum on the belt filter.

10) After all the filter cake was conveyed from the Reactor 1 filter belt and as retention time started, pH was 9.33 @ 66.6° F.; at end of 15 minutes, pH was 9.26 @ 66.9° F.; there was minimal foaming.

11) Slurry was pumped to the final belt filter at a rate of about 17 lbs/min.

12) Filter cake was washed with about 0.5 gpm of tap water on belt by overflow from nozzle spray.

13) Final product cake was analyzed for conversion to calcium carbonate. Samples were heated in moisture balance and showed 44.9% moisture and 92.1% conversion; because of the low conversion relative to the slurry samples, samples of final product were washed in the lab with Grade I water, dried, and reanalyzed; these showed conversion of 100% not counting impurities.

14) Cake analysis by quantitative instrumentation (made by LECO®) showed 34% conversion in Reactor 1 and 66% conversion in Reactor 2

15) LECO® analysis for S, N, and C confirmed ammonium sulfate was made coming out of Reactor 1 as S/N ratio=1.14 which is correct for ammonium sulfate; % solution=21.9%. Nitrogen analysis was performed by using a LECO Model FP-528. Carbon and Sulfur analysis was performed by using a LECO Model SC-144DR.

Samples of the raw Miller gypsum, Reactor 1 filtration cake, Reactor 1 filtrate, final product filtration cake, Reactor 2 filtrate, and final water wash underwent metals quantitative analysis; metals analyzed were arsenic, selenium, aluminum, and magnesium; mercury analysis was also performed. The results are shown in below Table 2. Comparing the results shown in Table 1 (with acid wash of raw gypsum) with the results shown in Table 2 (no acid wash of raw gypsum) demonstrates that the acid wash was particularly effective in reducing the amount of arsenic, selenium, aluminum and magnesium.

TABLE 2

Metals Analysis With Process Without Acid Wash of raw FGD Gypsum

| Test Step | Arsenic | Selenium | Aluminum | Magnesium | Mercury |
|---|---|---|---|---|---|
| Raw gypsum | 0.656 | 10.5 | 369 | 1220 | 1.19 |
| Reactor 1 cake | 0.914 | 9.08 | 520 | 1370 | 0.916 |
| Reactor 1 filtrate | 0.0131 | 1.71 | 0.0140 | 3.32 | ND |
| Product cake | 0.997 | 4.19 | 780 | 1660 | 0.491 |
| Reactor 2 filtrate | 0.0207 | 3.89 | 1.01 | ND | 0.00557 |
| Final water wash | 0.00790 | 1.30 | 0.501 | ND | 0.00154 |

Solution results are reported in mg/L and solid results are reported in mg/kg.
ND = Not detected at the reporting limit.

Pilot Plant Filtration Rates in Example 3 and Example 4

Filter rates have a significant impact on the steady and consistent flow of the multistage, partially continuous countercurrent processes of the present invention. Accordingly, the following process parameters regarding rates of filtration are set forth below:

1) Gypsum acid wash belt:
   Filtration area=19"×36"=4.75 ft$^2$
      Feed rate ranged from 11 to 21 lbs/min, average of 16 lbs/min
      Filtration rate=3.37 lbs/min/ft$^2$
   Wash zone area=19"×48"=6.33 ft$^2$
      Filtration rate=2.53 lbs/min/ft$^2$ (washed with ~0.4 gpm water which is not sufficient; need 1 gpm to match lab rate)

2) Reactor 1 belt (2$^{nd}$ filter):
   Area=9½"×42"=2.77 ft$^2$
   Typical flow rate=15 lbs/min of slurry to belt
   Filtration rate=5.42 lbs/min/ft$^2$ 3) Reactor 2 belt (3$^{rd}$ filter):
   Filtration area=6"×24"=1 ft$^2$
   Typical flow rate=17 lbs/min of slurry to belt
   Filtration rate=17 lbs/min/ft$^2$
   Wash zone are=6"×18"=0.75 ft$^2$
      Filtration rate=22.7 lbs/min/ft$^2$ (washed with ~0.5 gpm water which is not sufficient; need 1.9 gpm to match lab rate)

Example 5

Tests for Process Boundary Conditions

The above described pilot plant tests were performed so that approximately 50% of the reaction occurred in each Reactor (Reactor 1 and Reactor 2). However, the present multistage, partially continuous countercurrent process successfully operates at selected reactor ratios including 50/50 reactions to control crystal sizes.

Thus the following are two examples that describe testing of reactor reaction ratios wherein 10% of the reaction would occur in one reactor and 90% would occur in the other.

In the reactors which contained only 10% of the reaction, the reaction was complete since the driving force was extreme towards finishing the reaction of the small concentration of ammonium carbonate left in the ammonium sulfate solution fed to Reactor No. 1. Here, the full complement of gypsum was present, or the small complement of gypsum left in the calcium carbonate slurry of Reactor 2 where there was with a full complement of ammonium carbonate.

When trying to react 90% of the gypsum with 100% complement of ammonium carbonate (or 10% excess of ammonium carbonate), the reaction in Reactor 2 proceeded to about 70% in 10 minutes, but took approximately one (1) hour to reach 100% conversion. This showed that for quick conversion of most gypsum with ammonium carbonate at least 20% of the reaction should be done in one of the vessels and this must require a stoichiometric advantage of one reaction over the other of about 25 to 30% in each reactor in the present partially continuous counter-current batch process. While no boundary conditions were determined per se, this process information provides for flexibility and reduced process control of the operating plant.

To test the reactivity of the counter-current flow process with reactions of less than 50% in each reactor the following tests were performed.

Test 1

10% of Reaction in Reactor No. 1 and 90% of Reaction in Reactor No. 2

Plant Miller FGD gypsum was washed with 93.7% sulfuric acid diluted to 1% by volume with water, followed by water washing. The washed gypsum cake containing 65 pounds of gypsum was fed to Reactor No. 1 where it was mixed with a liquid containing 10.5 pounds of 34.6% solution ammonium carbonate or 0.0378 moles of ammonium carbonate, equal to 10% of that needed to react with 0.378 moles of gypsum. In addition to the ammonium carbonate solution, a solution containing 45 pounds of ammonium sulfate at 36% ammonium sulfate was added to the mixture. The resulting solution mixture represented 90% of the reaction in Reactor No. 2. After 10 minutes of agitation in Reactor No. 1, the slurry was filtered and ammonium carbonate was completely converted to ammonium sulfate. The filtered gypsum cake was then fed to Reactor No. 2 where 100% of the stoichiometric amount of required ammonium carbonate for the original gypsum feed was mixed with it under agitation. No external heat was added during the reaction. To measure the completion of the reaction in Reactor No. 2, which represented a 10% excess of ammonium carbonate in moles of reactant over that needed by the original gypsum, slurry samples were taken in timed intervals where the reactant slurry was measured for gypsum conversion to calcium carbonate after filtration and washing. The following Table 3 shows the results:

TABLE 3

Product Yield as a Function of Reactor Retention Time

| Retention Time (min) | pH | Temperature (deg. F.) | % Conversion |
|---|---|---|---|
| 5 | — | — | 46.9 |
| 10 | — | — | 69.2 |
| 15 | — | — | 72.2 |
| 30 | 8.58 | 82.3 | 83.6 |
| 45 | 8.39 | 82.5 | 84.6 |
| 60 | 8.28 | 82.8 | 85.8* |

*This value was determined by measuring carbon, nitrogen, and sulfur using the afore referenced LECO laboratory instruments. However, polarized light microscopy and electron scanning microscope studies (see SEM image of FIG. 13) show that there was 100% conversion to calcium carbonate. Conversion at 30 minutes is estimated to be approaching 100%.

Figure 13:
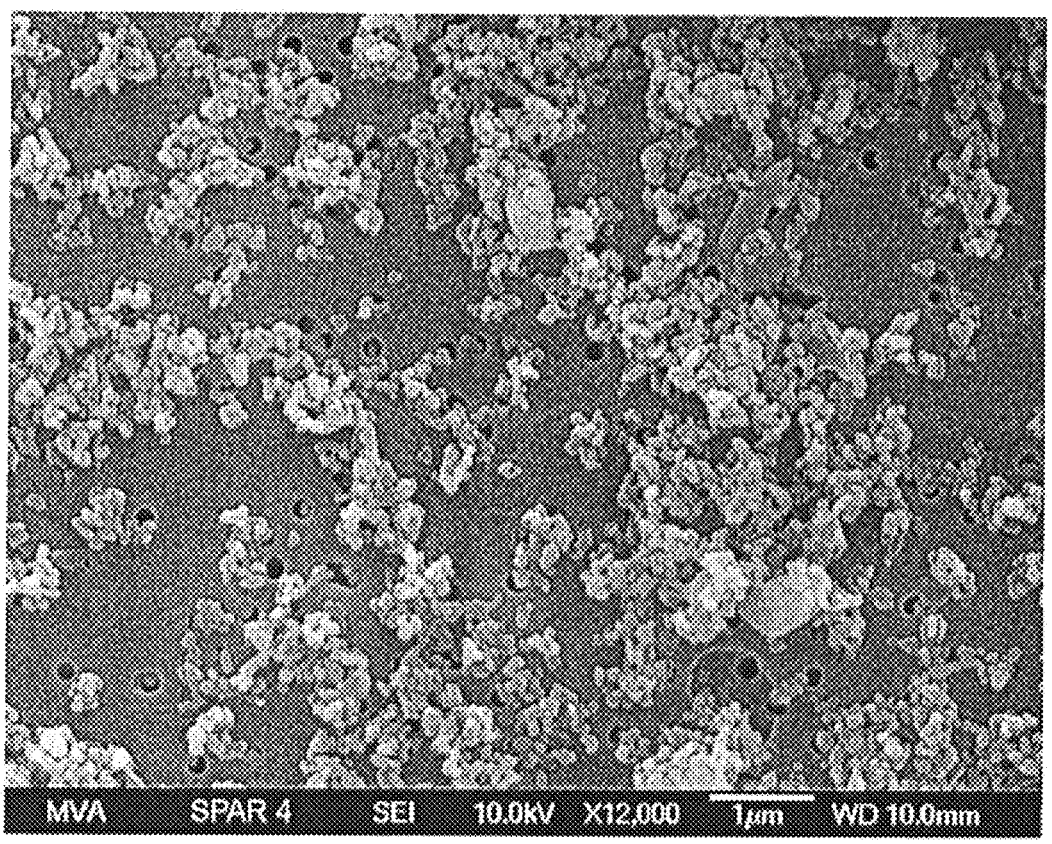
FIG. 13 shows magnification of product calcium carbonate crystals, SEM Image at 12,000×.

Polarized light microscopy showed the calcium carbonate crystals measured less than one micron which is below the size limits of polarized light microscopy but within the size limits of scanning electron microscope detection. Scanning electron microscope imaging of the product calcium carbonate resulting from above Test 1 is shown in FIG. 13. From analysis of FIG. 13, the product is shown to be abundant in fine, well formed crystals that are 200 nanometers in size and smaller.

Test 2

90% of the Ammonium Carbonate/FGD Gypsum in Reactor No. 1 and the Remainder in Reactor No. 2

The following procedure was performed. After washing the Plant Miller FGD gypsum with 93.7 sulfuric acid diluted to 1% by volume with water, filtering and water washing, the washed gypsum cake containing 65 pounds of gypsum was fed to Reactor No. 1. The washed gypsum cake was mixed with a solution containing 94.2 pounds of 34.6% solution ammonium carbonate or 0.340 moles of ammonium carbonate, equal to 90% of that needed to react with 0.378 moles of gypsum. In addition to the ammonium carbonate solution, a solution of five (5) pounds of ammonium sulfate (at 36% ammonium sulfate) was added to the mixture. The resulting mixture represented 10% of the reaction to be performed in Reactor No. 2. Further, while all this material was being mixed, the pH decreased from 9.20 to 7.68 with a significant amount of foam formed. Aqua ammonia was sprayed in the tank for about 10 seconds until the foam dissipated. After 10 minutes of agitation at 77 to 82° F. the slurry was filtered. The gypsum conversion was 34.7%. Thus the filtrate contained an ammonium sulfate content of about 44.7% leaving about 55.3% of the ammonium carbonate in the filtrate from Reactor No. 1.

Continuation of Test 2

In a continuation of the above Test 2, the resulting slurry was filtered and the cake fed to Reactor No. 2. A 100% stoichiometric amount of ammonium carbonate based on the original gypsum feed to Reactor No. 1 was fed to Reactor No. 2 simulating a partially continuous counter-current flow process, thus resulting in 0.378 moles or 105 pounds of 34.6% ammonium carbonate. No external heat was added during the reaction. After agitation of the mixture at 76.4 to 78.8° F. for five minutes, a slurry sample was pulled and the rest of the gypsum was found to be 99% converted to calcium carbonate. After 10 minutes in Reactor No. 2, the gypsum in the discharged slurry was completely converted to calcium carbonate.

Example 6

Retention Time Tests

Objective: These tests checked the effect that the time spent in the reactors has on crystal size, crystal morphology and completeness of reaction with 50% of the gypsum reacting in each reactor while simulating the process of embodiment number 1, shown in FIG. 1.

Feed Material:
Miller gypsum (8.3% water)
Ammonium Carbonate Solution (up to 33% by weight)
Ammonium Sulfate Solution (up to 36% by weight)
Sulfuric Acid (1% by volume)
Aqua Ammonia (29%)
Process Constant Parameters
For the tests, the reactor retention times used were 2, 5, 10, 15, 20, 30, and 60 minutes.
Process Variable Parameters
Parameters monitored and/or adjusted during the tests include pH, temperature, percent reaction of gypsum in each reactor, and aqua ammonia addition. The pH and temperature of the reactions were monitored throughout the reactions. The pH remained between 6.8 and 8.8 with aqua ammonia added as needed to stop any foaming. Temperatures were not controlled during the reaction and remained between 20.5° C. and 38° C. for all of the runs. The tests were designed to produce a 50% reaction of gypsum in each reactor.
Procedure
General Description of the Tests
Each test was performed to simulate the partially continuous countercurrent process illustrated in FIG. 1 (refer to FIG. 1) using two runs (a "run" is one completion of the process from beginning to end). Run 1 was performed to produce the Ammonium Sulfate/Ammonium Carbonate Solution (18) for Reactor No. 1 (8) of Run 2 in order to simulate the solution produced by the countercurrent process. Both of the runs were designed for 50% of the reaction of the starting gypsum occurring in each reactor. Run 1 used a separately made (not made within operation of the process) stoichiometric solution of 50:50 ammonium carbonate to ammonium sulfate solutions to be used as the Ammonium Sulfate/Ammonium Carbonate Solution (18) in Reactor No.

1 (8). This 50:50 solution contained the amount of ammonium carbonate needed to react with 50% of the Gypsum Cake (6) being fed to Reactor No. 1 (8) and the amount of ammonium sulfate solution that would result from 50% of the gypsum having reacted. The Ammonium Carbonate/Ammonium Sulfate Solution (18) from Reactor No. 2 (11) of Run 1 was saved and used as the Ammonium Carbonate/Ammonium Sulfate Solution (18) for Reactor No. 1 (8) of Run 2. The final Calcium Carbonate Product Cakes (14) from Run 2 of each test were analyzed by polarized light microscopy. Percent nitrogen, sulfur, and carbon were measured using LECO® quantitative instruments (nitrogen analyzer was a LECO® Model FP-528; carbon/sulfur analyzer was a LECO® Model SC-144DR).

For all runs of all tests, 50 mL samples were collected of the Ammonium Sulfate Solution Product (19) from Reactor No. 1 as well as a 1 g sample of the Calcium Carbonate and Gypsum Cake (10) from Reactor No. 1. In addition, the final Calcium Carbonate Product Cakes (14) from each run were collected.

Preparing Solutions

Ammonium Carbonate (up to 33%)—prepared fresh daily

Placed 495 g of reagent grade ammonium carbonate with 1005 g of DI water in a beaker on a magnetic stir plate set at 45° C. This solution was stirred until dissolved.

Ammonium Sulfate (up to 36%)

Added 360 g of ammonium sulfate to 640 g of DI water. This solution was stirred with no heat on a magnetic stir plate until dissolved.

Calculating the Amounts of Ammonium Sulfate and Ammonium Carbonate to Use for the Test 1. The percent of ammonium carbonate and ammonium sulfate in each solution was found prior to the test work by measuring the percent nitrogen in the solution using the LECO®.
2. Based on the percent nitrogen measurements, the correct stoichiometric amounts of ammonium carbonate and ammonium sulfate solution to add were calculated using accepted methods. This calculation assumed that all of the nitrogen was in the form of ammonium carbonate or ammonium sulfate, depending on the solution being measured. The number of moles per mL were calculated and the amount needed to react with the desired percentage of gypsum (after adjusting the weight for moisture content) was found in terms of grams of solution.

Procedure for Retention Time Tests—Run 1:
1. 175 g of Miller gypsum was washed in a 1% sulfuric acid solution (by volume, adjusting for the moisture in the gypsum). The 1% sulfuric acid solution was prepared by adding 3.9 mL of concentrated sulfuric acid to 371.6 mL of Grade 1 water and mixing well. After adding the gypsum, the slurry was mixed for 10 minutes in a beaker using a magnetic stir plate.
2. The slurry was filtered, and the filtered Gypsum Cake was then rinsed with approximately 320 mL of Grade 1 water and filtered again.
3. The washed and filtered Gypsum Cake (6) was placed in a 1 L beaker with the calculated amount of fresh, up to 33% ammonium carbonate solution and up to 36% ammonium sulfate solution. This beaker served as Reactor No. 1 (8) as shown in FIG. 1.
4. The slurry was mixed on a stir plate for the designated retention time (2, 5, 10, 15, 20, 30, or 60 minutes). Any foaming was dissipated by spraying aqua ammonia into the reactor.
5. After the designated retention time (2, 5, 10, 15, 20, 30, or 60 minutes), the slurry was filtered, and the filtrate was the Reactor No. 1 (8) Ammonium Sulfate Solution Product (19). A 50 mL sample of this filtrate was collected. In addition, a 1 g sample of the Calcium Carbonate and Gypsum Cake (10) was dried in a moisture balance and saved.
6. Fresh up to 33% ammonium carbonate solution containing 100% stoichiometric of Ammonium Carbonate Solution (12) (calculated as mentioned above) was added to a beaker serving as Reactor No 2 (11). The residual Calcium Carbonate and Gypsum Cake (10) from Reactor No. 1 (8) was added to this Ammonium Carbonate Solution (12).
7. The resulting slurry was mixed on a stir plate for the designated retention time (2, 5, 10, 15, 20, 30, or 60 minutes). Any foaming was stopped by spraying aqua ammonia into Reactor No. 2 (11).
8. The slurry was filtered by Buchner funnel, and the resulting Calcium Carbonate Product Cake (14) was washed and filtered with 268 mL of Grade I water.
9. The Ammonium Sulfate/Ammonium Carbonate Solution (18) filtrate from Reactor No. 2 (11) before the wash was kept to provide the Ammonium Sulfate/Ammonium Carbonate Solution (11) for Reactor No. 1 (8) in Run 2 of the test. The Calcium Carbonate Product Cake (14) was dried overnight in an oven at 55° C.

General Procedures for Retention Time Tests—Run 2:
1. 175 g of Miller gypsum was acid washed as described in Steps 1-2 of Run 1 above.
2. The washed and filtered gypsum was placed in a 1 L beaker with the Ammonium Sulfate/Ammonium Carbonate Solution (18) from Reactor No. 2 (11) of Run 1. This beaker served as Reactor No. 1 (8) for Run 2.
3. Steps 4-8 of Run 1 were followed.
4. The Calcium Carbonate Product Cake (14) was dried overnight in an oven at 55° C. and the Ammonium Sulfate/Ammonium Carbonate Solution (18) was discarded.

Results

The Calcium Carbonate Product Cakes from Reactor No. 2 of Run 2 for each of the tests were evaluated optically by polarized light microscopy (PLM) to check for any completeness of the reaction converting gypsum to calcium carbonate as well as crystal size and morphology of the calcium carbonate product. PLM provides an effective way to directly detect the presence of even small amounts of residual unreacted gypsum in the product. The ability to distinguish the gypsum from the calcium carbonate is due to the difference in the refractive indices of gypsum and calcium carbonate.

Polarized Light Microscopy (PLM) General Description of the Calcium Carbonate Product This process of charging $CaSO_4.2H_2O$ to concentrated solutions of $(NH_4)_2CO_3$ results in the rapid precipitation of vaterite ($CaCO_3$) on the surface of the $CaSO_4.2H_2O$ crystals resulting in soft agglomerates of vaterite spherulites ranging in size from 2µ or less up to spherulites of 8µ in diameter. The precipitation is so rapid that the $Ca^{++}$ ions are depleted before the spherulites are grown larger. Also, subsequent nucleation occurs before the original spherulites can develop into larger units. These spherulites result when a seed crystal grows very rapidly on one face in all directions. The single crystal length is half of the spherulite diameter and probably 1/100 that size in diameter.

The spherulites form "husks" or "shells" at the surface of the gypsum crystal as they grow. They break away from the surface due to agitation of the slurry and form fragments that are loose agglomerates of spherulites.

TABLE 4

PLM Results of Run 2 Calcium Carbonate Product Cake

| Sample ID | Reactor Retention Time | Spherulite Diameter Range | Spherulite **Diameter of Bulk Weight Fraction | Estimated Residual Gypsum Observed Optically | Optically Estimated % Conversion |
|---|---|---|---|---|---|
| SCP036 | 60 min. | 1-5μ | *N/A | none | 100% |
| SCP026 | 30 min. | 2-7μ | 2-5μ | none | 100% |
| SCP016 | 20 min. | 2-8μ | 3-4μ | none | 100% |
| SCP021 | 15 min. | 2-5μ | *N/A | none | 100% |
| SCP031 | 10 min. | 2-7μ | *N/A | none | 100% |
| SCP041 | 5 min. | 2-8μ | 5-8μ | none | 100% |
| SCP051 | 2 min. | 1-8μ | *N/A | <10% | 90-100% |

*N/A = Not Available
**Diameter of Bulk Weight Fraction is the diameter of 95% by weight of the vaterite spherulites.

Analysis of Results

Referring to the test results presented in Table 4, polarized light microscopy indicates that the calcium carbonate product from all of the retention time tests was consistently formed as very small vaterite spherulites between 1 and 8μ in diameter. By weight, 95% of the spherulites diameters were between 2μ and 5μ for all but the 5 Minute Retention Time Test.

Polarized light microscopy results found residual gypsum indicating an incomplete reaction in only of the 2 Minute Retention Time Calcium Carbonate Product Cake.

Percent carbon for the Calcium Carbonate and Gypsum Cake from Reactor No. 1 of Run 2 of the 20 Minute Retention Time test was measured. This test was chosen because the 20 minute retention time closely simulates the way the actual process will be run due to considerations of continuous filtration from dual 2-stage reactors feeding one filter in sequence and was used as the retention time for testing other process parameters discussed later. The carbon measured by LECO was 4.45% which very closely matches the expected value of 4.41% calculated for a stoichiometric mixture of 50% calcium carbonate and 50% gypsum, demonstrating that the recycled Ammonium Sulfate/Ammonium Carbonate Solution must have contained a 50% stoichiometric amount of ammonium carbonate solution and that 50% of the reaction is occurring in each reactor during the partially continuous countercurrent process. This information combined with the 100% yield of calcium carbonate in Reactor No. 2 means that there was a 100% yield of ammonium sulfate. To further support this, the Ammonium Sulfate Product Solution from the 20 Minute Retention Time Test, was crystalized and measured for percent sulfur and percent nitrogen using a LECO® Model SC-144DR analyzer for sulfur and a LECO® Model FP-528 analyzer for nitrogen. The resulting measurements were 23.4% sulfur and 20.2% nitrogen. This gives a S:N ratio of 1.16 which very closely matches the expected ratio of 1.14 for $(NH_4)_2SO_4$.

Conclusions

Using the reaction ratio of 50% reaction of gypsum in Reactor No. 1 and Reactor No. 2 and a temperature of 25° C., the retention times in the reactors shown below produce a 100% conversion of gypsum to calcium carbonate and ammonium sulfate:

(1) 1 minute for highly reactive gypsum such as finely ground gypsum to 24 hours for extremely unreactive gypsum due to extremely low surface area to weight ratios is a good retention time in each reactor.

(2) A more preferred retention time in each reactor is 4 minutes to 60 minutes.

(3) The most preferred retention time in each reactor is 8 minutes to 20 minutes.

Using the reaction ratio of 50% reaction of gypsum in Reactor No. 1 and Reactor No. 2 and a temperature of 25° C., the retention times in the reactors shown above may be used to produce a 100% conversion of gypsum to calcium carbonate and ammonium sulfate. However, as shown in further results, complete conversion was obtained at Reactor No. 1 to Reactor No. 2 gypsum reaction ratios of 20%:80%, 30%:70%, 70%:30%, and 80%:20% as well as at reactor temperatures of 35° C., 45° C., and 55° C.

Note: Although not tested for these other reaction ratios and temperatures, it would follow from understanding of reaction speeds that some gypsums may require more than a 10 minutes retention time in each reactor based on the size and morphology of the gypsum crystals and the temperature of the reaction.

Example 7

Temperature Control Tests

Objective: This set of tests was designed to determine the effect that temperature has on the completeness of reactions and size and morphology of the calcium carbonate crystals formed by the partially continuous countercurrent process by simulating the process shown in FIG. 1 and using two reactors with 50% of the gypsum reacting in each reactor and using a retention time in each reactor of 20 minutes.

Feed Materials: Same as described in the Retention Time tests

Process Constant Parameters

The temperatures 15° C. (59° F.), 25° C. (77° F.), 35° C. (95° F.), 45° C. (113° F.), and 55° C. (131° F.) were tested in a simulation of the process shown in FIG. 1.

Process Variable Parameters

Parameters monitored and/or controlled during the test include pH, retention time in the reactors, percent reaction of gypsum in each reactor, and addition of aqua ammonia to control foaming. The pH and temperature of the reactions were monitored throughout the reactions. The pH remained between 7.4 and 8.8 with the addition of aqua ammonia to control foaming. The tests were designed to produce a 50% reaction of gypsum in each reactor.

Procedures

The ammonium sulfate and ammonium carbonate solutions were prepared as described in the retention time tests of Example 6. The amount of each to use was determined as described in those tests.

As discussed in the Retention Time Tests of Example 6, each test was performed with two runs to simulate the partially continuous countercurrent process shown in FIG. 1. The first run was done to produce the Reactor No. 2 filtrate to use in Reactor No. 1 of the second run.

Description of Run 1 for Each Test:

1. The gypsum was acid washed as described in Steps 1-2 of the Retention Time tests.
2. To create a synthetic solution representing the Ammonium Sulfate/Ammonium Carbonate Solution for Reactor No. 1, a calculated amount of fresh up to 33% ammonium carbonate solution and up to 36% ammonium sulfate solution representing a 50%:50% stoichiometric amount of each was brought to the appropriate temperature in a 1 L beaker either by heating or cooling the solution. This beaker served as Reactor No. 1 in FIG. 1 and was either placed on a hot plate or in a water/ice bath as needed to maintain the desired temperature. During this time, the gypsum was either heated or cooled to the appropriate temperature.

3. When the temperatures were stabilized, the gypsum was added to the solution.

4. The desired slurry temperature was appropriately maintained as the slurry was mixed on a stir plate for 20 minutes, measuring the temperature and pH every 2 seconds. Any foaming was dissipated by spraying aqua ammonia into the reactor.

5. After 20 minutes of reacting, the slurry was filtered, and the filtrate was the Ammonium Sulfate Product Solution. A 50 mL sample of the filtrate was collected as well as a 1 g sample of the Calcium Carbonate and Gypsum Cake.

6. Fresh up to 33% ammonium carbonate solution containing a 100% stoichiometric amount of ammonium carbonate was added to a 1 L beaker serving as Reactor No. 2. The temperature of this solution was adjusted to the desired temperature.

7. The residual cake from Reactor No. 1 was also brought to the desired temperature and then added to the ammonium carbonate solution in Reactor No. 2.

8. The slurry temperature was appropriately maintained, and the slurry was mixed on a stir plate for 20 minutes. The temperature and pH were recorded every 2 seconds. Any foaming was dissipated by spraying aqua ammonia into Reactor No. 2.

9. The slurry was filtered by Buchner funnel. The resulting Calcium Carbonate Product Cake was then washed with 268 mL of Grade I water, filtered, and dried overnight in an oven at 55° C.

10. This filtrate before washing with water from Step 9 was saved to use as the Ammonium Sulfate/Ammonium Carbonate Solution in Reactor No. 1 of Run 2.

Description of Run 2 for Each Test:

1. The gypsum was acid washed as described previously.

2. The Reactor No. 2 Ammonium Sulfate/Ammonium Carbonate Solution filtrate from Run 1 was brought to the desired temperature in a 1 L beaker serving as Reactor No. 1. At the same time the gypsum was also brought to the desired temperature.

3. Steps 3-9 were completed as described in Run 1 above.

Results

The Calcium Carbonate Product Cake for each test from Reactor No. 2 of Run 2 were evaluated optically by Polarized Light Microscopy (PLM) to check for completeness of reaction and product size and morphology.

TABLE 5

| PLM Results on Run 2 Calcium Carbonate Product Cake | | | | |
|---|---|---|---|---|
| SCP Sample ID | Reactor Temperature (° C.) | Spherulite Diameter Range | Spherulite *Diameter of Bulk Weight Fraction | Estimated Residual Gypsum Observed Optically | Optically Estimated % Conversion |
| SCP077 | 15 | 1-12μ | 2-4μ | <1% | 99-100% |
| SCP072 | 25 | 1-7μ | 3-4μ | none | 100% |
| SCP057 | 35 | 1-6μ | 2-5μ | none | 100% |
| SCP062 | 45 | <1-6μ | <1-4μ | none | 100% |
| SCP067 | 55 | 1-5μ | 2-3μ | none | 100% |

*Diameter of Bulk Weight Fraction is the diameter of 95% by weight of the vaterite spherulites.

Polarized light microscopy analysis also showed that the morphology of all of the Calcium Carbonate Product Cakes was characterized as vaterite in the shape of spherulites of needle crystals radiating from a center point.

Analysis of Results

Referring to the test results presented in Table 5, polarized light microscopy showed the conversion to be 100% for all but the 15° C. Test which showed 99-100% conversion.

Conclusions

Using the reaction ratios of 50% reaction of gypsum in Reactor No. 1 and Reactor No. 2 with a retention time of 20 minutes in each, the following range of process temperature parameters in each reactor may be used for 100% reaction of gypsum to produce ammonium sulfate and calcium carbonate: 5° C. (41° F.) to 80° C. (176° F.).

Example 8

Ratio Tests

Objective: These tests simulated the process in FIG. 1 to check the limits of the percentage of gypsum that must react in Reactor No. 1 to ensure completeness of reaction. For the tests, a retention time of 20 minutes and ambient temperatures were used since they most closely simulate the time and temperatures for the way the actual process will run due to considerations of continuous filtration from dual 2-stage reactors feeding one filter in sequence and was used as the retention time for testing other process parameters discussed.

Feed Material: Same as described in the Retention Time tests of Example 6.

Process Constant Parameter

The reactor percent ratio of gypsum reacting in each reactor to be tested are 80%:20%, 20%:80%, 70%:30%, 30%:70%. These values represent the percentage of gypsum that is reacted in FIG. 1, Reactor No. 1 and Reactor No. 2, respectively. For example, the 80%:20% ratio means that 80% of the gypsum is reacted in Reactor No. 1 and 20% is reacted in Reactor No. 2. So for the 80%:20% test, the Ammonium Sulfate/Ammonium Carbonate Solution fed to Reactor No. 1 contains the stoichiometric amount of ammonium carbonate to react with 80% of the gypsum in Reactor No. 1. It follows then that the Calcium Carbonate and Gypsum Cake feeding Reactor No. 2 of FIG. 1 contains 20% remaining unreacted gypsum that reacts in Reactor No. 2.

Process Variable Parameters

Parameters monitored and/or adjusted during the reaction include pH, temperature, retention time, and aqua ammonia addition. The pH and temperature of the reactions were monitored throughout the reactions. The pH remained between 7.3 and 8.8 even with aqua ammonia added as needed to stop any foaming. Temperatures were not controlled during the reaction and remained between 20.5° C. and 38° C. for all of the runs. The retention time in each reactor was 20 minutes.

Procedures

All solutions were prepared as described in the Retention Time tests in Example 6. As discussed in Example 6, each test was performed with two runs using the Reactor No. 2 filtrate from the first run as the Ammonium Sulfate/Ammonium Carbonate Solution in Reactor No. 1 of the second Run. This is done so that Run 2 best simulates the process shown in FIG. 1.

Ratio 20:80 Test—Run 1:
1. 175 g of Miller gypsum was acid washed as described in Steps 1-2 of the Retention Time Test.
2. The calculated amount of fresh up to 33% ammonium carbonate solution and up to 36% ammonium sulfate solution was placed in a 1 L beaker (representing Reactor No. 1) with the washed gypsum. The amount of ammonium carbonate and ammonium sulfate solution to use was found based on the nitrogen analyses of the solutions and the appropriate weights to provide the stoichiometric amount of ammonium carbonate for 20% of the gypsum fed to Reactor No. 1 to react and the stoichiometric amount of ammonium sulfate that would have resulted from 80% of that gypsum having reacted. This simulates the Ammonium Sulfate/Ammonium Carbonate Solution that would have come from Reactor No. 2 of the process in FIG. 1 for a reaction ratio of 20%:80%.
3. The rest of Run 1 was completed by following Steps 4-9 of Run 1 of the Procedure for Retention Time Tests.

Ratio 20:80 Test—Run 2:
1. 175 g of fresh Miller gypsum was acid washed as before.
2. The Ammonium Sulfate/Ammonium Carbonate Solution filtrate from the 20:80 Reactor No. 2 Run 1 Test was placed with the washed and filtered gypsum in a 1 L beaker serving as Reactor No. 1.
3. Steps 5-8 of Run 1 of the Retention Time tests were completed.
10. The slurry from Reactor No. 2 was filtered by Buchner funnel, and the resulting Calcium Carbonate Product Cake was washed and filtered with 268 mL of Grade I water.
4. The product cake was dried overnight in an oven at 55° C.

The above described test was repeated, changing the feed solutions to produce an 80% reaction of gypsum in Reactor No. 1 and 20% reaction in Reactor No. 2. The test was also repeated for 30%:70% and 70%:30% reactions.

Results

As discussed in Examples 6 and 7, polarized light microscopy was used to check for completeness of reaction by checking for residual gypsum in the calcium carbonate product.

TABLE 6

Polarized Light Microscopy of Run 2 Calcium Carbonate Product Cakes

| SCP Sample ID | Test Description Based on % Reaction of Gypsum in *R1:R2 | Estimated Residual Gypsum Observed Optically | % Conversion |
| --- | --- | --- | --- |
| SCP082 | 20:80 | <1% | 99-100% |
| SCP087 | 80:20 | none | 100% |
| SCP092 | 30:70 | none | 100% |
| SCP097 | 70:30 | none | 100% |

*R1 = Reactor No. 1 and R2 = Reactor No. 2

Analysis of Results

Referring to the test results shown in Table 6, both the PLM results show that all of the retention times tested converted gypsum to calcium carbonate with a percent yield of 99-100%.

Conclusions

Using a reactor retention time of 20 minutes in each reactor at 25° C., the stoichiometric percent ratios of gypsum reacting in Reactor No. 1 to Reactor No. 2 of 20%:80%, 80%:20%, 30%:70%, and 70%:30% were tested and showed a 99-100% conversion of gypsum to calcium carbonate. Reducing the retention time to less than 20 minutes in each reactor may produce an incomplete reaction.

Example 9

Excess Aqua Ammonia in Reactor No. 1

Objective: This test was designed to check the use of excess ammonia in Reactor No. 1 by simulating the process shown in FIG. 1. The excess aqua ammonia was added to prevent loss of carbon dioxide due to foaming.

Feed Materials: Same as described in the Retention Time tests of Example 6.

Process Constant Parameters

While simulating the process in FIG. 1 for this test, the pH was monitored and remained between 8.1 and 9.1. A retention time of 20 minutes was used in each reactor and the reactions were designed for a 50% reaction of gypsum in each reactor. Aqua ammonia was added initially in Reactor No. 1. Additional aqua ammonia to prevent foaming was needed only in Reactor No. 2. The temperature of the slurry was not monitored during the process and was not controlled with any addition or removal of heat.

Procedures:

The test simulated the process shown in FIG. 1 by making two runs through the process. Run 1 was designed to produce an Ammonium Sulfate/Ammonium Carbonate Solution (18) from Reactor No. 2 (11) to use in Reactor No. 1 of Run 2. The flow of materials in both Runs are similar to the flows used in the Retention Time tests.

Extra Aqua Ammonia Run 1
1) All solutions were prepared as previously described in the Retention Time Tests.
2) 175 g of acid washed gypsum as described in the Retention Time Tests was added to a 1 L beaker with serving as Reactor No. 1 in FIG. 1.
3) The stoichiometric amounts of up to 33% ammonium carbonate and up to 36% ammonium sulfate that would be the amounts related to a 50% reaction of gypsum was added to the beaker. The weights of each were calculated as described in the Retention Time Test. Also, 19.7 g of 29% aqua ammonia was added.
4) The slurry was mixed for 20 minutes, and no foaming was seen during the process.

5) The Calcium Carbonate and Gypsum Cake was filtered, and a 1 g sample was collected. A 50 mL sample of the resulting Ammonium Sulfate Solution Product was also saved.
6) The residual Calcium Carbonate and Gypsum Cake was placed in a 1 L beaker with 100% of the stoichiometric amount of ammonium carbonate needed to react with the starting gypsum. This served as Reactor No. 2.
7) This slurry was mixed for 20 minutes. The slurry began foaming immediately and 5.0 g of aqua ammonia was added to control foaming.
8) After 20 minutes of mixing, the slurry was filtered and the Ammonium Sulfate/Ammonium Carbonate Solution was saved to use in Reactor No. 1 of Run 2. The cake was rinsed with 268 g of Grade 1 water and filtered again. The resulting Calcium Carbonate Product Cake was dried in a 55° C. oven overnight.

Extra Aqua Ammonia Run 2

1) 175 g of acid washed gypsum as described previously was added to a 1 L beaker with the Ammonium Sulfate/Ammonium Carbonate Solution from Reactor No. 2 of Run 1. This served as Reactor No. 1.
2) 20.0 g of 29% aqua ammonia was added to Reactor No. 1 at the start of the process. The slurry was mixed for 20 minutes. No foaming was seen during the process.
3) The resulting Calcium Carbonate and Gypsum Cake was filtered. A 50 mL sample of the filtrate was saved as the Ammonium Sulfate Solution Product. A 1 g sample of the Calcium Carbonate and Gypsum Cake was collected. The residual Calcium Carbonate and Gypsum Cake was placed in a 1 L beaker with a 100% stoichiometric amount of ammonium carbonate needed to react with the starting gypsum. This served as Reactor No. 2.
4) This slurry was mixed for 20 minutes. Initially, slight foaming that quickly dissipated on its own occurred. No aqua ammonia was added.
5) After 20 minutes of mixing, the slurry was filtered, rinsed with 268 g of Grade 1 water and filtered again. The resulting Calcium Carbonate Product Cake was dried in a 55° C. oven overnight.

Results

The product Calcium Carbonate Product Cake from Run 2 was analyzed by polarized light microscopy (PLM) to check the crystal size, morphology, and completeness of reaction.

TABLE 7

PLM Analysis of Calcium Carbonate Product

| Sample ID # | Description | PLM Summary | Estimated Residual Gypsum Observed Optically | Optically Estimated % Conversion |
|---|---|---|---|---|
| SCP122 | Extra Aqua Ammonia Run 2 | This sample is estimated to be ~2/3 vaterite as agglomerates of spherulites. These spherulites range up to 7µ in size. About 1/3 of this sample is single crystals of calcite up to 6µ in size. | none | 100% |

Conclusions

Referring to the test results shown in Table 7, use of excess aqua ammonia in the first reactor stopped foaming in the reactor. The foaming was also reduced in the second reactor.

Polarized light microscopy (PLM) identified approximately 33% calcite and approximately 67% vaterite in the product.

To neutralize the ammonia added for control of foaming, sulfuric acid may need to be added to the ammonium sulfate product.

Example 10

Calcium Sulfate Hemihydrate Test

Objective: Since gypsum may easily be converted to calcium sulfate hemihydrate with the use of pressure and/or heat, a test was performed to check the use calcium sulfate hemihydrate as a reactant in the partially continuous countercurrent process to produce calcium carbonate and ammonium sulfate.

Feed Material: The materials used are the same as those used for the Retention Time Tests of Example 6, except that Miller gypsum was replaced with Plaster of Paris. Note that Plaster of Paris, is produced by heating gypsum to calcium sulfate hemihydrate according to the reaction: $CaSO_4 \cdot 2H_2O + heat \rightarrow CaSO_4 \cdot 0.5H_2O + 1.5H_2O$ (released as steam).

Process Variable Parameters

Parameters monitored and/or adjusted during the tests include pH, temperature, percent reaction of gypsum in each reactor, and aqua ammonia addition. The pH of the reactions were monitored throughout the reactions. The pH remained between 7.6 and 8.8 with aqua ammonia added as needed to stop any foaming. Temperatures were not monitored or controlled during the reaction, and there was no addition or removal of heat. The tests were designed to produce a 50% reaction of calcium sulfate hemihydrate in each reactor using Plaster of Paris.

Procedure

Preparing Solutions

All solutions were prepared as described in the Retention Time Tests.

Hemihydrate Run 1:

1. 160.0 g of calcium sulfate hemihydrate was mixed with 166.4 g of ammonium carbonate solution (7.97% N) and 175.7 g of ammonium sulfate solution (7.55% N) serving as a synthetic Ammonium Sulfate/Ammonium Carbonate Solution for Reactor No. 1 as shown in FIG. 1. This was mixed in a 1 L beaker for 20 minutes which served as Reactor No. 1. Due to extensive foaming, 19.6 g of aqua ammonia was added.
2. The slurry was filtered and the residual Calcium Carbonate and Gypsum Cake was used in Reactor No. 2. The filtrate was the Ammonium Sulfate Solution Product for Run 1 and a 50 mL sample was saved.
3. The Calcium Carbonate and Gypsum Cake was mixed with 332.9 g of up to 33% ammonium carbonate solution (7.97% N) in a 1 L beaker. This beaker served as Reactor No. 2.
4. The slurry was mixed for 20 minutes. It was then filtered and rinsed with 268 mL of Grade 1 water. The filtrate before rinsing was collected as the Ammonium Sulfate/Ammonium Carbonate Solution for use in Reactor No. 1 of Run 2. The Calcium Carbonate Product Cake collected was dried overnight in a 55° C. oven.

Hemihydrate Run 2:
5. 160.0 g of calcium sulfate hemihydrate was mixed for 20 minutes with the Ammonium Sulfate/Ammonium Carbonate Solution from Run 1 in a 1 L beaker that served as Reactor No. 1.
6. Due to extensive foaming, 19.4 g of aqua ammonia was added during the process.
7. The slurry was filtered and filtrate was the Ammonium Sulfate Solution Product for Run 2. The residual Calcium Carbonate and Gypsum Cake was used in Reactor No. 2.
8. The Calcium Carbonate and Gypsum Cake was slurried with 332.9 g of Ammonium Carbonate Solution in a 1 L beaker serving as Reactor No. 2. This slurry was mixed for 20 minutes with no foaming during the process.
9. The slurry was then filtered and rinsed with 260 mL of Grade 1 water. The resulting Calcium Carbonate Cake was dried overnight in a 55° C. oven.

Results

The Run 2 Calcium Carbonate Product Cake was evaluated by polarized light microscopy. The results are presented below.

SCP-127 Run 2 Calcium Carbonate Product Cake

The calcium sulfate hemihydrate has converted to <1-2µ crystals of calcium carbonate. No residual calcium sulfate hemihydrate was identified.

Analysis of Results

The conversion of the calcium sulfate hemihydrate to calcium carbonate was found by PLM; and no residual calcium sulfate hemihydrate was identified, indicating a complete reaction of the calcium sulfate hemihydrate to calcium carbonate.

Conclusions

The partially continuous countercurrent process using calcium sulfate hemihydrate demonstrated 100% conversion to produce calcium carbonate and ammonium sulfate. The crystal size of the calcium carbonate product produced was up to 2µ. The use of calcium sulfate hemihydrate avoids some of the water that dilutes the ammonium sulfate product.

Example 11 pH of 9.0 Maintained with Aqua Ammonia Addition

Objective: This test was designed check the effects of elevated pH on the calcium carbonate product of the partially continuous countercurrent process by simulating the process shown in FIG. 1 while adding aqua ammonia throughout the process to maintain a pH of approximately 9.0 in both reactors.

Feed Materials: Same as described in the Retention Time tests in Example 6.

Procedures

During this test, aqua ammonia was continually added to each reactor shown in FIG. 1 to maintain a pH of approximately 9.0. The retention time tested was 20 minutes in each reactor with a 50% reaction of gypsum in each which is favored due to the filtration considerations mentioned in the Retention Time Tests of Example 1. The temperature throughout the process ranged from 20° C. to 45° C. The test was run only once with the starting solution in Reactor No. 1 being a 50%:50% stoichiometric mix of ammonium carbonate and ammonium sulfate to simulate the solution that normally is Ammonium Sulfate/Ammonium Carbonate Solution from Reactor No. 2 of the process shown in FIG. 1.

Steps of the Test:
1) All solutions were prepared as previously described in the Retention Time Tests.
2) 175 g of acid washed Miller gypsum (prepared as described in the retention time tests) was added to a 1 L beaker serving as Reactor No. 1 in FIG. 1 with 20 mL of 29% aqua ammonia (15.8 g) and a 50% stoichiometric amount of up to 36% ammonium sulfate. After mixing the slurry, a 50% stoichiometric amount of up to 33% ammonium carbonate was added. The weights of each were calculated as described in the Retention Time Test.
3) The slurry was mixed for 20 minutes. During the course of the reaction, an additional 16.0 g of 29% aqua ammonia was added to maintain the pH of the reaction at 9.0. No foaming was seen during the process.
4) The Calcium Carbonate and Gypsum Cake was filtered and placed in a 1 L beaker with 100% of the stoichiometric amount of ammonium carbonate needed to react with the starting gypsum. This served as Reactor No. 2.
5) The slurry was mixed for 20 minutes while adding 54.4 g of 29% aqua ammonia throughout to maintain a pH of 9.0.
9) After 20 minutes of mixing, the slurry was filtered, rinsed with 268 g of Grade 1 water and filtered again. The resulting filter cake was dried in a 55° C. oven overnight.

Conclusions

The product was analyzed by polarized light microscopy and no residual gypsum was present, indicating a 100% conversion of gypsum to calcium carbonate and ammonium sulfate. The solid product was made up of submicroscopic crystalline calcium carbonate.

Example 12

Anhydrous Calcium Sulfate Test

Objective: This test checks the viability of using anhydrous calcium sulfate in the partially continuous countercurrent process by simulating the process shown in FIG. 1 using Anhydrous Calcium Sulfate in place of Gypsum Cake (6).

Feed Material: Same as Retention Time Tests of Example 6, except that Miller gypsum was replaced with reagent grade anhydrous calcium sulfate that was ground to −100 mesh and assumed to have no moisture content.

Process Variable Parameters

The pH and temperature were monitored throughout the test and ranged between 6.8 to 8.9 and 26° C. to 45° C. respectively. The test was designed to simulate the process shown in FIG. 1 and to produce 50% of the reaction of the anhydrous calcium sulfate in each reactor and a 20 minute retention time which is favored due to the filtration considerations mentioned in the Retention Time Tests of Example 6.

Procedure

Unlike the Retention Time Tests of Example 6, only Run 1 was performed using a simulated 50:50 stoichiometric mixture of Ammonium Sulfate/Ammonium Carbonate Solution.

1) All solutions were prepared as described in the Retention Time Tests.
2) 126.6 g of reagent grade anhydrous calcium sulfate (to replace the Gypsum Cake (6) in FIG. 1) was mixed with 162.1 g of ammonium carbonate solution (8.05% N) and 178.1 g of ammonium sulfate solution (7.33% N) in a 1 L beaker for 20 minutes. This beaker served as Reactor No 1 of FIG. 1. Due to foaming, 11.3 g of 29% aqua ammonia was added.
3) The slurry was filtered and the residual calcium carbonate and anhydrous calcium sulfate cake (which is labeled Calcium Carbonate and Gypsum Cake (10) in FIG. 1) was used in Reactor No. 2. The filtrate was the Ammonium Sulfate Solution Product. A 50 mL sample of this filtrate was collected and saved. A 1 g sample of the Reactor No. 1 cake was also collected.
4) The cake from Reactor No. 1 was mixed with 324.3 g of ammonium carbonate solution (8.05% N), representing a 100% stoichiometric amount of ammonium carbonate, in a 1 L beaker. This beaker served as Reactor No. 2.
5) The slurry was mixed for 20 minutes. It was then filtered and rinsed with 268 mL of Grade 1 water and filtered again. The cake collected was dried overnight in a 55° C. oven.

Results

The Calcium Carbonate Product Cake was evaluated by polarized light microscopy (PLM) to identify the completeness of reaction by visually estimated any unreacted residual anhydrous calcium sulfate. PLM was also used to measure the crystal size. The results are presented below.

SCP-138 Anhydrous Calcium Sulfate Test Calcium Carbonate Product Cake

The bulk fraction (>95% by weight) of this sample is agglomerates of <1 to 1μ spheres of vaterite.

Analysis of Results

Since no residual anhydrous calcium sulfate was identified in the sample, there was a 100% conversion of anhydrous calcium sulfate to calcium carbonate. Also, the crystal size of the product was extremely small at <1 to 1μ.

Conclusions

Anhydrous calcium sulfate reacted very quickly and demonstrated 100% conversion in the partially continuous countercurrent process to produce calcium carbonate and ammonium sulfate. Polarized light microscopy showed that the solid product was submicroscopic crystalline calcium carbonate.

Example 13

Approximate 9.4 pH Maintained with Aqua Ammonia Addition

A test like the 9.0 pH Test in Example 11, was performed with additional aqua ammonia used to maintain a pH of approximately 9.4 in both reactors. Like the pH 9.0 Test, this test was performed by simulating the process shown in FIG. 1.

Procedures

During this test, aqua ammonia was continually added to each reactor as shown in FIG. 1 to maintain a pH of approximately 9.4. The temperature throughout the process ranged from 22° C. to 40° C. The test was run only once with the starting solution in Reactor No. 1 being a 50%:50% stoichiometric mix of ammonium carbonate and ammonium sulfate to simulate the solution that normally is Ammonium Sulfate/Ammonium Carbonate Solution from Reactor No. 2 of the process shown in FIG. 1.

Steps of the Test:
1) All solutions were prepared as previously described in the Retention Time Tests.
2) 175 g of acid washed Miller gypsum (prepared as described in the Retention Time Tests) was added to a 1 L beaker serving as Reactor No. 1 in FIG. 1 with 25.1 g of 29% aqua ammonia and a 50% stoichiometric amount of up to 36% ammonium sulfate. After mixing the slurry, a 50% stoichiometric amount of up to 33% ammonium carbonate was added. The weights of each were calculated as described in the Retention Time Test.
3) The slurry was mixed for 20 minutes. During the course of the reaction, an additional 45.2 g of 29% aqua ammonia was added to maintain the pH of the reaction at 9.4.
4) The Calcium Carbonate and Gypsum Cake was filtered and placed in a 1 L beaker with 100% of the stoichiometric amount of ammonium carbonate needed to react with the starting gypsum and 16.3 g of 29% aqua ammonia. This served as Reactor No. 2.
5) The slurry was mixed for 20 minutes while adding 77.6 g of 29% aqua ammonia throughout to maintain a pH of 9.4.
6) After 20 minutes of mixing, the slurry was filtered, rinsed with 268 g of Grade 1 water and filtered again. The resulting filter cake was dried in a 55° C. oven overnight.

Conclusions

The product was analyzed by polarized light microscopy and no residual gypsum was seen, indicating a 100% conversion of gypsum to calcium carbonate and ammonium sulfate. As in the pH 9.0 test, approximately 90% of the solid product was made up of submicroscopic crystalline calcium carbonate.

Thus, from the results of the Example for Reactor Retention Time Tests in Example 6, and the above results, the process of the present invention, particularly as shown in FIG. 1, operates at a pH range of 6.8 to 9.4 to result in 100% or 99-100% yield of product calcium carbonate and ammonium sulfate.

Example 14

Tests Employing FGD Gypsum from Different Sources

The above described Pilot Plant tests and lab tests of Examples 1-5 employed FGD gypsum obtained from Southern Company, Miller Electric Power Generating Plant, Alabama. However, gypsum from all sources have distinctive crystalline characteristics, including distinguishing characteristics between FGD gypsum from individual electric power plants. These characteristics have a direct impact on the reactivity and purity of the gypsum and thus the product yield and purity of products resulting from the processes of the present invention.

Accordingly, the two stage, two reactor process embodiment number 1 of the present invention as shown in FIG. 1 was tested using FGD gypsum from power plants other than the Miller Plant. Including Plant Miller, FGD gypsum was tested from the following five power plants:

1) Southern Company, Miller Electric Power Generating Plant, Quinton, Ala. (Plant Miller)
2) Southern Company, Gorgas Electric Generating Plant, Parrish, Ala. (Plant Gorgas)
3) Southern Company, Bowen Power Plant in Euharlee, Ga. (Plant Bowen)
4) Southern Company, Crist Generating Plant, Pensacola, Fla. (Plant Crist)
5) Southern Company, Wansley Power Plant in Carrollton, Ga. (Plant Wansley)

Tests of employing different FGD gypsum in the two reactor process of the present invention were the following:
a) two pilot plant tests using FGD gypsum from Plant Gorgas; and
b) three laboratory tests using FGD gypsum from Plant Bowen, Plant Crist, and Plant Wansley.

The following tests were performed to assure that the multistage, partially continuous counter current process for conversion of gypsum and ammonium carbonate to calcium carbonate and ammonium sulfate would perform satisfactorily using gypsum of several crystal types.

Figure 3:
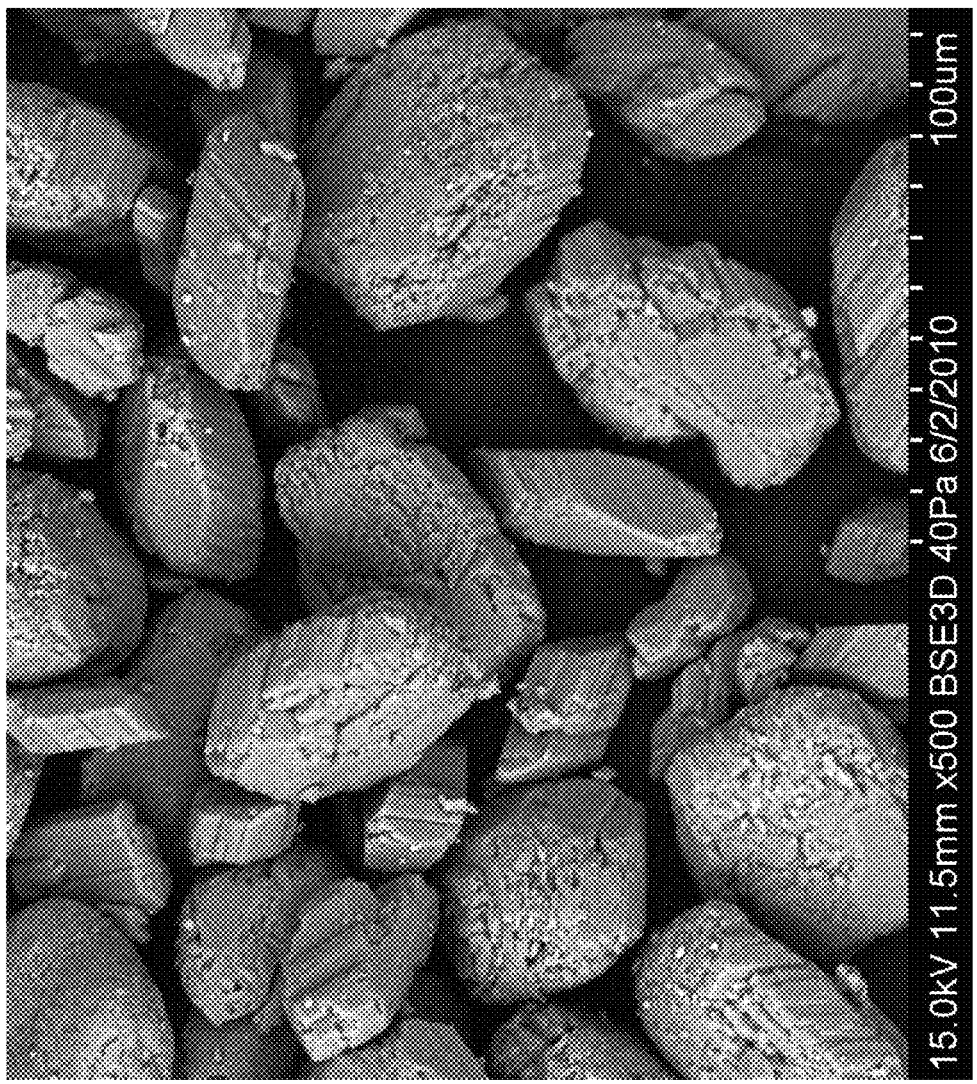
FIG. 3 shows Plant Gorgas FGD gypsum crystals, Scanning Electron Microscope (SEM) Image at 500×.
Figure 4:
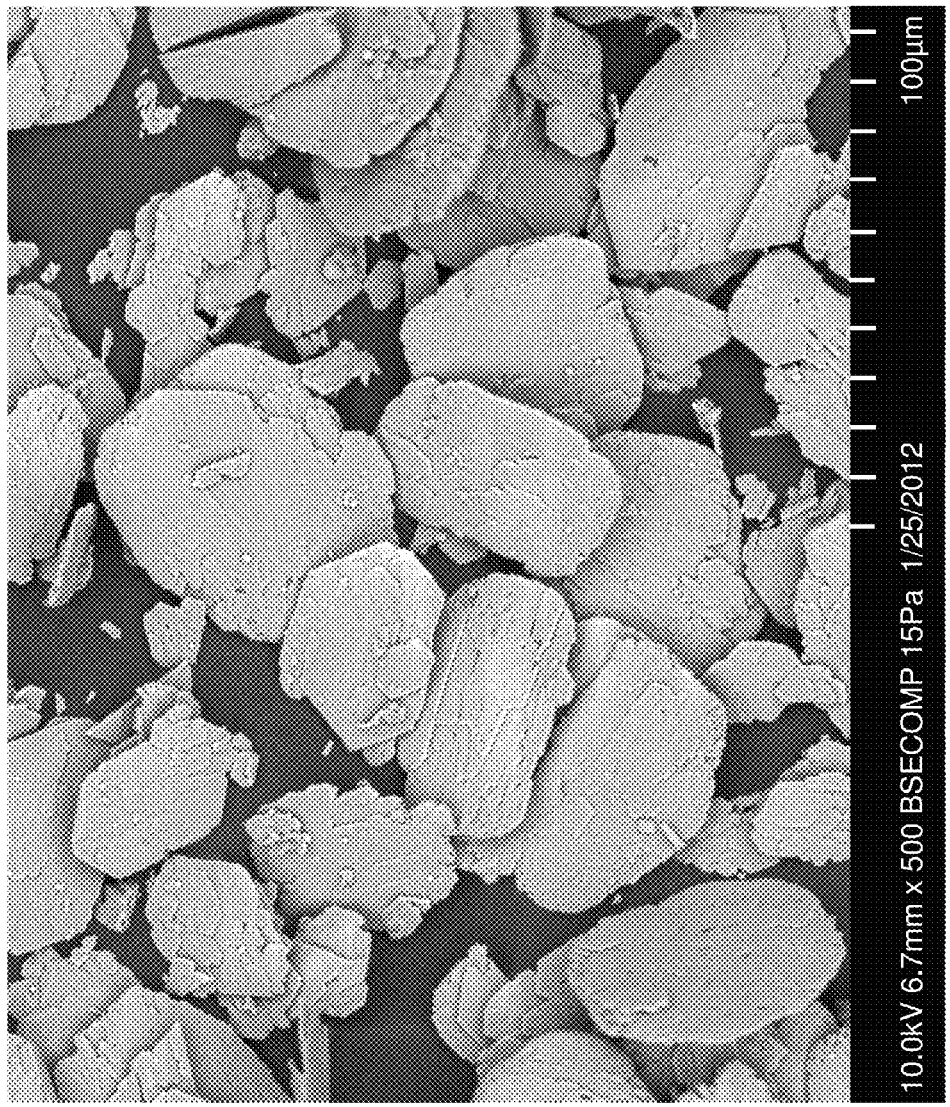
FIG. 4 shows Plant Miller FGD gypsum crystals, SEM Image at 500×.

TEST I—Gorgas) FGD Gypsum from the Plant Gorgas has a thicker crystalline form (see FIG. 3) than the gypsum produced at Plant Miller (see FIG. 4). With the following variations, the test was as performed and described in the above section entitled, Pilot Plant Gypsum Conversion Countercurrent Batch Process Equipment and Procedure as exemplified in the section entitled, Pilot Plant Tests For Two Reactor Process, which used gypsum from Plant Miller:
1) The gypsum was acid washed with 1% sulfuric acid, then washed with water.
2) The filtrate from Reactor 2 which was reclaimed by the last belt filter was fed to Reactor 1. Because analysis showed that the filtrate was weak in ammonia, anhydrous ammonia was fed to Reactor 1 for three minutes at a flow rate of 2.21 scfm (standard cubic feet per minute). The resulting reactor temperature varied from 100 to 110° F.
3) A reaction time of 20 minutes was used in each reactor.
4) In Reactor 2, anhydrous ammonia was added at a rate of 2.17 scfm for three minutes to build the ammonium strength up to a normal level. The resulting temperature in Reactor 2 was 100 to 105° F.

The resulting product was 98.7% calcium carbonate with 1.2% impurities such as magnesium oxide, silicon oxide, aluminum oxide and others. The process operated successfully to produce 100% conversion to calcium carbonate not including impurities and thus stoichiometric ally, 100% to ammonium sulfate.

TEST II—Gorgas) In a second test using FGD gypsum from Plant Gorgas, the operation was in the pilot plant and the same as above except no anhydrous ammonia was added. However, some extra ammonium carbonate was added to Reactor 2 because the ammonia level in the ammonium carbonate fed to Reactor 2 was low. Reactor 1 was operated at a temperature of 113° F. and Reactor 2 temperature varied from 100 to 105° F. Again each reactor was operated for 20 minutes. The resulting product was 98.3% calcium carbonate with 1.7% impurities primarily consisting of magnesium, silicon and aluminum compounds as in the previous example (TEST I). The process operated successfully to produce 100% conversion to calcium carbonate not including impurities and thus stoichiometrically, 100% to ammonium sulfate.

TEST III—Bowen) Using FGD gypsum from Plant Bowen (see FIG. 5), a lab test was performed to determine process efficiency. The gypsum was tested as previously described above for laboratory tests in the section, entitled Laboratory Gypsum Conversion Countercurrent Batch Process Equipment and Procedure which used gypsum from Plant Miller.

The FDG gypsum was washed with a 5% solution of sulfuric acid and then water washed before being fed to Reactor 1. A fresh solution of ammonium carbonate was fed to Reactor 2 as would be needed to supply 100% of the stoichiometric requirement for reaction with the incoming gypsum. To ensure a 50% reaction of the gypsum in each reactor (Reactor 1 and Reactor 2), a fresh ammonium carbonate/ammonium sulfate solution with 50% of the stoichiometric requirement of ammonium carbonate was fed to Reactor 1 along with the incoming gypsum. This allowed both Reactor 1 and Reactor 2 to operate in simulation of a partially continuous countercurrent process wherein Reactors 1 and 2 were both operating at a 100% stoichiometric excess, the excess being gypsum in Reactor 1 and the excess being ammonium carbonate in Reactor 2. The reaction time was 20 minutes in each reactor and 120° F. was the temperature in each reactor. The final product contained 97.1% calcium carbonate with 2.9% being impurities consisting primarily of magnesium, silicon and aluminum compounds. The process operated successfully to produce 100% conversion to calcium carbonate not including impurities and thus stoichiometrically, 100% to ammonium sulfate.

TEST IV—Crist) Using gypsum from Plant Crist (see FIG. 6) a lab test was performed to determine process efficiency. The test was performed under the same conditions as the Plant Bowen gypsum described above (TEST III). The final product was 96.6% calcium carbonate with 3.4% impurities consisting mainly of magnesium, silicon, and aluminum compounds. The process operated successfully to produce 100% conversion to calcium carbonate not including impurities and thus stoichiometrically, 100% to ammonium sulfate.

TEST V—Wansley) Using gypsum from Plant Wansley (see FIG. 7) a lab test was performed to determine process efficiency. The test was performed under the same conditions as the previous examples using Bowen and Crist gypsums (TESTs III and IV). The final product was 96.9% calcium carbonate with 3.1% impurities consisting mainly of magnesium, silicon, and aluminum compounds. The process operated successfully to produce 100% conversion to calcium carbonate not including impurities and thus stoichiometrically, 100% to ammonium sulfate.

In summary, the results of operating the present two reactor process with different types of gypsum crystals are the following.

Summary of Process Yields and Purities for Converting Gypsum from Various Sources Plant Gorgas: 100% conversion to calcium carbonate and thus also to ammonium sulfate, not including impurities. The resulting product was 98.7% calcium carbonate with 1.2% impurities such as magnesium oxide, silicon oxide, aluminum oxide and others.

Plant Gorgas: 100% conversion to calcium carbonate and thus also to ammonium sulfate, not including impurities. The resulting product was 98.3% calcium carbonate with 1.7% impurities primarily consisting of magnesium, silicon and aluminum compounds and others.

Plant Bowen: 100% conversion to calcium carbonate and thus also to ammonium sulfate, not including impurities. The final product contained 97.1% calcium carbonate with 2.9% being impurities consisting primarily of magnesium, silicon and aluminum compounds.

Plant Crist: 100% conversion to calcium carbonate and thus also to ammonium sulfate, not including impurities.

The final product was 96.6% calcium carbonate with 3.4% impurities consisting mainly of magnesium, silicon, and aluminum compounds.

Plant Wansley: 100% conversion to calcium carbonate and thus also to ammonium sulfate, not including impurities. The final product was 96.9% calcium carbonate with 3.1% impurities consisting mainly of magnesium, silicon, and aluminum compounds.

Plant Miller: 100% conversion to calcium carbonate and thus also to ammonium sulfate, not including impurities. The calcium carbonate content was determined to be 98.8% and impurities (acid insoluble) were determined to be 1.24%.

Characterization of Gypsum Crystals

Figure 5:
FIG. 5 shows Plant Bowen FGD gypsum crystals, SEM Image at 100×.
Figure 6:
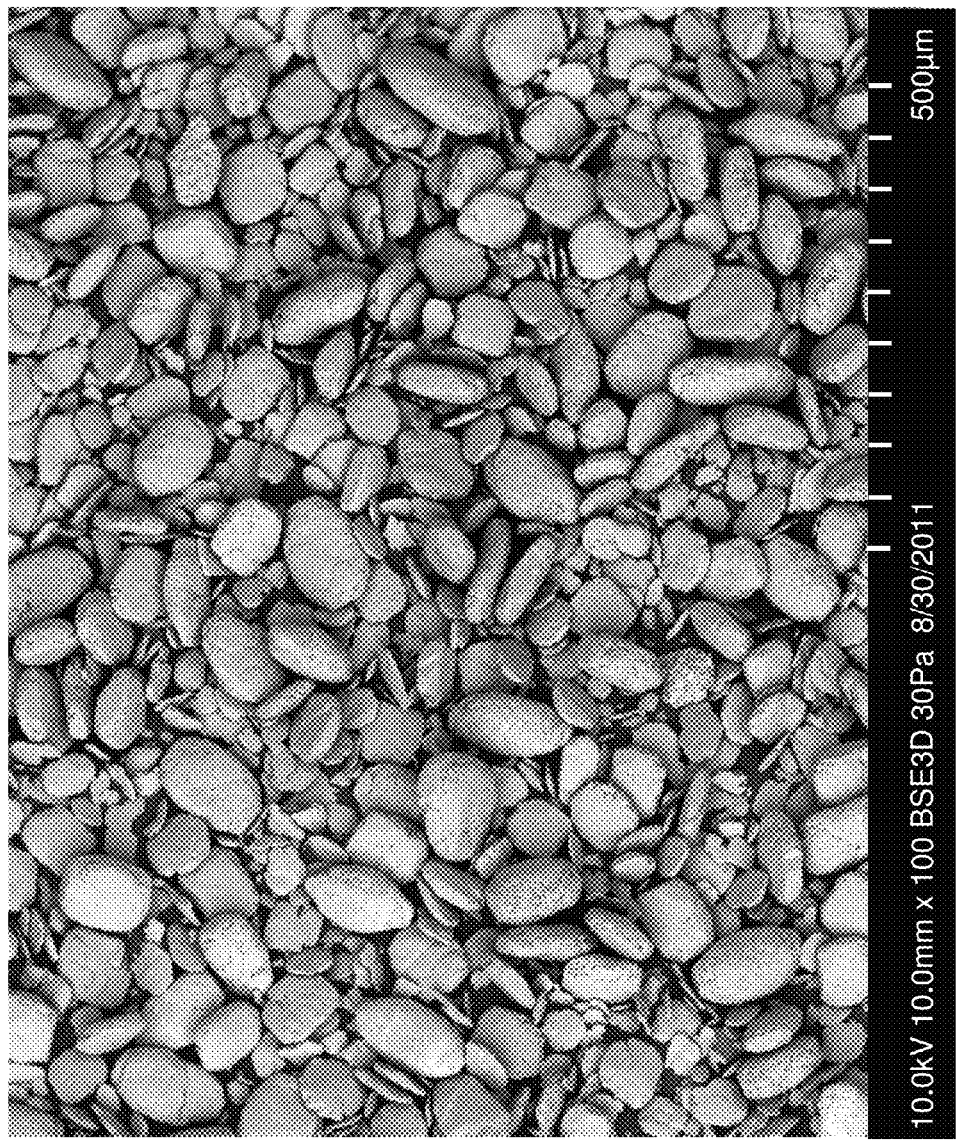
FIG. 6 shows Plant Crist FGD gypsum crystals, SEM Image at 100×.
Figure 7:
FIG. 7 shows Plant Wansley FGD gypsum crystals, SEM Image at 100×.

Samples of FGD gypsum were obtained and microscopically observed from five power plants: Plant Miller, Plant Gorgas, Plant Bowen, Plant Crist and Plant Wansley. Differences in structure were observed between the FGD gypsum crystals from all five plants. The Plant Miller gypsum crystals were observed to be very flat and disc like. The Plant Gorgas gypsum crystals were thicker and more spherical. The Plant Bowen gypsum crystals were longer. The Plant Crist gypsum crystals were thicker and large. The Plant Wansley gypsum crystals were thicker, but also smaller and more uniform in size. Scanning electron microscope observation of samples from each power plant confirmed this difference in form. See FIG. 3 showing Plant Gorgas FGD gypsum crystals, FIG. 4 showing Plant Miller FGD gypsum crystals, FIG. 5 showing Plant Bowen FGD gypsum crystals, FIG. 6 showing Plant Crist FGD gypsum crystals and see FIG. 7 showing Plant Wansley FGD gypsum crystals.

The Plant Miller gypsum crystals were determined to be plate crystals 2×30×30 microns up to 10×100×100 microns. Undissolved dolomite (Ca, Mg, Fe) $CO_3$ constituted 1-5% of the sample up to 60×60×60 microns in size.

The Plant Gorgas gypsum crystals were determined to be prism crystals 30×30×40 microns up to 40×40×80 microns. About 1-5% of the sample was unreacted dolomite (Ca, Mg, Fe) $CO_3$ with size of 2-80 micron particles.

The Plant Crist gypsum crystals were determined to be single crystals uniform in size from about 5×40×50 microns up to 10×80×100 microns. A trace quantity of two unknown compounds was present.

The Plant Bowen gypsum crystals were determined to be single crystals with some twinned, uniform in size with the average size being about 10×50×50 microns, and having size up to about 50×50×30 microns. A trace quantity of two unknown compounds was present.

The Plant Wansley gypsum crystals were determined to be single crystals from 10×50×50 microns to 70×70×300 microns. Most of the crystals were below 10×70×70 microns. The larger crystals were fewer in number, but still represented ~20% of the sample. A trace quantity of two unknown compounds was present but much less abundant than in the Plant Bowen gypsum sample.

The Plant Miller gypsum plate crystals ranged from 2 to 10 microns thick, whereas the Plant Gorgas gypsum crystals were much thicker at 30 to 40 microns thick. The reaction in the present partially continuous countercurrent process occurs on the surface of the gypsum and penetrates the crystals surface. Veneers of calcium carbonate were observed that would form on the surface of the Plant Gorgas gypsum crystals and then break off. Here, the rate limiting step is due to the crystal thickness. Thus, the thicker Plant Gorgas gypsum crystals require deeper penetration of the ammonium carbonate solution employed in the present process. Penetration is not linear because deeper penetration of the solution is increasingly more difficult to achieve unless, as by turbulent flow or using a mixer, the reacted part of the granule is shaken off the remaining particle.

The thicker and more spherical form of the Plant Gorgas FGD gypsum led to the conclusion that the Gorgas gypsum crystals had less surface area and would be less chemically reactive. Conversely, the thin plate form of the Plant Miller FGD gypsum led to the conclusion that Plant Miller gypsum crystals had more surface area and would be more chemically reactive.

Additionally, because the Plant Miller gypsum crystals are flatter, they also settle slower, thus providing more time for chemical reactions to occur.

Thus, in demonstrating the wide effectiveness of the present process in converting various gypsums to ammonium sulfate and calcium carbonate, five different source FGD gypsums have been described. Scanning electron microscope images of the gypsums crystals are shown in FIG. 3, FIG. 4, FIG. 5, FIG. 6, and FIG. 7. The gypsums have different crystalline shapes from large cubical crystals (Plant Gorgas, FIG. 3) to plate crystals (Plant Miller, FIG. 4) and some gypsums contain rod crystals (Plant Bowen, FIG. 5, and Plant Crist, FIG. 6). Although there is some variation in the reactivity of the various FGD gypsums, all reacted quickly under the specific stoichiometric conditions of the present partially continuous, counter-current process. This appears to be the result of the formation of pseudomorphs of calcium carbonate created under severely aggressive ammonium carbonate reaction with the gypsum, especially in the second stage reactor(s) of the multistage (two or more) stage process. In this case the ammonium carbonate is more than 100% excess over that needed to react with the gypsum for most of the time and increases in concentration over that needed, to more than 1000% of full reaction. Evaluation by polarized light microscopy revealed that there are no crusts of produced calcium carbonate attached on the surface of gypsum crystals. Thus, the ammonium can quickly attack the whole crystal. The gypsum does not have to go into solution but is reacted with the ammonium carbonate in a manner which forms porous pseudomorphs of calcium carbonate in place of the original gypsum crystal. A pseudomorph is a mineral or mineral compound that appears in an atypical form (crystal system), resulting from a substitution process in which the appearance and dimensions remain constant, but the original mineral is replaced by another. Because of this action and the results of the tests using these different crystals of gypsum varying in size and shape, the same high reactivity can be expected with non FGD gypsum crystals varying in makeup from natural gypsums to phosophogypsum and others.

Example 15

Tests of Partially Continuous Countercurrent Process to Convert Phosphogypsum to Calcium Carbonate and Ammonium Sulfate The two stage, two reactor process of Embodiment 1, as shown in FIG. 1, was tested using gypsum from acid treatment of phosphate rock. Such treatment of phosphate rock is typical in producing phosphogypsum.

Process Test Using Phosphogypsum Sample No. 1

Objective: This test was to determine the level of conversion of phosphogypsum to calcium carbonate and stoichiometrically, to ammonium sulfate, by simulating the partially continuous countercurrent process as shown in FIG. 1. The phosphogypsum Sample 1 was obtained from Idaho, United States.

Procedure

The test was performed as one run through the process to simulate the process shown in FIG. 1, starting with fresh acid washed phosphogypsum in Reactor No. 1. The solution used in Reactor No. 1 was a mixture of 36% ammonium sulfate solution with ammonium carbonate solution made in the pilot plant described in Examples 3 and 4. Because of possible unknown contaminants, excess ammonium carbonate solution was used in each reactor.

Details of the test procedure are listed below:
1. Up to 36% ammonium sulfate solutions were made as described in the Retention Time Tests of Example 6.
2. 175 g of phosphogypsum (19% moisture) was place in a 2 L beaker and washed with a 1% sulfuric acid solution (including the moisture in the gypsum) that was prepared by adding 3.92 mL of concentrated sulfuric acid to 354.8 mL of Grade 1 water. This slurry was mixed for 20 minutes then filtered. This phosphogypsum acid wash filtrate was collected for testing.
3. The residual cake was then rinsed with 500 mL of Grade 1 water for about 5 minutes and filtered again. This phosphogypsum acid wash water was collected for testing.
4. An approximately 1 g sample of the acid washed phosphogypsum cake was collected. The residual cake served as the Gypsum Cake shown in FIG. 1.
5. 186.7 g of the 36% ammonium sulfate solution and 135.6 g of the up to 33% ammonium carbonate solution/ammonium bicarbonate was used to simulate the Ammonium Sulfate/Ammonium Carbonate Solution as shown for Reactor No. 1 of FIG. 1. LECO analysis of the ammonium carbonate solution was 5.26% C and 10.75% N and therefore based on nitrogen being the limiting reactant this and accepted methods, this 135.6 g was sufficient to equal a 63% stoichiometric amount of ammonium carbonate/ammonium bicarbonate to react with the starting gypsum.
6. This solution was placed with the Gypsum Cake in a 2 L beaker serving as Reactor No. 1 and mixed for 20 minutes.
7. The slurry was filtered and the phosphogypsum Reactor No. 1 liquid filtrate was collected as the Ammonium Sulfate Solution Product. An approximately 1 g sample of the Calcium Carbonate and Gypsum Cake was collected for testing.
8. The residual Calcium Carbonate and Gypsum Cake was placed in a 2 L beaker serving as Reactor No. 2. A slurry was made using 271.3 g of Ammonium Carbonate Solution as described above. This represented an approximately 125% stoichiometric amount of ammonium carbonate/ammonium bicarbonate solution as compared to the starting gypsum.
9. The slurry was mixed for 20 minutes and then filtered. This Ammonium Sulfate/Ammonium Carbonate Solution was collected for testing.
10. The cake was then rinsed with 500 mL of Grade 1 (ASTM (American Society for Testing and Materials) laboratory grade water) water and this final wash was collected for testing. The residual Calcium Carbonate Product Cake was dried overnight in an oven 100° C.

Results

The Calcium Carbonate Product Cake from Reactor No. 2 was analyzed by polarized light microscopy and showed that 95% of the calcium carbonate in the sample was present as 3-5 micron crystals and that no residual gypsum was present.

In addition, samples from the process were tested for uranium. The results for uranium are presented in Table 6.

TABLE 8

Uranium Test Results of Sample No. 1

| Sample Identification | Uranium |
|---|---|
| Phosphogypsum Raw Cake | 17 mg/kg |
| Phosphogypsum Acid Wash Filtrate | 2200 µg/L |
| Phosphogypsum Acid Wash Water | 200 µg/L |
| Ammonium Sulfate Product | 250 µg/L |
| Calcium Carbonate and Gypsum Cake | 6.3 mg/kg |
| Ammonium Sulfate/Ammonium Carbonate Solution | 400 µg/L |
| Calcium Carbonate Product Cake Wash Water | 220 µg/L |
| Calcium Carbonate Product Cake | 5.5 mg/kg |

Conclusion

Polarized light microscope analysis showed that the phosphogypsum reacted to give a 100% conversion of phosphogypsum to calcium carbonate.

With reference to Table 8, the radiological test results show that the acid wash step of the process washed out a significant amount of the uranium from the phosphogypsum. This indicates that the uranium levels can be successfully controlled by the process in making both process conversion products of ammonium sulfate and calcium carbonate. The acid wash step of the process removed 40 to 75% of the uranium in the gypsum raw cake.

Process Tests Using Phosphogypsum Samples 2 and 3

Objective: Tests were performed to determine the completeness of reaction simulating the partially continuous countercurrent process illustrated in FIG. 1. Tests of the process used two different samples of gypsum produced in China as a byproduct of the production of phosphorite for the production of fertilizer. This gypsum resulted from acid treatment of phosphorite which is a phosphate rock.

Gypsum Sample No. 2 was produced in LinShu, ShanDong Province, China and came from a process that decomposes phosphorite by treating with nitric acid to produce nitrate-based fertilizer.

Gypsum Sample No. 3 was produced in Guizhou Province, China by a process that decomposes phosphorite by treating with sulfuric acid to produce phosphate fertilizer. Chemical analyses of Sample 2 and Sample 3 are presented in Table 9.

TABLE 9

Chemical Analysis of Phosphogypsum Samples 1 and 2

| Gypsum | % Total $P_2O_5$ | % Soluble $P_2O_5$ | % CaO | % $SO_4^{2-}$ | % MgO | % $Al_2O_3$ | % $SiO_2$ | % $Fe_2O_3$ |
|---|---|---|---|---|---|---|---|---|
| Sample No. 2 | 1.12 | 0.05 | 28.48 | 50.92 | 0.02 | 0.04 | 0.29 | 0.05 |

TABLE 9-continued

Chemical Analysis of Phosphogypsum Samples 1 and 2

| Gypsum | % Total $P_2O_5$ | % Soluble $P_2O_5$ | % CaO | % $SO_4^{2-}$ | % MgO | % $Al_2O_3$ | % $SiO_2$ | % $Fe_2O_3$ |
|---|---|---|---|---|---|---|---|---|
| Sample No. 3 | 0.11 | 0.81 | 27.06 | 48.60 | 0.30 | 0.30 | 4.00 | 0.10 |

To simulate the partially continuous countercurrent process illustrated in FIG. 1, two runs were performed on each gypsum. The first run used the correct amount of synthetic Ammonium Carbonate/Ammonium Sulfate Solution to simulate a 50% stoichiometric amount of each based on the weight of the starting gypsum and the % N measured in the solutions. Run 1 was needed to produce the Ammonium Sulfate/Ammonium Carbonate Solution to use in Reactor No. 1 for Run 2. The procedures for each run are described below.

Samples No. 2 and No. 3 Gypsum Test Run 1 Procedure:
1) Up to 33% ammonium carbonate solution and up to 36% ammonium sulfate solution were prepared using reagent grade compounds and DI water. Samples of these solutions were tested by LECO for % N and this value was used to find the weight of the solution for each run in the process as discussed in the Retention Time Tests of Example 6.
2) A 5% solution of sulfuric acid was prepared using 19.5 mL $H_2SO_4$ and 370.5 mL of water. This solution was place in a 2 L beaker with 175.7 g of gypsum and allowed to stir with no added heat for 20 minutes.
3) The slurry was vacuum filtered, washed with 500 mL of Grade 1 water, and filtered again.
4) The gypsum filter cake was placed in a 2 L beaker (Reactor No. 1) with the amount of ammonium carbonate solution and ammonium sulfate solution calculated as discussed before to simulate the stoichiometric 50%:50% Ammonium Sulfate/Ammonium Carbonate Solution that would result from Reactor No. 2 in shown in FIG. 1 for 50% reaction of gypsum in each reactor.
5) The slurry was stirred for 20 minutes without any addition of heat. It was then vacuum filtered, and the Calcium Carbonate and Gypsum Cake was placed in a 2 L beaker (Reactor No. 2) with the 100% stoichiometric amount of ammonium carbonate solution needed to react with the starting gypsum.
6) This slurry was mixed without any addition of heat for 20 minutes.
7) The slurry was vacuum filtered and the filter cake was then rinsed with 500 mL of Grade 1 water, and filtered again. The resulting Calcium Carbonate Product Cake was dried in an oven overnight at 130° F.
8) The Ammonium Sulfate/Ammonium Carbonate Solution collected from Step 7 before rinsing was saved for Run 2 of the test.

Gypsum Sample 2 and Sample 3 Test Run 2 Procedure:
1) The gypsum was acid washed as described in Steps 1-3 above.
2) The gypsum filter cake was placed in a 2 L beaker (Reactor 1) with the Ammonium Sulfate/Ammonium Carbonate Solution from Reactor 2 of Run 1.
3) Steps 5-7 above were followed, and the Calcium Carbonate Product Cake from Step 7 was the final product cake.

Polarized Light Microscopy Results:

The starting gypsum material and the resulting product cakes from Reactor No. 2 were optically evaluated by polarized light microscopy which provides an effective way to directly detect the presence of even small amounts of residual unreacted gypsum in the product. The ability to distinguish the gypsum from the calcium carbonate is due to the difference in the refractive indices of gypsum and calcium carbonate. The results are presented Table 10.

TABLE 10

Polarized Light Microscopy (PLM) Evaluation of Samples No. 2 and No. 3

| Sample Name | PLM Description | Visual Estimate of Residual Gypsum | % Conversion |
|---|---|---|---|
| Sample No. 2 Gypsum | The material is homogenous as coarse blade, twinned crystals of $CaSO_4 \cdot 2H_2O$ up to 25 × 250 × 1500 microns. This material grew slowly to give these coarse, twinned crystals. | *N/A | *N/A |
| Run 2 Calcium Carbonate Product from Sample No. 2 Gypsum | >95% of the calcium carbonate in the sample is vaterite ($CaCO_3$) spherulites that are 2-5µ in diameter and agglomerated into units that are up to 25µ. Some of the coarser pseudomorphs still have $CaSO_4 \cdot 2H_2O$ cores. The residual gypsum is very minor. | <10% | 90-100% |

TABLE 10-continued

Polarized Light Microscopy (PLM) Evaluation of Samples No. 2 and No. 3

| Sample Name | PLM Description | Visual Estimate of Residual Gypsum | % Conversion |
|---|---|---|---|
| Sample No. 3 Gypsum | The bulk fraction (>95% by weight) of the gypsum crystals are large plate crystals of $CaSO_4 \cdot 2H_2O$ usually present as twinned, swallow-tail units up to $20 \times 200 \times 600\mu$. These are well developed, slowly grown crystals. A significant quantity (black fraction) of material is present as amorphous agglomerates up to $500\mu$ and is tentatively identified as carbonaceous material. A trace of quartz is present. | *N/A | *N/A |
| Run 2 Calcium Carbonate Product from Sample No. 3 Gypsum | The >95% of this the calcium carbonate in this sample are crystalline spherulites of vaterite ($CaCO_3$) up to $7\mu$. The carbonaceous material has disintegrated into $1\mu$ particles and cannot be quantified optically. A trace amount of residual gypsum remains. | <2% | 98-100% |

*N/A—not applicable since the sample is the starting gypsum

Test Conclusions:

With reference to the results in Table 10, the completeness of reaction was demonstrated by both Sample No. 2 and Sample No. 3 gypsums using the partially continuous countercurrent process. Polarized light microscopy showed only a minor fraction of unreacted gypsum at the core of the pseudomorphs formed by the reaction. This small fraction requires only an increased retention time or polishing reaction to complete the reaction to 100% conversion.

Process Tests Using Phosphogypsum Samples 4 and 5

Objective: Tests were performed to determine the completeness of reaction simulating the partially continuous countercurrent process illustrated in FIG. 1. Tests of the process used two different samples of gypsum produced in the Krasnodar Region of Russia: Sample No. 4 and Sample No. 5. Both Sample No. 4 and Sample No. 5 gypsums were a product of decomposing phosphate rock using sulfuric acid. Results from chemical analyses and polarized light microscopy (PLM) evaluation of the starting (raw) Sample No. 4 and Sample No. 5 gypsums are presented respectively in Table 11 and Table 12.

TABLE 11

Chemical Analysis of Gypsum Samples No. 4 and No. 5

| Chemical Property | Gypsum Sample No. 4 | Gypsum Sample No. 5 |
|---|---|---|
| Mass fraction of $CaSO_4 \cdot 2H_2O$ expressed as dry dihydrate, % | 97% | 97% |
| Mass fraction of total phosphates expressed as $P_2O_5$, % | 1.0% | 1.0% |
| Mass fraction of water-soluble phosphate expressed as $P_2O_5$, % | 0.2% | 0.1% |
| Mass fraction of water-soluble fluoride compounds expressed as fluorine, % | <0.1 | <0.1 |

TABLE 12

Polarized Light Microscopy Evaluation of Gypsum Samples No. 4 and No. 5

| | PLM Description |
|---|---|
| Gypsum Sample No. 4 | This sample is >95% as twinned rod and plate crystals of $CaSO_4 \cdot 2H_2O$ from $5 \times 10 \times 120\mu$ to $110 \times 100 \times 700\mu$ rods. Up to 4% of the sample is amorphous particles from 5 to $100\mu$ that are in the refractive index range for silica gel. |
| Gypsum Sample No. 5 | The bulk of this sample (>95%) is $CaSO_4 \cdot 2H_2O$ as elongated plate crystals from $2 \times 10 \times 40\mu$ to $10 \times 30 \times 700\mu$. A very minor (<5%) phase is 2-40$\mu$ particles that may be silica gel. |

Procedure: Each of the gypsum Samples No. 4 and No. 5, characterized in Tables 11 and 12, were run through the partially continuous countercurrent process as illustrated in FIG. 1. The same procedures for both Run 1 and Run 2 outlined in the 20 Minute Retention Time Test of Example 6 were followed with the gypsum Samples No. 4 and No. 5 replacing the Miller gypsum in the procedure.

The resulting calcium carbonate product cakes from Run 2 were then analyzed by polarized light microscopy to identify the completeness of the reaction. The results are presented in Table 13.

TABLE 13

Polarized Light Microscopy Evaluation of the Run 2 Calcium Carbonate Product Cake for Gypsum Samples No. 4 and No. 5

| | PLM Description | Optically Estimated % Conversion |
|---|---|---|
| Calcium Carbonate Product from Gypsum Sample No. 4 | This sample comprises soft pseudomorphs of vaterite after gypsum ranging up to $5 \times 30 \times 600\mu$. The entrained <1 to $6\mu$ spherulites of vaterite are mostly in the <1 to $2\mu$ size. | 100% |

TABLE 13-continued

Polarized Light Microscopy Evaluation of
the Run 2 Calcium Carbonate Product
Cake for Gypsum Samples No. 4 and No. 5

| | PLM Description | Optically Estimated % Conversion |
|---|---|---|
| Calcium Carbonate Product from Gypsum Sample No. 5 | This sample is homogenous as vaterite as <1-6µ spherulites. About 7-8% are present in the 5-6µ range. | 100% |

Conclusions

With reference to the results presented in Table 13, the partially continuous countercurrent process worked effectively and quickly to produce a 100% conversion of the gypsum Samples No. 4 and No. 5 to calcium carbonate and ammonium sulfate.

Example 16

Test of Embodiment 3

Three Reactors

Objective: This test simulates the three reactor process of embodiment 3, shown in FIG. 16.
Feed Materials: Same as described in the Retention Time tests
Process Variable Parameters For the test, a 20 minute retention time was used in each reactor. The temperature in the reactors was not controlled and ranged between 20.5° C. and 45° C., and the pH remained between 7.1 and 8.8. As discussed in prior Examples (e.g. Examples 1-4), aqua ammonia was added as needed to prevent foaming. The reaction was performed in three runs to simulate the countercurrent process shown in FIG. 16. The first two runs produced the Ammonium Sulfate/Ammonium Carbonate Solutions for Reactor No. 1 and Reactor No. 2 of Run 3. This Example 16 test was designed to simulate a 40%, 40%, and 20% reaction of gypsum in Reactor No. 1, Reactor No. 2, and Reactor No. 3, respectively.

Referring to FIG. 16, Run 1 of the test started with acid washed Miller Gypsum Cake (6) mixed in Reactor No. 1 (8) with a 40% stoichiometric amount of ammonium carbonate and a 60% stoichiometric amount of ammonium sulfate. A 50 mL sample of the filtrate from Reactor No. 1 was collected as the Ammonium Sulfate Solution Product (19) from Run 1. The Calcium Carbonate and Gypsum Cake (10) from Reactor No. 1 (8) was then mixed in Reactor No. 2 (11) with a 40% stoichiometric amount of gypsum and a 20% stoichiometric amount of ammonium sulfate. The filtrate from Reactor No. 2 (11) was saved to use as the Ammonium Sulfate/Ammonium Carbonate Solution (18) in Reactor No. 1 (8) of Run 2. The Calcium Carbonate and Gypsum Cake (24) from Reactor No. 2 was placed in Reactor No. 3 (22) with a 100% stoichiometric amount of Ammonium Carbonate Solution (12). The filtrate from Reactor No. 3 (22) was saved to use as the Ammonium Sulfate/Ammonium Carbonate Solution (27) for Reactor No. 2 (11) of Run 2. The Calcium Carbonate Product Cake (14) from Reactor No. 3 (22) was washed with water, dried, and saved as the calcium carbonate product from Run 1.

Run 2 of the test started with fresh acid washed Miller Gypsum Cake (6) in Reactor No. 1 (8) mixed with the Ammonium Sulfate/Ammonium Carbonate Solution (18) reserved as the filtrate from Reactor No. 2 (11) of Run 1. Additional ammonium carbonate solution was added to this solution for Run 2 to raise it to a 40% stoichiometric amount. A 50 mL sample of the filtrate from Reactor No. 1 (8) of Run 2 was collected as the Ammonium Sulfate Solution Product (19) for Run 2. The Calcium Carbonate and Gypsum Cake (10) from Reactor No. 1 (8) was then placed in Reactor No. 2 (11) with the Ammonium Sulfate/Ammonium Carbonate Solution (27) from Reactor No. 3 (22) of Run 1. The filtrate from Reactor No. 2 (11) was saved to use as the Ammonium Sulfate/Ammonium Carbonate Solution (18) in Reactor No. 1 (8) for Run 3. The Calcium Carbonate and Gypsum Cake (24) from Reactor No. 2 (11) was placed in Reactor No. 3 (22) with a 100% stoichiometric amount of Ammonium Carbonate Solution (12). The filtrate from Reactor No. 3 (22) was saved to use as the Ammonium Sulfate/Ammonium Carbonate Solution (27) for Reactor No. 2 (11) for Run 3. The Calcium Carbonate Product Cake (14) from Reactor No. 3 was washed with water, dried, and saved as the calcium carbonate product from Run 2.

Run 3 of the test again started with fresh acid washed Miller Gypsum Cake (6) in Reactor No. 1 (8) mixed with the Ammonium Sulfate/Ammonium Carbonate Solution (18) reserved as the filtrate from Reactor No. 2 (11) of Run 2. A 50 mL sample of the filtrate from Reactor No. 1 (8) of Run 3 was collected as the final Ammonium Sulfate Solution Product (19). The Calcium Carbonate and Gypsum Cake (10) from Reactor No. 1 (8) was then placed in Reactor No. 2 (11) with the Ammonium Sulfate/Ammonium Carbonate Solution (27) from Reactor No. 3 (22) of Run 2. The filtrate from Reactor No. 2 (11) was discarded. The Calcium Carbonate and Gypsum Cake (24) from Reactor No. 2 (11) was placed in Reactor No. 3 (22) with a 100% stoichiometric amount of Ammonium Carbonate Solution (12). The filtrate from Reactor No. 3 (22) was discarded. The Calcium Carbonate Product Cake (14) from Reactor No. 3 (22) was washed with water, dried, and saved as the final calcium carbonate product.

Procedures

Calculating the Amounts of Ammonium Sulfate and Ammonium Carbonate to Use for the Test The weight of ammonium carbonate and/or ammonium sulfate to use for each step of the reaction was found based on the measured nitrogen for the respective solutions and the desired stoichiometric amount for that reactor as described previously in the Retention Time Tests of Example 6.

Three Reactor Test Run 1:

1. 175 g of Miller gypsum was acid washed as described in the Retention Time Tests of Example 6.
2. The acid washed gypsum was placed in a 1 L beaker with the calculated amount of fresh up to 33% ammonium carbonate solution for the stoichiometric amount needed to react with 40% of the gypsum and the stoichiometric amount of up to 36% ammonium sulfate solution that would result from 60% of the gypsum having already reacted. This beaker served as Reactor No. 1 (8) shown in FIG. 16.
3. The slurry was mixed on a stir plate for 20 minutes while measuring the temperature and pH every 2 seconds. Any foaming was dissipated by spraying aqua ammonia into Reactor No. 1 (8).
4. After 20 minutes of reacting, the slurry was filtered and a 50 mL sample of the Ammonium Sulfate Solution Product (19) was collected.

5. For Reactor 2 (11), fresh up to 33% ammonium carbonate solution containing 40% stoichiometric of ammonium carbonate (calculated as before) and 20% stoichiometric of ammonium sulfate was added to a beaker. The residual Calcium Carbonate and Gypsum Cake (10) from Reactor No. 1 (8) was added to this mixture.
6. The resulting slurry was mixed on a stir plate for 20 minutes and foaming began immediately, requiring the addition of aqua ammonia.
7. The slurry was filtered by Buchner funnel, and the filtrate from Reactor No. 2 (11) was saved as the Ammonium Sulfate/Ammonium Carbonate Solution (18) for Reactor No. 1 (8) of Run 2.
8. For Reactor No. 3 (22), fresh up to 33% ammonium carbonate solution containing 100% stoichiometric of ammonium carbonate was added to a beaker with the Calcium Carbonate and Gypsum Cake (24) from Reactor No. 2 (11).
9. The resulting slurry was mixed on a stir plate for 20 minutes. No foaming was observed.
10. The slurry was filtered by Buchner funnel, and the resulting Run 1 Calcium Carbonate Product Cake (14) was rinsed with 268 mL of Grade 1 water, filtered and dried over night at 55° C. The filtrate (before rinsing) from Reactor No. 3 (22) was saved as the Ammonium Sulfate/Ammonium Carbonate Solution (27) for Reactor No. 2 (11) of Run 2.

Three Reactor Test Run 2:
1. 175 g of Miller gypsum was acid washed as described previously.
2. The washed and filtered gypsum was placed in a 1 L beaker with the Run 1 Ammonium Sulfate/Ammonium Carbonate (18) and an additional 126.4 g of ammonium carbonate solution was added to ensure a 40% stoichiometric amount of ammonium carbonate. This beaker served as Reactor No. 1 (8).
3. The slurry was mixed on a stir plate for 20 minutes while measuring the temperature and pH every 2 seconds. Any foaming was dissipated by spraying aqua ammonia into the reactor.
4. After 20 minutes of reacting, the slurry was filtered, and the filtrate was the Ammonium Sulfate Solution Product (19) for Run 2. A 50 mL sample was collected. The residual Calcium Carbonate and Gypsum Cake (10) was used in the Reactor No. 2 (11).
5. For Reactor No. 2 (11), the Ammonium Sulfate/Ammonium Carbonate Solution (27) from Run 1 was added to a beaker with the residual cake from Reactor No. 1 (10).
6. The resulting slurry was mixed on a stir plate for 20 minutes. Any foaming was stopped by spraying aqua ammonia into Reactor No. 2 (11).
7. The slurry was filtered by Buchner funnel. The Calcium Carbonate and Gypsum Cake from Reactor No. 2 (24) was used in Reactor No. 3 (22). The filtrate from Reactor No 2 (11) was saved as Ammonium Sulfate/Ammonium Carbonate Solution (18) for Run 3.
8. For Reactor No. 3 (22), fresh up to 33% ammonium carbonate solution containing 100% stoichiometric of ammonium carbonate needed to react with the starting gypsum was added to a beaker with the residual cake from Reactor No. 2 (11).
9. The resulting slurry was mixed on a stir plate for 20 minutes. No foaming was observed.
10. The slurry was filtered by Buchner funnel, and the filtrate was saved as the Ammonium Sulfate/Ammonium Carbonate Solution (27) for Run 3. The resulting Run 2 Calcium Carbonate Product Cake (14) was rinsed with 268 mL of Grade 1 water, filtered and dried overnight at 55° C.

Three Reactor Test Run 3:
1. 175 g of Miller gypsum was acid washed as described previously.
2. The washed and filtered gypsum was placed in a 1 L beaker with the Run 2 Ammonium Sulfate/Ammonium Carbonate Solution (18). This beaker served as Reactor No. 1 (8).
3. The slurry was mixed on a stir plate for 20 minutes while measuring the temperature and pH every 2 seconds. Any foaming was dissipated by spraying aqua ammonia into the reactor.
4. After 20 minutes of reacting, the slurry was filtered, and the filtrate was the final Ammonium Sulfate Product Solution (19). A 50 mL sample was collected.
5. For Reactor No. 2 (11), the Run 2 Ammonium Sulfate/Ammonium Carbonate Solution (27) was added to a beaker with the residual Calcium Carbonate and Gypsum Cake (10) from Reactor No 1 (8).
6. The resulting slurry was mixed on a stir plate for 20 minutes. Any foaming was stopped by spraying aqua ammonia into Reactor No. 2 (11).
7. The slurry was filtered by Buchner funnel, and the residual Calcium Carbonate and Gypsum Cake (24) was used in Reactor No. 3 (22).
8. For Reactor No. 3 (22), fresh up to 33% ammonium carbonate solution containing 100% stoichiometric of ammonium carbonate was added to a beaker with the residual cake from Reactor No. 2 (11).
9. The resulting slurry was mixed on a stir plate for 20 minutes. No foaming was observed.
10. The slurry was filtered by Buchner funnel, and the resulting final Calcium Carbonate Product Cake (14) was rinsed with 268 mL of Grade 1 water, filtered and dried overnight at 55° C.

Results

By polarized light microscopy analysis, the final (Run 3) Calcium Carbonate Product Cake was determined to be homogenous as spherulites of vaterite from <1 to 5µ in diameter. No residual gypsum was identified. Therefore, the process produced a 100% conversion of gypsum to calcium carbonate.

Conclusions

The test demonstrated that the partially continuous countercurrent process with three reactors as shown in FIG. 16 may be used to produce a 100% conversion of gypsum to ammonium sulfate and calcium carbonate.

Example 17

Tests of Embodiment 5

Producing Ammonium Carbonate Directly in Reactors

Objective: These tests was performed to demonstrate the effectiveness of embodiment 5 to produce ammonium carbonate directly in the reactors of the partially continuous countercurrent process and efficiently convert gypsum to calcium carbonate and ammonium sulfate with very high yield. This was accomplished by simulating the process shown in FIG. 15. FIG. 15 replicates the two stage, two reactor process shown in FIG. 1 with the changes necessary to implement embodiment 5.

Feed Material:
Miller gypsum (8.3% water)
Sulfuric Acid (mixed to 1% by volume)
Aqua Ammonia (29%)
Anhydrous Ammonia
Carbon Dioxide
Water
  Procedures
  Beaker Test
  For this test, a beaker was used as in the Retention Time Tests. The test began with a simulation of the reaction in Reactor No. 2 (11) of the process shown in FIG. 15 by feeding a simulated Calcium Carbonate and Gypsum Cake (10) for Reactor No. 2 (11) that was created with acid washed Miller gypsum and reagent grade calcium carbonate. The mixture was chosen to represent a 50%:50% stoichiometric mixture of each. This cake is the Calcium Carbonate and Gypsum Cake (10) that would result from a 50% reaction of gypsum in Reactor No. 1 (8) of FIG. 15. Water was added to the solids to create a slurry that was mixed while Ammonia (21) and Carbon Dioxide (12) were sparged in to replace the Ammonium Carbonate Solution added in Reactor No. 2 of the previous Two Reactor process.
  The slurry from Reactor No. 2 (11) was filtered. The Ammonium Sulfate/Ammonium Carbonate Solution (18) filtrate was reserved to be used in Reactor No. 1 (8). The Calcium Carbonate Product Cake (14) was rinsed with water and saved to check by polarized light microscopy.
  The process in Reactor No. 1 (8) was then simulated by using the Ammonium Sulfate/Ammonium Carbonate Solution (18) saved above and adding to it Gypsum Cake (6) that was acid washed Miller gypsum. After the allotted reaction time, the slurry was filtered and a sample of the Ammonium Sulfate Solution Product (19) was collected. The Calcium Carbonate and Gypsum Cake (10) was dried and saved. Anhydrous ammonia and carbon dioxide were sparged only into the Reactor No. 2 to replace the Ammonium Carbonate Solution used in previous tests.
  Steps of the procedure:
  1. 87.5 g of Miller gypsum was acid washed with 1% sulfuric acid as described in previous tests. After filtering, washing, and filtering again; the gypsum was placed in a beaker with 50.9 g of reagent grade calcium carbonate and 236.9 g of Grade 1 water. This beaker served as the Reactor No. 2 shown in FIG. 15.
  2. While stirring, ammonia and carbon dioxide were sparged into the slurry. The carbon dioxide was sparged at a rate of 0.098 g/min. The ammonia flow was set to a visual flow. The gases were allowed to sparge for approximately 3.5 hours. The pH of the solution ranged in value between 10 and 11. According to the flow meter, 12.77 g of carbon dioxide was added.
  3. The slurry was filtered through a polyester filter cloth and the Ammonium Sulfate/Ammonium Carbonate Solution filtrate was stored overnight in an airtight bottle. A 50 mL sample of this solution was collected.
  4. The residual cake was rinsed with 500 mL of water and gave off a strong ammonia smell. The resulting Calcium Carbonate Product Cake was allowed to air dry in the hood overnight and then dried the next day in an oven at 55° C.
  5. The next day, 175 g of Miller gypsum was acid washed as described in previous tests. The filtered and rinsed gypsum was then combined with the Ammonium Sulfate/Ammonium Carbonate Solution saved from Reactor No. 2 above and placed in a 1 L beaker that served as Reactor No. 1.
  6. This slurry was mixed for 20 minutes and showed no foaming. The slurry was filtered and the filtrate was the Ammonium Sulfate Product Solution.
  7. The Reactor No. 1 Calcium Carbonate and Gypsum Cake was dried in an oven overnight at 50° C.

Graduated Cylinder Test
  For this test, a graduated cylinder was used to simulate Reactor No. 2 in the process shown in FIG. 15. By using a graduated cylinder, the height of the slurry was increased which allowed better solubility of the gaseous carbon dioxide and ammonia to improve the reaction to produce ammonium carbonate. Only the reaction in Reactor No. 2 was tested. It follows from producing a complete reaction in Reactor No. 2 by making the ammonium carbonate directly in the reactor that excess ammonium carbonate can be produced in that reactor. If needed ammonium carbonate may also be produced directly in Reactor No. 1.
  To shorten the time needed to simulate the process, part of the ammonia was added at the start as aqua ammonia. The starting Calcium Carbonate and Gypsum Cake for Reactor No. 2 was simulated with a 50%:50% stoichiometric mix of reagent grade calcium carbonate and acid washed Miller gypsum. This cake is the Calcium Carbonate and Gypsum Cake that would result from a 50% reaction of gypsum in Reactor No. 1.

Graduated Cylinder Test
  1. 43.8 g of gypsum was acid washed with 1% sulfuric acid as described in previous tests. After filtering, washing, and filtering again; the gypsum was placed in a 250 mL graduated cylinder with 103 g of water, 20 g of 29% aqua ammonia, and 25.4 g of calcium carbonate.
  2. The mixture was stirred on a magnetic stir plate while ammonia and carbon dioxide gas were sparged into the mixture at rates of 0.0186 g/min and 0.030 g/min respectively.
  3. At approximately one hour into the process, the volume of the slurry had increased from 170 mL to more than 250 mL (with pH probe, temperature probe, and magnetic bar) and the contents were transferred to a 500 mL graduated cylinder. At this time, the flow rates were increased to 0.0216 g/min for ammonia and 0.049 g/min of carbon dioxide.
  4. At 2.5 hours into the process, 45 g of aqua ammonia was added to the beaker due to foaming.
  5. At 6.5 hours, the ammonia was stopped and the carbon dioxide was allowed to continue for another 45 minutes.
  6. The process was then stopped and the slurry was filtered. The cake was rinsed with 500 mL of Grade 1 water. The flowmeters showed that a total of 8.3146 g of ammonia and 25.9721 g of carbon dioxide were added.
  7. The cake was dried in a 55° C. oven overnight.

Results
  Polarized light microscopy was used to check the Calcium Carbonate Product Cakes from the tests as well as the Calcium Carbonate and Gypsum Cake from Reactor No. 1 of the Beaker Test. Polarized light was used because of the ability to visually identify even very small amounts of gypsum in the samples. The results are presented below.
SCP-105 $NH_3/CO_2$ Beaker Test Reactor No. 1 Calcium Carbonate and Gypsum Cake
  This sample is more than 50% $CaSO_4.2H_2O$ crystals up to 40×40×200μ that show no reaction. Less than 50% is soft husks comprising <1 to 3μ spherulites of vaterite. The husks do not contain cores of $CaSO_4.2H_2O$.

SCP-104 Beaker Test Reactor No. 2 Calcium Carbonate Product Cake

Most of this sample is spherulites of vaterite from <1 to 6µ in diameter. Single crystals of calcite range up to 30µ across.

SCP-106 $NH_3/CO_2$ Cylinder Test Reactor No. 2 Calcium Carbonate Product Cake

Most of this sample is calcite crystals up to 25µ. No residual $CaSO_4.2H_2O$ is present.

Note: These tests started with a stoichiometric mix of 50% reagent grade calcium carbonate and 50% gypsum in Reactor No. 2.

Analysis of Results

The Calcium Carbonate and Gypsum Cake from Reactor No. 1 of the Beaker Test showed calcium carbonate was present. The presence of calcium carbonate is evidence that excess ammonium carbonate was made directly in Reactor No. 2 and fed to Reactor No. 1 as Ammonium Sulfate/Ammonium Carbonate Solution.

Since no residual gypsum was found in the Calcium Carbonate Product Cake of the Graduated Cylinder Test, there was 100% conversion of gypsum to calcium carbonate.

Conclusions

The above tests demonstrate the ability to use ammonia and carbon dioxide directly in the reactors of the partially continuous countercurrent process shown in FIG. 15. Based on feed rates and times for the Beaker Test, a complete reaction was not expected. The use of only anhydrous ammonia and carbon dioxide did however demonstrate that calcium carbonate and ammonium sulfate were produced from gypsum by reaction with the reaction product of ammonium carbonate from reacting ammonia with carbon dioxide.

Using the graduated cylinder for the second test demonstrated that completeness of reaction (100% conversion of gypsum to calcium carbonate) is possible if the reaction vessel is of sufficient height to enable high aqueous dissolution of ammonia and carbon dioxide. Adding anhydrous ammonia and carbon dioxide directly in the reactor instead of using the ammonium carbonate/bicarbonate solution helps to avoid some of the water diluting the ammonium sulfate product.

It is understood by those familiar with small-scale gas absorption tests that on a commercial basis, the diameter of the reactor would be much larger and the height of the reactor substantially taller leading to a much better gas absorption on a single pass and therefore shorter retention and reaction times.

Example 18

Reactivity Analysis of the Process Calcium Carbonate Product

Purpose:

To determine how the rate of reaction of calcium carbonate ($CaCO_3$) containing vaterite compares to that of reagent grade calcium carbonate ($CaCO_3$). Reactivity Analysis was performed by the carbon dioxide ($CO_2$) gas method described below. Principle Concept:

The calcium carbonate was reacted with a weak acid in a sealed container. The reaction produced $CO_2$, which was collected and measured. By measuring the amount of time required to produce fixed volumes of $CO_2$, the rate of reaction could be determined.

Equipment:
1. Metal trough
2. 50 mL graduated cylinder
3. 250 mL graduated cylinder
4. Small storage bottle equipped with a removable septum
5. Sample agitator
6. Tygon tubing
7. Stopwatch
8. Glass 90° tube
9. Ring stand and clamps Set up:
1. Fill the metal trough 3/4$^{th}$ full of water.
2. Fill the calibrated cylinder completely full of water and invert with the top of the cylinder beneath the water. Special attention should be given to fully remove any air or gases that may be trapped in the inverted cylinder.
3. Secure the inverted cylinder to a ring stand using a clamp.
4. Secure tubing so that the glass joint is feeding directly under the cylinder. Secure this glass joint in the proper location beneath the calibrated cylinder using a clamp
5. Plug in agitator and place it within range of the septum end of the tubing.

Procedure:
1. Place 1.47 grams of EDTA into the storage bottle.
2. Add 20 mL of $H_2O$.
3. Cap with a rubber septum and agitate for a few seconds. Remove the cap when complete.
4. Weigh 1 gram sample of $CaCO_3$ into a glass weigh funnel.
5. Very quickly transfer the $CaCO_3$ into the storage bottle and cap with the septum connected to the tygon tubing and glass joint.
6. Start the agitator and hold the bottle on the agitator to promote agitation of the mixture.
7. As soon as the first bubble emanates from the glass tube, start the stop watch.
8. Note and record the time at 10, 30, and 70 mL volumes read directly from the calibrated cylinder. If the test is performed correctly, the liquid should be displaced by the carbon dioxide being released during the reaction.
9. Once this data is collected, a graph and chart can be generated comparing the reaction rates of various calcium carbonate samples.

Results:

The results of the above performed reactivity tests are shown in FIG. 14. FIG. 14 shows that the reagent grade calcium carbonate takes longer to produce the same amount of carbon dioxide as the calcium carbonate products made by the two stage, two reactor process of embodiment 1 (FIG. 1) of the present invention, with and without wash of FGD gypsum. In FIG. 14, the "Wash" and "H2O Wash" products were found by polar light microscopy to be high in vaterite. The "Oct. 3, 2014" product was similar in size to the "Wash" and "H2O Wash" products but by polarized light microscopy determined to be calcite. Hence, this test demonstrates that the calcite and vaterite products both react similarly but faster than the reagent grade calcium carbonate due to their smaller size.

Example 19

Storage Effects on Crystallography of Calcium Carbonate

Objective: The purpose of this test was to identify the effects that storage conditions have on the calcium carbonate product from simulating the partially continuous countercurrent process shown in FIG. 1.

Storage Parameters:

For this set of tests, calcium carbonate product was produced in the laboratory and either washed or not washed and dried or not dried before storing according to the list below:

No water wash and stored wet
No water wash and stored dry
Water washed and stored wet
Water washed and stored dry
Ammonium sulfate wash and stored wet
Ammonium sulfate wash and stored dry Procedure:

All of products using a single run with a simulated starting Ammonium Sulfate/Ammonium Carbonate Solution in Reactor No. 1 of FIG. 1 as described in the procedures below.

Step 1—Acid Wash
1. 3.92 mL of sulfuric acid was mixed with 354 mL of Grade 1 water in a 2 L beaker.
2. 175 g of Miller gypsum was added to the sulfuric acid solution. The resulting slurry was mixed for 20 minutes.
3. The slurry was vacuum filtered using the filter cloth from the pilot plant operation.
4. The filter cake was washed with 500 mL Grade 1 water and filtered.

Step 2—Reactor 1
1. The filter cake was placed in a 2 L beaker (representing Reactor No. 1 in FIG. 1). 186.7 g of up to 36% ammonium sulfate solution and 267.86 g of up to 33% ammonium carbonate solution were added while stirring on a hotplate.
2. Anhydrous ammonia was sparged in for 11-30 seconds to dissipate the foam.
3. The slurry was mixed for 20 minutes.
4. The resulting slurry was vacuum filtered.

Step 3—Reactor 2
1. The filter cake from Reactor 1 was placed in a 2 L beaker (representing Reactor 2) with 535.71 g of ammonium carbonate solution. While stirring, foaming occurred and anhydrous ammonia was added for 11-30 seconds using a sparger.
2. The slurry was mixed for 20 minutes, removed, and vacuum filtered.

This procedure was repeated and the final product was either:
a. not washed and stored wet,
b. not washed, dried at 130° F. overnight and stored dry,
c. mixed with 500 mL of water for 20 minutes, filtered, and stored wet,
d. mixed with 500 mL of water for 20 minutes, filtered, and dried at 130° F. overnight and stored dry,
e. mixed with 500 mL of ammonium sulfate (36% solution) for 20 minutes, filtered, and stored wet, or
f. mixed with 500 mL of ammonium sulfate (36% solution) for 20 minutes, filtered, and dried at 130° F. overnight and stored dry.

Polarized Light Microscopy Results

All of the stored samples were analyzed by polarized light microscopy after being stored for 9-10 days and again after being stored one month. The samples that showed no significant change after one month were evaluated again after almost 8 months.

TABLE 14

Polarized Light Microscopy Results (PLM) of Stored Samples of Calcium Carbonate

| Sample Storage Parameters | Date Produced | Date of PLM | Polarized Light Microscopy Results (PLM) |
|---|---|---|---|
| No Water Wash, Stored Wet | Jan. 27, 2015 | Feb. 6, 2015 | Major fraction is single crystals of calcite up to 5 μm in diameter. Spherulites up to 7 μm in diameter of vaterite are a minor component. |
| | | Feb. 27, 2015 | The sample comprises single prismatic crystals of calcite from 2-7 μm. |
| Water Wash, Stored Wet | Jan. 28, 2015 | Feb. 6, 2015 | Essentially homogenous as calcite crystals up to 6 μm in diameter. |
| | | Feb. 27, 2015 | The major fraction of this sample is calcite as 1-7μ single crystals. A few agglomerations of regrown vaterite constitute about 5-10% as intergrown and twinned plate crystals. These vaterite agglomerates range up to 30μ and contain numerous calcite crystals. |
| Ammonium Sulfate Wash, Stored Wet | Jan. 28, 2015 | Feb. 6, 2015 | The bulk is agglomerates of 3-5μ spherulites of 1-2μ crystals of vaterite. A minor fraction has converted to calcite as 1-2μ crystals. |
| | | Feb. 27, 2015 | The major fraction is present as 2-7μ single crystals of calcite. A minor fraction is present as separate agglomerates up to 25μ and contain both calcite and 1-2μ plate and twinned crystals of vaterite as high as 5% of the sample. |
| No Water Wash, Stored Dry | Jan. 28, 2015 | Feb. 6, 2015 | The major to bulk component of the sample is 3-6μ spherulites of 1-2 micron needle crystals of vaterite. Calcite as 2-4μ crystals is a very minor component. |
| | | Sep. 11, 2015 | This sample comprises vaterite as spherulites of radiating, needle crystals up to 5μ in diameter. The bulk weight fraction (95% by weight) is 3-4μ spherulites. |

TABLE 14-continued

Polarized Light Microscopy Results (PLM) of Stored Samples of Calcium Carbonate

| Sample Storage Parameters | Date Produced | Date of PLM | Polarized Light Microscopy Results (PLM) |
|---|---|---|---|
| Water Wash, Stored Dry | Jan. 28, 2015 | Feb. 6, 2015 | This sample is almost homogenous as 6-10µ spherulites of needle crystals of vaterite agglomerated into 10-20µ units. A few single crystals of calcite up to 4µ are present. |
| | | Sep. 11, 2015 | Vaterite spherulites range up to 8µ in diameter but the effective upper size limit is 5µ with the bulk (95% by weight) of the spheres being 3-4µ. |
| Ammonium Sulfate Wash, Stored Dry | Jan. 29, 2015 | Feb. 6, 2015 | This sample is homogenous as 2-5µ spherulites of vaterite made up of needle crystals |
| | | Sep. 11, 2015 | These vaterite spherulites range up to 8µ with an effective upper limit of 5-6µ and a bulk weight fraction (95% by weight) of 3-4µ diameter. |

Conclusions

The following conclusions are based on PLM analyses presented in Table 14:
  b. Samples stored wet convert to calcite in less than a week unless the sample is rinsed with ammonium sulfate.
  a. Ammonium sulfate rinse before wet storage slows the conversion of vaterite to calcite with complete conversion occurring between one week and one month.
  c. Samples stored dry remained mostly vaterite even after almost eight months of storage.

Example 20

Surface Area/Solubility Analysis

Phenolphthalein Method

Purpose:

To demonstrate the differences in particle surface/solubility of various crystalline forms of calcium carbonate ($CaCO_3$) containing vaterite compared to that of reagent grade $CaCO_3$.

Principle Concept:

A calcium carbonate sample was added to water containing a phenolphthalein pH indicator. The reaction produces $CO_3^{2-}$, which increases the pH of the solution. By measuring the amount of time required to change the color of the solution to a dark pink, the rate of dissolution for each sample was determined. Seven trials were performed according to the below procedure with the types of calcium carbonate particles stated in Table 15.

Procedure:
  1. Place 50 mL of $H_2O$ into a 100 mL beaker.
  2. Place 5 drops of 1% phenolphthalein into the water.
  3. Add a stir bar into the beaker and begin stirring the solution.
  4. Weigh 0.1 g of the sample.
  5. Add the sample to the water/indicator solution and monitor the time.
  6. Record the time when the solution reaches the correct hue. A beaker containing a fully solubilized calcium carbonate sample, water, and indicator solution was used as a visual comparison to identify the endpoint.

Results:

The results of the tests are shown in below Table 15. The calcium carbonate product used in Trials 2, 3, 5, and 6 were determined by polarized light microscopy to be 80-90% vaterite and produced a much faster rate of change in pH value indicating fast dissolution rates. The calcium carbonate product used in Trial 7 was determined by polarized light microscopy to be calcite and showed a much slower rate of change in pH value. The reagent grade calcium carbonate showed a rate of pH change even slower than that of the small calcite product. These differences in dissolution rate indicate that the material in Trials 2, 3, 5, and 6 was vaterite because of its higher solubility than calcite.

TABLE 15

Calcium Carbonate Particle Surface Area/Solubility Tests

| Trial | Sample Mass | Time (min:sec) | Types of Calcium Carbonate Particles |
|---|---|---|---|
| 1 | 0.1 g | 1:38 | Reagent grade $CaCO_3$ - Mix Speed unknown |
| 2 | 0.1 g | 0:14 | Jan. 14, 2015 Lab $CaCO_3$ (no wash); majority vaterite |
| 3 | 0.1 g | 0:10 | Jan. 14, 2015 Lab $CaCO_3$ ($H_2O$ wash); majority vaterite |
| 4 | 0.1 g | 0:46 | Reagent grade $CaCO_3$ |
| 5 | 0.1 g | 0:14 | Jan. 14, 2015 Lab $CaCO_3$ ($H_2O$ wash) |
| 6 | 0.1 g | 0:12 | Jan. 14, 2015 Lab $CaCO_3$ ($H_2O$ wash) |
| 7 | 0.1 g | 0:30 | 10/3/14 12:55 PM Lab $CaCO_3$; small calcite |

Example 21

Calcium Carbonate Acid Insolubles Tests

Depending upon the source of the gypsum, the gypsum may have differing chemical impurities. These impurities generally pass through the process of the present invention and are present as impurities in the final product ammonium sulfate and calcium carbonate. The impurities are usually more detrimental when present in the product calcium carbonate because commercial use of the calcium carbonate often requires purer calcium carbonate.

A lab procedure was employed to measure the chemical impurities in product calcium carbonate that are insoluble in dilute hydrochloric acid. Such chemical impurities were determined in the calcium carbonate products made in the above described lab and Pilot Plant tests, for instance in Examples 1-4. The results from determining chemical impurities that are acid insoluble are shown in Table 16.

TABLE 16

Calcium Carbonate Impurities that are Acid Insoluble

| Test Sample Date | Process | Acid Insolubles (% weight of sample) |
|---|---|---|
| 4/24/14 pm | Pilot Plant | 1.24 |
| 6/3/14 | Lab | 1.05 |
| 8/22/14 12:30 pm | Pilot Plant | 0.882 |
| 8/22/14 3:05 pm | Pilot Plant | 0.845 |

The average percent weight of acid insolubles, as impurities, of these samples is 1.00%. These calcium carbonate samples were all produced by the two stage, two reactor process of the present invention, embodiment 1 (FIG. 1) using Plant Miller gypsum. It is assumed that the insolubles would change and increase or decrease in FGD gypsums from other power plants because of the different coal being burned.

The impurities were analyzed using X-ray diffraction and were found to be a mixture of chlorite, kaolinite, k-feldspar, mica, plagioclase, pyrite, quartz, and amorphous material most of which was barium sulfate.

While only a few exemplary embodiments of this invention have been described in detail, those skilled in the art will recognize that there are many possible variations and modifications which may be made in the exemplary embodiments while yet retaining many of the novel and advantageous features of this invention. Accordingly, it is intended that the following claims cover all such modifications and variations.

The invention claimed is:

1. A partially continuous countercurrent flow process for converting gypsum to ammonium sulfate and calcium carbonate comprising the following steps:

separating an aqueous slurry of gypsum to result in a gypsum liquid residue and a gypsum cake;

feeding a flow of reactants being the gypsum cake and a solution of ammonium sulfate and ammonium carbonate into a first reactor for chemical reaction;

stopping the flow of reactants into the first reactor for a retention time selected to achieve a preselected degree of chemical reaction to form an ammonium sulfate solution containing a first precipitate calcium carbonate and a gypsum remnant;

discharging the ammonium sulfate solution containing a first precipitate calcium carbonate and a gypsum remnant;

resuming the flow of reactants into the first reactor;

separating the first precipitate calcium carbonate and gypsum remnant from the ammonium sulfate solution to result in a product ammonium sulfate solution and a remnant cake of first precipitate calcium carbonate and gypsum;

retaining the product ammonium sulfate solution;

feeding a flow of reactants being the remnant cake of first precipitate calcium carbonate and gypsum and ammonium carbonate solution into a second reactor for chemical reaction;

stopping the flow of reactants into the second reactor for a retention time selected to achieve a predetermined degree of chemical reaction to form a second precipitate calcium carbonate and a solution of ammonium sulfate and ammonium carbonate;

discharging the first and second precipitate calcium carbonate and a solution of ammonium sulfate and ammonium carbonate;

resuming the flow of reactants into the second reactor;

separating the first and second precipitate calcium carbonate from the solution of ammonium sulfate and ammonium carbonate to result in a product calcium carbonate cake and a residue solution of ammonium sulfate and ammonium carbonate;

retaining the product calcium carbonate cake; and adding the residue solution of ammonium sulfate and ammonium carbonate to the first reactor.

2. The process of claim 1, wherein the step of separating the aqueous slurry of gypsum to result in first and second gypsum liquid residues and a gypsum cake is accomplished by steps comprising:

filtering an aqueous slurry of gypsum on a filter having two zones, zone A and zone B, wherein zone A the gypsum slurry is filtered resulting in a first gypsum liquid residue and a residual gypsum cake; and transporting the residual gypsum cake on the filter to zone B in which the residual gypsum cake is washed with water to result in a second gypsum liquid residue.

3. The process of claim 1, wherein the step of separating the first and second precipitate calcium carbonate from the solution of ammonium sulfate and ammonium carbonate is accomplished by steps comprising:

filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;

adding the residue solution of ammonium sulfate and ammonium carbonate to one or both of the first and second reactors;

transporting the calcium carbonate cake on the filter to zone B in which the calcium carbonate cake is washed with water to result in a product calcium carbonate cake and a wash water solution of ammonium sulfate and ammonium carbonate;

retaining the product calcium carbonate cake; and feeding the wash water solution of ammonium sulfate and ammonium carbonate to an ammonium carbonate absorber to retain ammonium carbonate.

4. The process of claim 1 further comprising the following steps:

washing the product calcium carbonate cake with water to result in a wash residue solution of ammonium sulfate and ammonium carbonate; and adding the wash residue solution of ammonium sulfate and ammonium carbonate to the first reactor.

5. The process of claim 1 further comprising the following steps:

washing the product calcium carbonate cake with water to result in a wash residue solution of ammonium sulfate and ammonium carbonate; and feeding the wash residue solution of ammonium sulfate and ammonium carbonate to an ammonium carbonate absorption column.

6. The process of claim 1 further comprising the following step:

adding ammonia or ammonium hydroxide to the first reactor and second reactor to reduce foaming.

7. The process of claim 1, wherein the product ammonium sulfate solution contains ammonium sulfate and the product calcium carbonate cake contains calcium carbonate, with ammonium sulfate in a yield of 97 to 100% and calcium carbonate in a yield of 97 to 100%.

8. The process of claim 1, wherein the product ammonium sulfate solution contains ammonium sulfate and the product calcium carbonate cake contains calcium carbonate, with both ammonium sulfate in a yield of 100% and calcium carbonate in a yield of 100%.

9. The process of claim 1, wherein the process has a total retention time of 4 to 60 minutes for 100% yield of product calcium carbonate and product ammonium sulfate.

10. The process of claim 1, wherein the process is conducted at temperatures of 41 to 176° F.

11. The process of claim 1, further including mixing within the first reactor and the second reactor by a mixer selected from the group consisting of impeller mixer, paddle mixer, ultrasonic mixer and homogenizer.

12. The process of claim 1, wherein the separating steps are accomplished by a device selected from the group consisting of belt filter, pan filter, drum filter and centrifuge.

13. The process of claim 1, wherein contaminants are removed from the gypsum by an acid rinse process comprising the steps of
separating the aqueous slurry of gypsum to result in a gypsum liquid residue and a gypsum cake;
rinsing the gypsum cake with an aqueous solution containing sulfuric acid from 0.01 to 10% concentration to result in a purified gypsum cake; and
rinsing the purified gypsum cake with water to remove residual sulfuric acid solution to result in a final purified gypsum cake.

14. The process of claim 13, wherein the gypsum is a phosphogypsum and a contaminant is uranium wherein uranium is removed from the gypsum cake to result in a 40 to 75% reduction of uranium in the gypsum cake.

15. The process of claim 1, wherein the aqueous slurry of gypsum is directly from a $SO_x$ scrubber.

16. A partially continuous countercurrent flow process for converting gypsum to ammonium sulfate and calcium carbonate comprising the following steps:
separating an aqueous slurry of gypsum to result in a gypsum liquid residue and a gypsum cake;
feeding a flow of reactants being the gypsum cake and a solution of ammonium sulfate and ammonium carbonate, selectively into one or both of a first reactor and a second reactor, for chemical reaction;
stopping the flow of reactants into one or both of the first reactor and second reactor for a first reactor retention time and a second reactor retention time both selected to achieve a predetermined degree of chemical reaction in one or both first reactor and second reactor to form an ammonium sulfate solution containing a first precipitate calcium carbonate and a gypsum remnant in one or both first reactor and second reactor;
discharging the ammonium sulfate solution containing a first precipitate calcium carbonate and a gypsum remnant from one or both first reactor and second reactor;
resuming the flow of reactants into one or both first reactor and second reactor;
separating the first precipitate calcium carbonate and gypsum remnant from the ammonium sulfate solution to result in a product ammonium sulfate solution and a remnant cake of precipitated calcium carbonate and gypsum;
retaining the product ammonium sulfate solution;
feeding a flow of reactants being the remnant cake of first precipitate calcium carbonate and gypsum and ammonium carbonate solution, selectively into one or both of a third reactor and a fourth reactor, for chemical reaction;
stopping the flow of reactants into one or both of the third reactor and fourth reactor for a third reactor retention time and a fourth reactor retention time both selected to achieve a predetermined degree of chemical reaction in one or both third reactor and fourth reactor to form a second precipitate calcium carbonate and a solution of ammonium sulfate and ammonium carbonate;
discharging the first and second precipitate calcium carbonate and a solution of ammonium sulfate and ammonium carbonate from one or both third reactor and fourth reactor;
resuming the flow of reactants into one or both third reactor and fourth reactor;
separating the first and second precipitate calcium carbonate from the solution of ammonium sulfate and ammonium carbonate to result in a product calcium carbonate cake and a residue solution of ammonium sulfate and ammonium carbonate;
retaining the product calcium carbonate cake; and
adding the residue solution of ammonium sulfate and ammonium carbonate to one or both first reactor and second reactor.

17. The process of claim 16, wherein the step of separating the aqueous slurry of gypsum to result in first and second gypsum liquid residues and a gypsum cake is accomplished by steps comprising:
filtering an aqueous slurry of gypsum on a filter having two zones, zone A and zone B, wherein zone A the gypsum slurry is filtered resulting in a first gypsum liquid residue and a residual gypsum cake; and
transporting the residual gypsum cake on the filter to zone B in which the residual gypsum cake is washed with water to result in a second gypsum liquid residue.

18. The process of claim 16, wherein the step of separating the first and second precipitate calcium carbonate from the solution of ammonium sulfate and ammonium carbonate is accomplished by steps comprising:
filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;
adding the residue solution of ammonium sulfate and ammonium carbonate to one or both of the first and second reactors;
transporting the calcium carbonate cake on the filter to zone B in which the calcium carbonate cake is washed with water to result in a product calcium carbonate cake and a wash water solution of ammonium sulfate and ammonium carbonate;
retaining the product calcium carbonate cake; and
feeding the wash water solution of ammonium sulfate and ammonium carbonate to an ammonium carbonate absorber to retain ammonium carbonate.

19. A partially continuous countercurrent flow process for converting gypsum to ammonium sulfate and calcium carbonate comprising the following steps:
separating an aqueous slurry of gypsum to result in a gypsum liquid residue and a residual gypsum cake;
feeding a flow of reactants being the residual gypsum cake and a second solution of ammonium sulfate and ammonium carbonate, selectively into one or both of a first reactor and a second reactor, for chemical reaction;

stopping the flow of reactants into one or both of the first reactor and second reactor for a first reactor retention time and a second reactor retention time both selected to achieve a predetermined degree of chemical reaction in one or both first reactor and second reactor to form an ammonium sulfate solution containing a first precipitate calcium carbonate and a gypsum remnant in one or both first reactor and second reactor;

discharging the ammonium sulfate solution containing a first precipitate calcium carbonate and a gypsum remnant from one or both first reactor and second reactor;

resuming the flow of reactants into one or both first reactor and second reactor;

separating the first precipitate calcium carbonate and gypsum remnant from the ammonium sulfate solution to result in a product ammonium sulfate solution and a first precipitate calcium carbonate and gypsum remnant cake;

retaining the product ammonium sulfate solution;

feeding a flow of reactants being the second precipitate calcium carbonate and gypsum remnant cake and an ammonium carbonate solution, selectively into one or both of a third reactor and a fourth reactor for chemical reaction;

stopping the flow of reactants into one or both of the third reactor and fourth reactor for a third reactor retention time and a fourth reactor retention time both selected to achieve a predetermined degree of chemical reaction in one or both third reactor and fourth reactor to form a third precipitate calcium carbonate and a first solution of ammonium sulfate and ammonium carbonate in one or both third reactor and fourth reactor;

discharging the third precipitate calcium carbonate and a first solution of ammonium sulfate and ammonium carbonate from one or both third reactor and fourth reactor;

resuming the flow of reactants into one or both third reactor and fourth reactor; separating the first, second, and third precipitate calcium carbonate from the first solution of ammonium sulfate and ammonium carbonate to result in a product calcium carbonate cake and a first residue solution of ammonium sulfate and ammonium carbonate;

retaining the product calcium carbonate cake;

feeding a flow of reactants being the first residue solution of ammonium sulfate and ammonium carbonate and first precipitate calcium carbonate and gypsum remnant cake, selectively into one or both of a fifth reactor and a sixth reactor, for chemical reaction;

stopping the flow of reactants into one or both of the fifth reactor and sixth reactor for a fifth reactor retention time and a sixth reactor retention time both selected to achieve a predetermined degree of chemical reaction in one or both fifth reactor and sixth reactor to form a second solution of ammonium sulfate and ammonium carbonate and second precipitate calcium carbonate and gypsum remnant in one of both fifth reactor and sixth reactor;

discharging the first and second solution of ammonium sulfate and ammonium carbonate and second precipitate calcium carbonate and gypsum remnant from one or both fifth reactor and sixth reactor;

resuming the flow of reactants into one or both fifth reactor and sixth reactor;

separating the second precipitate calcium carbonate and gypsum remnant from the second solution of ammonium sulfate and ammonium carbonate to result in the second residue solution of ammonium sulfate and ammonium carbonate and the second precipitate calcium carbonate and gypsum remnant cake;

feeding the second residue solution of ammonium sulfate and ammonium carbonate to the first reactor and second reactor; and feeding the second precipitate calcium carbonate and gypsum remnant cake to the third reactor and fourth reactor.

20. The process of claim 19, wherein the step of separating the aqueous slurry of gypsum to result in first and second gypsum liquid residues and a gypsum cake is accomplished by steps comprising:

filtering an aqueous slurry of gypsum on a filter having two zones, zone A and zone B, wherein zone A the gypsum slurry is filtered resulting in a first gypsum liquid residue and a residual gypsum cake; and transporting the residual gypsum cake on the filter to zone B in which the residual gypsum cake is washed with water to result in a second gypsum liquid residue.

21. The process of claim 19, wherein the step of separating the first, second, third, fourth, fifth and sixth precipitate calcium carbonate from the first solution of ammonium sulfate and ammonium carbonate is accomplished by steps comprising:

filtering the first, second, third, fourth, fifth and sixth precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;

adding the residue solution of ammonium sulfate and ammonium carbonate to any one or all of the first, second, third, fourth, fifth and sixth reactors;

transporting the calcium carbonate cake on the filter to zone B in which the calcium carbonate cake is washed with water to result in a product calcium carbonate cake and a wash water solution of ammonium sulfate and ammonium carbonate;

retaining the product calcium carbonate cake; and feeding the wash water solution of ammonium sulfate and ammonium carbonate to an ammonium carbonate absorber to retain ammonium carbonate.

22. A partially continuous countercurrent flow process for converting gypsum to ammonium sulfate and calcium carbonate comprising the following steps:

separating an aqueous slurry of gypsum to result in a gypsum liquid residue and a residual gypsum cake;

feeding a flow of reactants being the residual gypsum cake and a second solution of ammonium sulfate and ammonium carbonate, into a first reactor, for chemical reaction;

stopping the flow of reactants into the first reactor for a first reactor retention time selected to achieve a predetermined degree of chemical reaction in the first reactor to form an ammonium sulfate solution containing a first precipitate calcium carbonate and a gypsum remnant in the first reactor;

discharging the ammonium sulfate solution containing a first precipitate calcium carbonate and a gypsum remnant from the first reactor;

resuming the flow of reactants into the first reactor;
separating the first precipitate calcium carbonate and gypsum remnant from the ammonium sulfate solution to result in a product ammonium sulfate solution and a first precipitate calcium carbonate and gypsum remnant cake;
retaining the product ammonium sulfate solution;
feeding a flow of reactants being the second precipitate calcium carbonate and gypsum remnant cake and an ammonium carbonate solution, selectively into a third reactor for chemical reaction;
stopping the flow of reactants into the third reactor for a third reactor retention time selected to achieve a predetermined degree of chemical reaction in the third reactor to form a third precipitate calcium carbonate and a first solution of ammonium sulfate and ammonium carbonate in the third reactor;
discharging the third precipitate calcium carbonate and a first solution of ammonium sulfate and ammonium carbonate from the third reactor;
resuming the flow of reactants into the third reactor;
separating the first, second, and third precipitate calcium carbonate from the first solution of ammonium sulfate and ammonium carbonate to result in a product calcium carbonate cake and a first residue solution of ammonium sulfate and ammonium carbonate;
retaining the product calcium carbonate cake;
feeding a flow of reactants being the first residue solution of ammonium sulfate and ammonium carbonate and first precipitate calcium carbonate and gypsum remnant cake, into a second reactor, for chemical reaction;
stopping the flow of reactants into the second reactor for a second reactor retention time selected to achieve a predetermined degree of chemical reaction in the second reactor to form a second solution of ammonium sulfate and ammonium carbonate and second precipitate calcium carbonate and gypsum remnant in the second reactor;
discharging the first and second solution of ammonium sulfate and ammonium carbonate and second precipitate calcium carbonate and gypsum remnant from the second reactor;
resuming the flow of reactants into the second reactor;
separating the second precipitate calcium carbonate and gypsum remnant from the second solution of ammonium sulfate and ammonium carbonate to result in the second residue solution of ammonium sulfate and ammonium carbonate and the second precipitate calcium carbonate and gypsum remnant cake;
feeding the second residue solution of ammonium sulfate and ammonium carbonate to the first reactor; and
feeding the second precipitate calcium carbonate and gypsum remnant cake to the third reactor.

24. The process of claim 22, wherein the step of separating the second precipitate calcium carbonate and gypsum remnant from the second solution of ammonium sulfate and ammonium carbonate is accomplished by steps comprising:
filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;
adding the residue solution of ammonium sulfate and ammonium carbonate to any one or all of the first, second, and third reactors;
transporting the calcium carbonate cake on the filter to zone B in which the calcium carbonate cake is washed with water to result in a product calcium carbonate cake and a wash water solution of ammonium sulfate and ammonium carbonate;
retaining the product calcium carbonate cake; and
feeding the wash water solution of ammonium sulfate and ammonium carbonate to an ammonium carbonate absorber to retain ammonium carbonate.

25. A partially continuous countercurrent flow process for converting gypsum to ammonium sulfate and calcium carbonate comprising the following steps:
separating an aqueous slurry of gypsum to result in a gypsum liquid residue and a gypsum cake;
feeding a flow of reactants being ammonia, carbon dioxide, the gypsum cake, and a solution of ammonium sulfate and ammonium carbonate into a first reactor for chemical reaction;
stopping the flow of reactants into the first reactor for a retention time selected to achieve a predetermined degree of chemical reaction to form an ammonium sulfate solution containing a first precipitate calcium carbonate and a gypsum remnant;
discharging the ammonium sulfate solution containing a first precipitate calcium carbonate and a gypsum remnant;
resuming the flow of reactants into the first reactor;
separating the first precipitate calcium carbonate and gypsum remnant from the ammonium sulfate solution to result in a product ammonium sulfate solution and a remnant cake of first precipitate calcium carbonate and gypsum;
retaining the product ammonium sulfate solution;
feeding a flow of reactants being ammonia, carbon dioxide, the remnant cake of first precipitate calcium carbonate and gypsum and ammonium carbonate solution into a second reactor for chemical reaction;
stopping the flow of reactants into the second reactor for a retention time selected to achieve a predetermined degree of chemical reaction to form a second precipitate calcium carbonate and a solution of ammonium sulfate and ammonium carbonate;
discharging the first and second precipitate calcium carbonate and a solution of ammonium sulfate and ammonium carbonate;
resuming the flow of reactants into the second reactor;
venting excess carbon dioxide and ammonia from the first reactor and the second reactor;
separating the first and second precipitate calcium carbonate from the solution of ammonium sulfate and ammonium carbonate to result in a product calcium carbonate cake and a residue solution of ammonium sulfate and ammonium carbonate;

23. The process of claim 22, wherein the step of separating the aqueous slurry of gypsum to result in first and second gypsum liquid residues and a gypsum cake is accomplished by steps comprising:
filtering an aqueous slurry of gypsum on a filter having two zones, zone A and zone B, wherein zone A the gypsum slurry is filtered resulting in a first gypsum liquid residue and a residual gypsum cake; and
transporting the residual gypsum cake on the filter to zone B in which the residual gypsum cake is washed with water to result in a second gypsum liquid residue.

retaining the product calcium carbonate cake; and adding the residue solution of ammonium sulfate and ammonium carbonate to the first reactor.

26. The process of claim 25, wherein the step of separating the aqueous slurry of gypsum to result in first and second gypsum liquid residues and a gypsum cake is accomplished by steps comprising:

filtering an aqueous slurry of gypsum on a filter having two zones, zone A and zone B, wherein zone A the gypsum slurry is filtered resulting in a first gypsum liquid residue and a residual gypsum cake; and transporting the residual gypsum cake on the filter to zone B in which the residual gypsum cake is washed with water to result in a second gypsum liquid residue.

27. The process of claim 25, wherein the step of separating the first and second precipitate calcium carbonate from the solution of ammonium sulfate and ammonium carbonate is accomplished by steps comprising:

filtering the first and second precipitate calcium carbonate from the solution of ammonium sulfate and ammonium carbonate on a filter having two zones, zone A and zone B, wherein zone A the solution of ammonium sulfate and ammonium carbonate is filtered resulting in a calcium carbonate cake and a residue solution of ammonium sulfate and ammonium carbonate;

adding the residue solution of ammonium sulfate and ammonium carbonate to one or both of the first and second reactors;

transporting the calcium carbonate cake on the filter to zone B in which the calcium carbonate cake is washed with water to result in a product calcium carbonate cake and a wash water solution of ammonium sulfate and ammonium carbonate;

retaining the product calcium carbonate cake; and feeding the wash water solution of ammonium sulfate and ammonium carbonate to an ammonium carbonate absorber to retain ammonium carbonate.

28. A partially continuous countercurrent flow process for converting gypsum to ammonium sulfate and calcium carbonate comprising the following steps:

separating an aqueous slurry of gypsum to result in a gypsum liquid residue and a gypsum cake;

feeding a flow of reactants being the gypsum cake and a solution of ammonium sulfate and ammonium carbonate, selectively into one or all reactors of a plurality of reactors, for chemical reaction;

stopping the flow of reactants into one or all reactors of the plurality of reactors for a reactor retention time selected for any one or all reactors of the plurality of reactors, wherein the retention time for a particular one reactor is selected to achieve a predetermined degree of chemical reaction in the particular one reactor to form an ammonium sulfate solution containing a first precipitate calcium carbonate and a gypsum remnant in one or all reactors of the plurality of reactors;

discharging the ammonium sulfate solution containing a first precipitate calcium carbonate and a gypsum remnant from one or all reactors of the plurality of reactors;

resuming the flow of reactants into one or all reactors of the plurality of reactors;

separating the first precipitate calcium carbonate and gypsum remnant from the ammonium sulfate solution to result in a product ammonium sulfate solution and a remnant cake of precipitated calcium carbonate and gypsum;

retaining the product ammonium sulfate solution;

feeding a flow of reactants being the remnant cake of first precipitate calcium carbonate and gypsum and ammonium carbonate solution, selectively into one or all reactors of the plurality of reactors, for chemical reaction;

stopping the flow of reactants into one or all reactors of the plurality of reactors for a reactor retention time selected for any one or all reactors of the plurality of reactors, wherein the retention time for a particular one reactor is selected to achieve a predetermined degree of chemical reaction in the particular one reactor to form a second precipitate calcium carbonate and a solution of ammonium sulfate and ammonium carbonate;

discharging the first and second precipitate calcium carbonate and a solution of ammonium sulfate and ammonium carbonate from one or all reactors of the plurality of reactors;

resuming the flow of reactants into one or all reactors of the plurality of reactors;

separating the first and second precipitate calcium carbonate from the solution of ammonium sulfate and ammonium carbonate to result in a product calcium carbonate cake and a residue solution of ammonium sulfate and ammonium carbonate;

retaining the product calcium carbonate cake; and adding the residue solution of ammonium sulfate and ammonium carbonate to one or all reactors of the plurality of reactors.

* * * * *